(12) United States Patent
Hagiwara et al.

(10) Patent No.: US 9,337,166 B2
(45) Date of Patent: May 10, 2016

(54) WIRE BONDING APPARATUS AND BONDING METHOD

(71) Applicant: Shinkawa Ltd., Tokyo (JP)

(72) Inventors: Yoshihito Hagiwara, Tokyo (JP); Naoki Sekine, Tokyo (JP); Koichi Takahashi, Tokyo (JP); Yasuo Nagashima, Tokyo (JP); Motoki Nakazawa, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 14/081,104

(22) Filed: Nov. 15, 2013

(65) Prior Publication Data

US 2014/0138426 A1   May 22, 2014

Related U.S. Application Data

(63) Continuation of application No. PCT/JP2012/062275, filed on May 14, 2012.

(30) Foreign Application Priority Data

May 17, 2011   (JP) .................................. 2011-110093
Apr. 20, 2012  (JP) .................................. 2012-096242

(51) Int. Cl.
*H01L 23/00* (2006.01)
*H01L 25/065* (2006.01)

(52) U.S. Cl.
CPC ................ *H01L 24/85* (2013.01); *H01L 24/78* (2013.01); *H01L 24/45* (2013.01); *H01L 24/48* (2013.01);
(Continued)

(58) Field of Classification Search
CPC ...... H01L 24/85; H01L 24/78; B23K 20/004; B23K 20/005; B23K 20/007

USPC ....................................................... 228/180.5
See application file for complete search history.

(56) References Cited

U.S. PATENT DOCUMENTS

| | | | | |
|---|---|---|---|---|
| 3,289,452 A | * | 12/1966 | Hartwig Kollner | ............. 72/324 |
| 4,239,144 A | | 12/1980 | Elles et al. | |
| 4,422,568 A | | 12/1983 | Elles et al. | |
| 4,437,604 A | * | 3/1984 | Razon et al. | ................ 228/180.5 |

(Continued)

FOREIGN PATENT DOCUMENTS

| | | | | |
|---|---|---|---|---|
| JP | 54152962 A | * | 12/1979 | ............ H01L 21/607 |
| JP | 55-74151 | | 6/1980 | |

(Continued)

OTHER PUBLICATIONS

International Search Report dated Aug. 7, 2012, from corresponding International Application No. PCT/JP2012/062275.

*Primary Examiner* — Devang R Patel
*Assistant Examiner* — Carlos Gamino
(74) *Attorney, Agent, or Firm* — Katten Muchin Rosenman LLP

(57) ABSTRACT

Provided is a wire bonding apparatus capable of performing high-speed wedge wire bonding, the apparatus including: a bonding tool having a through hole and a pressing surface for pressing a wire; a clamper for holding the wire; and a control unit. The control unit includes: wire tail extension unit that moves the bonding tool, after wedge bonding of the wire to a first lead, upward and along a second straight line connecting a second pad and a second lead, and causes the wire to extend from the through hole in a direction along the second straight line from the second pad to the second lead; and tail cut unit that, after causing the wire tail to extend, cuts the wire tail by moving the bonding tool in the direction along the second straight line connecting the second pad and the second lead while the clamper is closed.

10 Claims, 39 Drawing Sheets

(52) U.S. Cl.
CPC ............. *H01L 24/49* (2013.01); *H01L 25/0655* (2013.01); *H01L 25/0657* (2013.01); *H01L 2224/04042* (2013.01); *H01L 2224/05554* (2013.01); *H01L 2224/32145* (2013.01); *H01L 2224/32225* (2013.01); *H01L 2224/32245* (2013.01); *H01L 2224/45015* (2013.01); *H01L 2224/45124* (2013.01); *H01L 2224/45144* (2013.01); *H01L 2224/48091* (2013.01); *H01L 2224/48145* (2013.01); *H01L 2224/48227* (2013.01); *H01L 2224/48247* (2013.01); *H01L 2224/48472* (2013.01); *H01L 2224/49171* (2013.01); *H01L 2224/49173* (2013.01); *H01L 2224/49175* (2013.01); *H01L 2224/73265* (2013.01); *H01L 2224/78301* (2013.01); *H01L 2224/78802* (2013.01); *H01L 2224/85047* (2013.01); *H01L 2224/85181* (2013.01); *H01L 2224/85186* (2013.01); *H01L 2224/85205* (2013.01); *H01L 2225/0651* (2013.01); *H01L 2225/06506* (2013.01); *H01L 2225/06568* (2013.01); *H01L 2924/01082* (2013.01); *H01L 2924/12041* (2013.01)

(56) References Cited

U.S. PATENT DOCUMENTS

| | | | | |
|---|---|---|---|---|
| 5,899,375 | A * | 5/1999 | Yoshida et al. | 228/4.5 |
| 6,173,885 | B1 * | 1/2001 | Takahashi et al. | 228/180.5 |
| 6,564,989 | B2 * | 5/2003 | Arakawa | 228/180.5 |
| 7,658,314 | B2 * | 2/2010 | Tei et al. | 228/180.5 |
| 7,918,378 | B1 * | 4/2011 | Pham | 228/4.5 |
| 2005/0167473 | A1 * | 8/2005 | Mayer et al. | 228/180.5 |
| 2006/0186179 | A1 * | 8/2006 | Levine | B23K 20/007 228/180.5 |
| 2007/0023487 | A1 * | 2/2007 | Ko | B23K 20/007 228/180.5 |
| 2010/0059883 | A1 * | 3/2010 | Yow | B23K 20/007 257/738 |
| 2012/0032354 | A1 * | 2/2012 | Pham et al. | 257/784 |

FOREIGN PATENT DOCUMENTS

| | | | | |
|---|---|---|---|---|
| JP | 58-9332 | | 1/1983 | |
| JP | 58-89833 | | 5/1983 | |
| JP | 59-94431 | | 5/1984 | |
| JP | 04206841 | A * | 7/1992 | .............. H01L 21/60 |
| JP | 07147296 | A * | 6/1995 | .............. H01L 21/60 |

\* cited by examiner

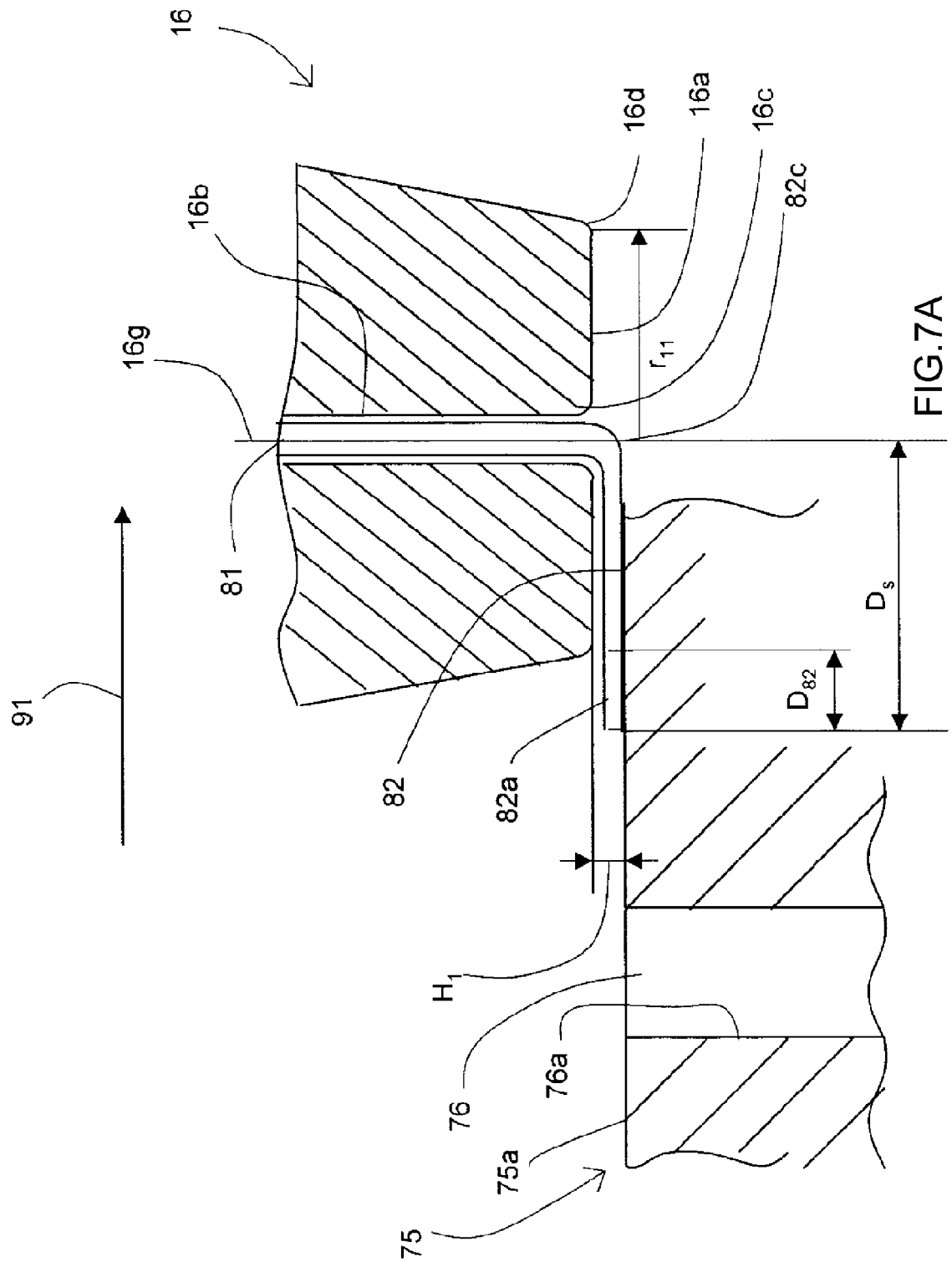

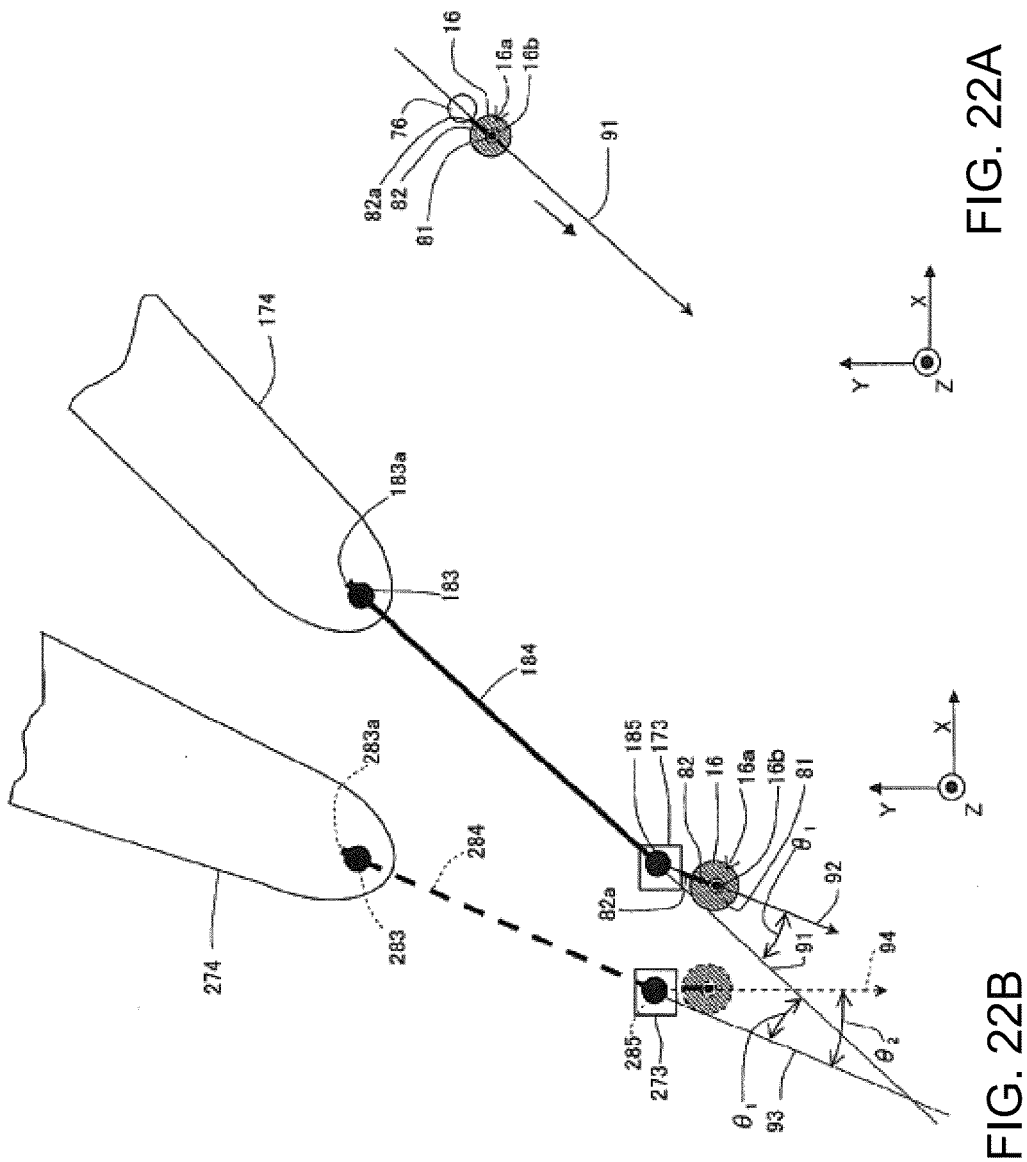

WIRE BONDING APPARATUS AND BONDING METHOD

TECHNICAL FIELD

The present invention relates to a structure of wire bonding apparatuses and a bonding method using such a bonding apparatus.

BACKGROUND ART

Wire bonding apparatuses are commonly used for connecting a chip and a substrate. Such wire bonding apparatuses include two types: ball wire bonding apparatuses and wedge wire bonding apparatuses. A ball wire bonding apparatus connects a plurality of pads of a chip respectively with a plurality of leads of a substrate by repeating: forming an initial ball from a wire extending from a tip of a capillary by causing a spark and such; bonding the initial ball as a bonding ball to a pad of the chip by pressing the initial ball onto the pad and applying ultrasonic vibration to the initial ball; looping the wire toward a lead of the substrate while paying out the wire from the capillary; bonding the wire by pressing the wire to the lead of the substrate; cutting the wire after moving the capillary upward and extending a wire tail from the tip of the capillary; and forming an initial ball from the wire tail by causing a spark and such for bonding to the next pad.

Further, a wedge wire bonding apparatus uses a tool having a wire feed guide and a pressing surface, and includes the steps of: bonding a wire to a pad of a chip, without forming an initial ball, by pressing a side of the wire to the pad of the chip by the pressing surface while the wire feed guide maintains a direction of the wire and by applying ultrasonic vibration to the wire; looping the wire to a lead of a substrate after raising the tool; bonding the wire to a surface of the lead by pressing the side of the wire by the pressing surface of the tool; cutting the wire by moving the tool obliquely upward toward a connecting direction of the wire; and extending a wire tail under the pressing surface of the tool. Then, a plurality of pads of the chip and a plurality of leads of the substrate are connected respectively by repeating the steps of: moving the tool above the next pad; and pressing and bonding a side of the wire tail extending under the pressing surface to the pad of the chip (see Patent Literature 1, for example).

According to the wedge bonding apparatus described in Patent Literature 1, as the side of the wire is pressed against the pad of the chip by the pressing surface while maintaining the direction of the wire by the wire feed guide, the wire is always required to extend toward the connecting direction of the wire. As the connecting direction between the pad of the chip and the lead of the substrate changes in various directions, however, various methods such as providing a rotary-type bonding head (see Patent Literature 2, for example), or rotating the bonding stage holding the chip and the substrate are employed so as to align the direction of the wire feed guide of the bonding tool with the connecting direction of the wire.

However, rotating the bonding head or the bonding stage poses a problem of increasing a size of a bonding apparatus as a whole, as well as a problem of a slower bonding speed, which results in an inability of high-speed bonding. Therefore, there is proposed a method of bonding a wire to a semiconductor pad and to a lead of a substrate while using a capillary but without forming an initial ball (see Patent Literature 3, for example). The wedge wire bonding method described in Patent Literature 3 proposes a method in which a capillary is moved upward after bonding to a second bonding point and extending a wire tail, then horizontally toward a direction along a succeeding connecting direction of the wire, then downward to a position at which a tip of the capillary is slightly in contact with the wire bonded to the second bonding point, and again horizontally toward the direction along the succeeding connecting direction of the wire to cut the wire tail (see paragraphs 0040 to 0049 of Patent Literature 3). According to this method, the wire tail may be flexed at the tip of the capillary toward the succeeding connecting direction of the wire, and therefore it is possible to perform wedge wire bonding of the wire by pressing the flexed portion of the wire by the tip of the capillary in the succeeding bonding, without rotating the bonding head nor forming an initial ball. In addition, Patent Literature 3 also describes that in the first bonding, wedge wire bonding is performed after forming an initial ball and performing ball wire bonding of the ball at an appropriate position on the substrate, and then causing the wire be flexed in the direction along the succeeding connecting direction of the wire when cutting the wire tail (see paragraph 0050 of Patent Literature 3).

RELATED ART DOCUMENTS

Patent Literatures

Patent literature 1: Japanese Unexamined Patent Application Publication No. S58-9332
Patent literature 2: Japanese Unexamined Patent Application Publication No. S55-7415
Patent literature 3: US Patent Application Publication No. 2005-0167473

SUMMARY OF THE INVENTION

Problems to be Solved by the Invention

In the meantime, the conventional wedge wire bonding method described in Patent Literature 3 performs wedge wire bonding using a capillary for performing ball wire bonding, and the tip of the capillary is provided with a tapered chamfered portion for bonding an initial ball to a first bonding point such as a pad as illustrated in FIGS. 4A to 4E and FIGS. 7A to 7D of Patent Literature 3. For this reason, in order to fold the wire tail extending from the tip of the capillary in a direction along a surface of the capillary tip so as to allow wedge wire bonding, it is necessary to move the capillary temporarily downward to press the wire tail against the tip of the capillary. Thus, according to the wedge wire bonding method described in Patent Literature 3, it is adversely not possible to increase the bonding speed.

In addition, as illustrated in FIG. 3 of Patent Literature 3, the conventional wedge wire bonding method described in Patent Literature 3 may support a case in which a changing angle between adjacent connecting directions of the wire is small; however, in a case in which the direction changes to a large extent such as a case where the connecting direction of the wire turns around, it is adversely not possible to fold the wire tail toward the succeeding connecting direction of the wire as the capillary or the wire tail may become hung up on a connecting wire connecting a pad and a lead that have been bonded.

An object of the present invention is to provide a wire bonding apparatus capable of performing high-speed wedge wire bonding.

Means for Solving the Problems

A wire bonding apparatus according to the present invention is a wire bonding apparatus for connecting a plurality of first bonding points and a plurality of second bonding points with a wire, the apparatus is provided with: a bar-shaped bonding tool having a through hole in which the wire is inserted, and a pressing surface provided at a periphery of the through hole at a tip of the bonding tool and configured to press the wire against a bonding target, the through hole extending along a longitudinal direction of the bonding tool; a clamper configured to hold the wire; and a control unit configured to specify movement of the bonding tool, and to open and close the clamper, wherein the control unit includes: wire tail extension unit configured to move the bonding tool, after bonding the wire to a previous one of the second bonding points, upward while the clamper is opened, and then along a straight line directed from a succeeding one of the first bonding points to a succeeding one of the second bonding points by a predetermined distance, and cause the wire to extend from the through hole of the bonding tool in a direction along the straight line directed from the succeeding first bonding point to the succeeding second bonding point; and tail cut unit configured to, after causing the wire tail to extend, cut the wire tail by moving the bonding tool in the direction along the straight line directed from the succeeding first bonding point to the succeeding second bonding point while the clamper is closed.

In the wire bonding apparatus according to the present invention, it is preferable that a folding station having a stepped portion for catching the wire tail extending from the tip of the bonding tool is further provided, and the control unit can include: wire tail folding unit configured to, after moving the bonding tool to the folding station and positioning the wire tail along the stepped portion, move the bonding tool toward the succeeding second bonding point along the straight line directed from the succeeding first bonding point to the succeeding second bonding point, thereby causing the wire tail to be flexed toward the succeeding first bonding point.

In the wire bonding apparatus according to the present invention, it is preferable that the control unit forms the wire tail using: the wire tail extension unit and the tail cut unit, when an angle between a first straight line and a second straight line is smaller than a predetermined angle, the first straight line connecting a previous one of the first bonding points and the previous second bonding point, the second straight line connecting the succeeding first bonding point and the succeeding second bonding point; and the wire tail folding unit, when the angle between the first straight line and the second straight line is equal to or greater than the predetermined angle.

In the wire bonding apparatus according to the present invention, it is preferable that an end portion of the through hole on a side of the pressing surface is a straight hole, and an angle between an inner surface of the straight hole and the pressing surface is substantially at a right angle. It is also preferable that the pressing surface is an annular flat surface, and the wire tail extension unit moves the bonding tool such that the length of the wire tail is slightly greater than an outside radius of the pressing surface. It is also preferable that the wire tail extension unit moves the bonding tool horizontally by a predetermined XY-direction distance along the straight line directed from the succeeding first bonding point to the succeeding second bonding point, after moving the bonding tool upward by a predetermined Z-direction distance. It is also preferable that the wire tail extension unit moves the bonding tool obliquely upward by a predetermined oblique distance along the straight line directed from the succeeding first bonding point to the succeeding second bonding point. It is also preferable that the plurality of first bonding points are leads on a substrate, and the plurality of second bonding points are pads on a chip.

In the wire bonding apparatus according to the present invention, it is preferable that the stepped portion of the folding station includes a wall surface for catching the wire tail, and a flat upper surface that continues to the wall surface, and the wire tail folding unit moves the bonding tool at a height at which the pressing surface of the bonding tool is higher than the flat upper surface of the stepped portion of the folding station by a height slightly higher than a diameter of the wire.

A wire bonding method according to the present invention is a wire bonding method for connecting a plurality of first bonding points and a plurality of second bonding points with a wire, the method comprising: a step of preparing a wire bonding apparatus including: a bar-shaped bonding tool having a through hole in which the wire is inserted, and a pressing surface provided at a periphery of the through hole at a tip of the bonding tool and configured to press the wire against a bonding target, the through hole extending along a longitudinal direction of the bonding tool; and a clamper configured to hold the wire; a wire tail extension step of, after bonding the wire to a previous one of the second bonding points, moving the bonding tool upward while the clamper is opened, moving the bonding tool along a straight line directed from a succeeding one of the first bonding points to a succeeding one of the second bonding points by a predetermined distance, and causing the wire to extend from the through hole of the bonding tool in the direction along the straight line directed from the succeeding first bonding point to the succeeding second bonding point; and a tail cut step of, after causing the wire tail to extend, cutting the wire tail by moving the bonding tool in the direction along the straight line directed from the succeeding first bonding point to the succeeding second bonding point while the clamper is closed.

Preferably, the wire bonding method according to the present invention can further include a folding station having a stepped portion for catching the wire tail extending from the tip of the bonding tool, and the method can be further provided with: a wire tail folding step of, after moving the bonding tool to the folding station and positioning the wire tail along the stepped portion, moving the bonding tool toward the succeeding second bonding point along the straight line directed from the succeeding first bonding point to the succeeding second bonding point, thereby causing the wire tail to be flexed toward the succeeding first bonding point.

In the wire bonding method according to the present invention, it is preferable that the wire tail is formed in the wire tail extension step and the tail cut step, when an angle between a first straight line and a second straight line is smaller than a predetermined angle, the first straight line connecting a previous one of the first bonding points and the previous second bonding point, the second straight line connecting the succeeding first bonding point and the succeeding second bonding point; and the wire tail is formed in the wire tail folding step, when the angle between the first straight line and the second straight line is equal to or greater than the predetermined angle.

In the wire bonding method according to the present invention, it is preferable that the pressing surface is an annular flat surface, and in the wire tail extension step, the bonding tool is moved such that the length of wire tail is slightly greater than an external radius of the pressing surface. It is also preferable that in the wire tail extension step, the bonding tool is moved horizontally by a predetermined XY-direction distance along the straight line directed from the succeeding first bonding point to the succeeding second bonding point, after moving the bonding tool upward by a predetermined Z-direction distance. It is also preferable that in the wire tail extension step, the bonding tool is moved obliquely upward by a predetermined oblique distance along the straight line directed from the succeeding first bonding point to the succeeding second bonding point. It is also preferable that the plurality of first bonding points are leads on a substrate, and the plurality of second bonding points are pads on a chip.

In the wire bonding method according to the present invention, it is preferable that when a plurality of chips are disposed on a common substrate, and a plurality of pads of each chip and leads on the substrate corresponding to the pads are connected with a wire, the control unit starts bonding, after a last one of the pads on a previous one of the chips and a lead on the substrate corresponding to this pad are connected with a wire, from a set of pads and leads of a subsequent one of the chips on which a pad and a lead corresponding to this pad are disposed along a direction directed from the last pad on the previous chip to the lead corresponding to this last pad.

In the wire bonding method according to the present invention, it is preferable that when a plurality of chips are disposed on a common substrate, and a plurality of pads of each chip and leads on the substrate corresponding to the pads are connected with a wire, the control unit sequentially performs bonding to each of sets of pads and leads respectively corresponding to the pads, the pads and the leads in each set being connected by lines in a similar direction.

In the wire bonding method according to the present invention, it is preferable that the wire tail extension unit moves the bonding tool horizontally by a predetermined XY-direction distance along the straight line directed from the succeeding first bonding point to the succeeding second bonding point, after moving the bonding tool upward by a predetermined Z-direction distance, and horizontally from the second bonding point to the first bonding by a predetermined XY-direction distance.

In the wire bonding method according to the present invention, it is preferable that when a plurality of chips are disposed on a common substrate, and a plurality of pads of each chip and leads on the substrate corresponding to the pads are connected with a wire, bonding is started after a last one of the pads on a previous one of the chips and a lead on the substrate corresponding to this pad are connected with a wire, from a set of pads and leads of a subsequent one of the chips on which a pad and a lead corresponding to this pad are disposed along a direction directed from the last pad on the previous chip to the lead corresponding to this last pad.

In the wire bonding method according to the present invention, it is preferable that when a plurality of chips are disposed on a common substrate, and a plurality of pads of each chip and leads on the substrate corresponding to the pads are connected with a wire, bonding is sequentially performed to each of sets of pads and leads respectively corresponding to the pads, the pads and the leads in each set being connected by lines in a similar direction.

In the wire bonding method according to the present invention, it is preferable that the wire tail extension step moves the bonding tool horizontally by a predetermined XY-direction distance along the straight line directed from the succeeding first bonding point to the succeeding second bonding point, after moving the bonding tool upward by a predetermined Z-direction distance, and horizontally from the second bonding point to the first bonding by a predetermined XY-direction distance.

Effects of the Invention

The present invention provides an advantageous effect of providing a wire bonding apparatus capable of performing high-speed wedge wire bonding.

BRIEF DESCRIPTION OF THE DRAWINGS

FIG. 7A is a diagram illustrating a wire folding operation by the wire bonding apparatus according to the one embodiment of the present invention.

FIG. 22A is a diagram illustrating the wire folding operation by the wire bonding apparatus according to the different embodiment of the present invention.

FIG. 22B is a diagram illustrating the wire tail extending operation, and the tail-cut operation by the wire bonding apparatus according to the different embodiment of the present invention.

MODES FOR CARRYING OUT THE INVENTION

Figure 1:
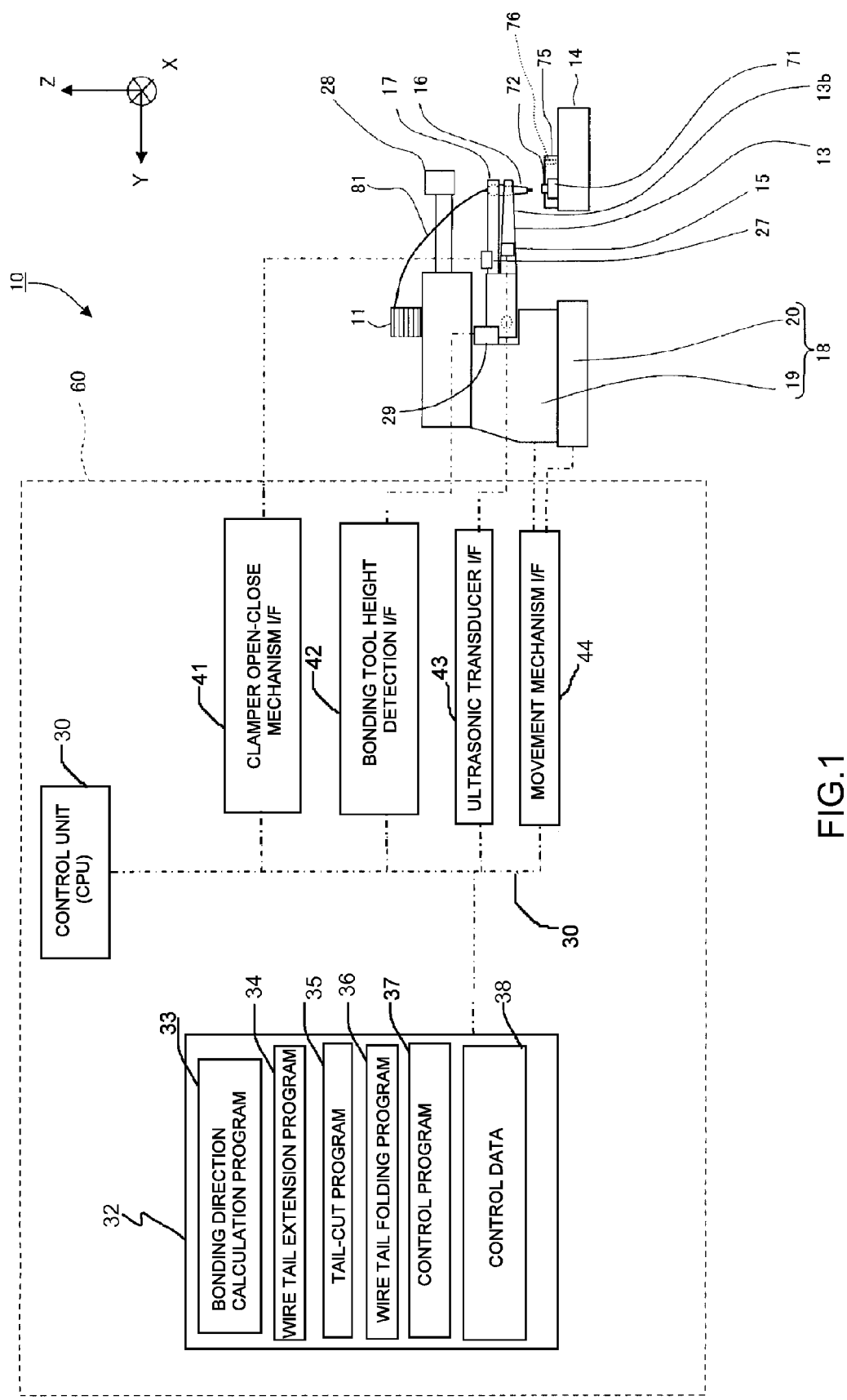
FIG. 1 is a system diagram illustrating a configuration of a wire bonding apparatus according to embodiments of the present invention.

Hereinafter, a wire bonding apparatus 10 according to embodiments of the present invention will be described with reference to the drawings. In FIG. 1, signal lines are shown by alternate long and short dash lines. As illustrated in FIG. 1, the wire bonding apparatus 10 is configured such that a bonding head 19 is placed on an XY table 20, and a bonding arm 13 is attached to the bonding head 19. The bonding arm 13 is configured to be driven by a Z motor about a rotational center, and such that an ultrasonic horn 13b is attached to a tip of the arm, and a tip of the ultrasonic horn 13b moves closer to and away from a pad surface of a chip 72 as a bonding surface in an arc. The tip of the ultrasonic horn 13b moves in a Z direction, which is an up-down direction, near the pad surface of the chip 72 or a surface of a substrate 71. To the tip of the ultrasonic horn 13b, a bonding tool 16 is attached. The XY table 20 and the bonding head 19 constitute a movement mechanism 18, and the movement mechanism 18 is able to freely move the bonding head 19 to any position in a plane (in an XY plane) along the bonding surface by the XY table 20, and to freely move the ultrasonic horn 13b attached to the tip of the bonding arm 13 and the bonding tool 16 attached to the tip of the ultrasonic horn 13b in an XYZ direction by driving the bonding arm 13 attached to the head by the Z motor. On a side of the tip of the bonding arm 13 from the XY table 20, a bonding stage 14 for fixing the substrate 71 by suctioning is disposed. Further, a lead clamper 75 for pressing and fixing the substrate 71 against and onto a surface of the bonding stage 14 is provided on the bonding stage 14.

Figure 2A:
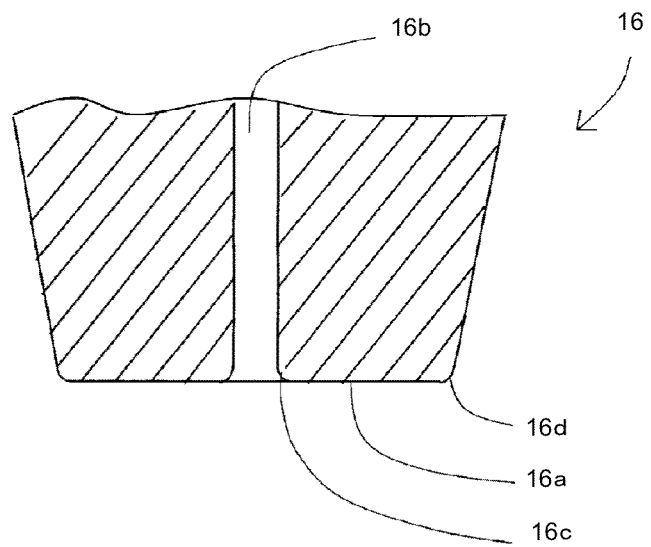
FIG. 2A is a cross-sectional diagram of a tip portion of a bonding tool of the wire bonding apparatus according to one embodiment of the present invention.
Figure 2B:
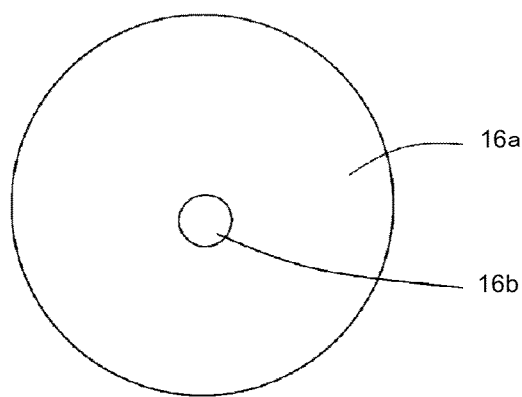
FIG. 2B is an end view of the tip portion of a bonding tool of the wire bonding apparatus of FIG. 2A.

As illustrated in FIG. 2(a), the bonding tool 16 is a conical body whose top is flat, and configured such that a wire 81 made of an aluminum wire or a gold wire can be inserted through a through hole 16b defined in the center along a length direction. A periphery of the through hole 16b at the tip of the bonding tool 16 constitutes a pressing surface 16a with which the wire 81 is pressed against a pad of the chip 72 or a lead of the substrate 71 as a bonding target. Referring to FIG. 2(b), the pressing surface 16a is an annular flat surface having the through hole 16b in the center. As illustrated in FIG. 2(a), the through hole 16b is a straight hole extending substantially verticality from the pressing surface 16a, and an angle between the pressing surface 16a and an inner surface of the through hole 16b is substantially at a right angle. Further, a corner portion 16c between the inner surface of the through hole 16b and the pressing surface 16a has a curved surface whose radius is significantly small as compared to a diameter of the through hole 16b or the wire 81, and a curved surface of a corner portion 16d between the pressing surface 16a and the bonding tool 16 is similar.

As illustrated in FIG. 1, the wire 81 is fed from a spool 11 provided above the bonding head 19. The ultrasonic horn 13b has a function of performing wedge bonding by supplying the bonding tool 16 with an ultrasonic energy produced by an ultrasonic transducer 15, and pressing the wire 81 inserted through the bonding tool 16 against the pad surface of the chip 72 or a surface of the lead of the substrate 71 as the bonding surface.

The bonding head 19 is provided with a clamper 17 for holding and releasing the wire 81 to be inserted through the bonding tool 16. The clamper 17 moves in XYZ direction the in conjunction with the bonding arm 13. The wire bonding apparatus 10 is provided with a clamper open-close mechanism 27, and the clamper 17 is configured to be driven to open and close based on an operation of the clamper open-close mechanism 27.

As illustrated in FIG. 1, the wire bonding apparatus 10 is configured such that a control unit 30 having a CPU built therein detects a position of and controls an operation of each component, thereby connects the chip 72 and the substrate 71 with the wire 81. The XY table 20 is provided with an XY position detection means for detecting a position of the bonding head 19 in the XY direction. Further, the bonding head 19 is also provided with a bonding tool height detector 29 for detecting a height of the bonding tool 16 tip in the Z direction by detecting a rotational angle about a rotational center of the bonding arm 13. The bonding tool height detector 29 can directly detect a position of the tip of the bonding arm 13 or the tip of the bonding tool 16, instead of detecting the rotational angle. In addition, the bonding tool height detector 29 can be of a contactless type or a contact type.

The bonding head 19 is provided with a camera 28, which is imaging means for obtaining an image of the chip 72, the substrate 71, or such, and is configured to perform positioning of the bonding tool 16 in the XY direction based on the image taken by the camera 28. The camera 28 can be configured by an imaging device, a lens, and the like, without a component such as a diaphragm mechanism or a shutter, as long as an image signal can be obtained.

A detection signal from the bonding tool height detector 29 is inputted to the control unit 30 through a data bus 31 via a bonding tool height detection interface 42. Further, the movement mechanism 18 constituted by the XY table 20 and the bonding head 19, the clamper open-close mechanism 27, and the ultrasonic transducer 15 are connected to the control unit 30 through the data bus 31 respectively via a movement mechanism interface 44, a clamper open-close mechanism interface 41, and an ultrasonic transducer interface 43, and are configured such that each component is operated by a command from the control unit 30 including the CPU.

To the data bus 31, a storage unit 32 is connected. The storage unit 32 stores control data required for the position-detection processing or an operation for outputting a control command by the control unit 30, and outputs the control data to the control unit 30 based on the command from the control unit 30, or records and stores inputted signal data and such. The control unit 30, the data bus 31, the storage unit 32, and the interfaces 41-44 integrally constitute a computer 60, and the storage unit 32 stores, in addition to control data 38, a control program 37 for controlling overall bonding control, a wire tail extension program 34 as wire tail extension unit, a tail-cut program 35 as tail cut unit, and a wire tail folding program 36 as wire tail folding unit. Further, the storage unit 32 also stores a bonding direction calculation program 33 for calculating a direction in which the bonding tool 16 moves in the XY plane when bonding.

Figure 3:
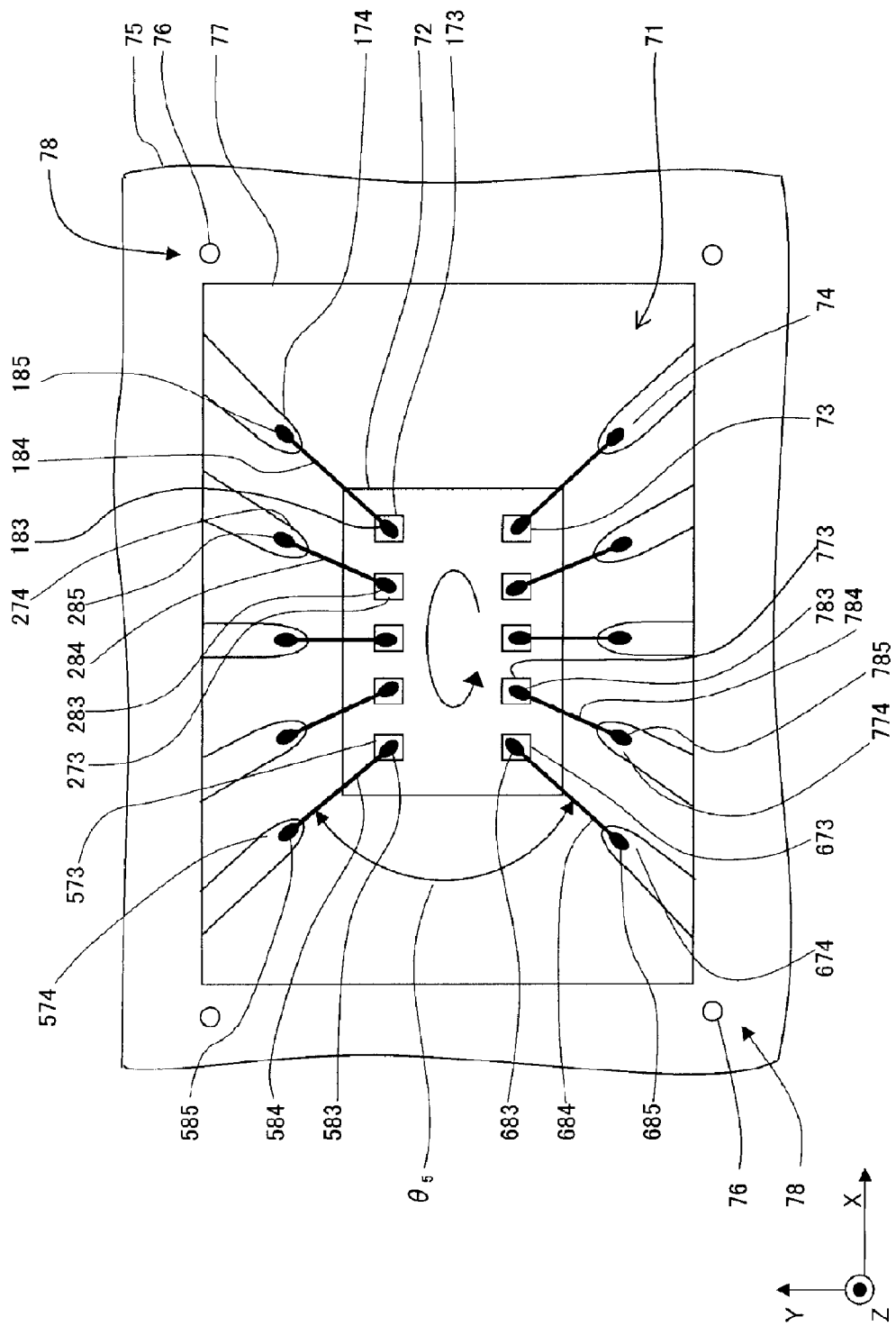
FIG. 3 is a diagram illustrating a lead clamper of the wire bonding apparatus according to the one embodiment of the present invention, as well as a chip, a substrate, and a connecting wire after wedge bonding.
Figure 5A:
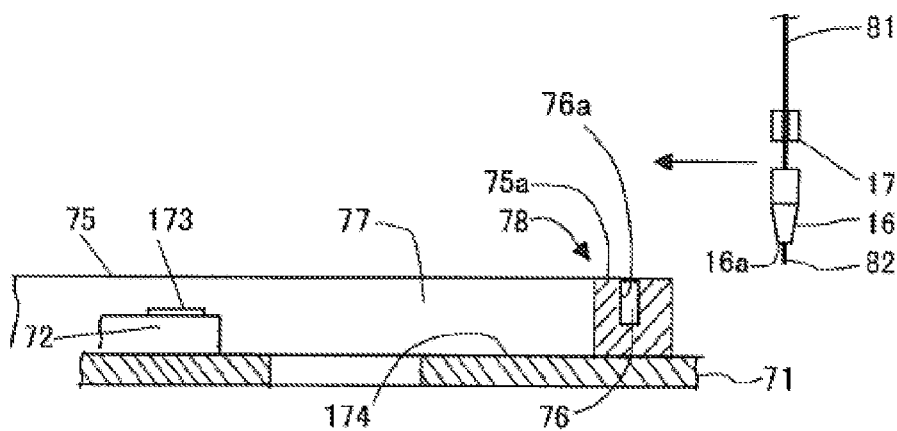
FIG. 5A is a diagram illustrating a wire folding operation by the wire bonding apparatus according to the one embodiment of the present invention.
Figure 5B:
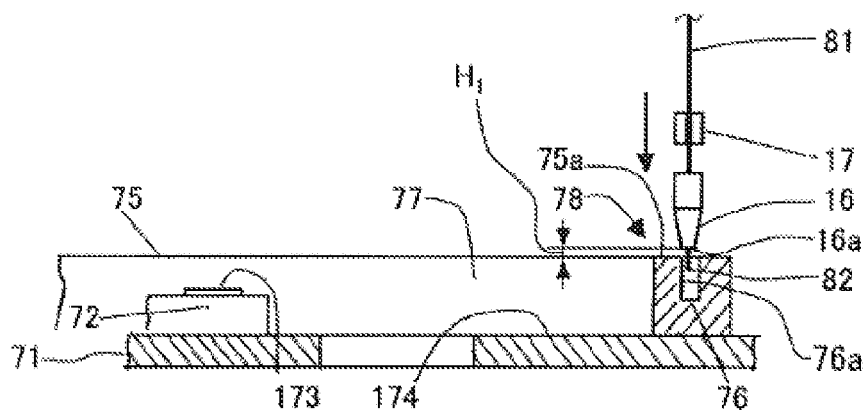
FIG. 5B is a diagram illustrating the wire folding operation by the wire bonding apparatus according to the one embodiment of the present invention.
Figure 5C:
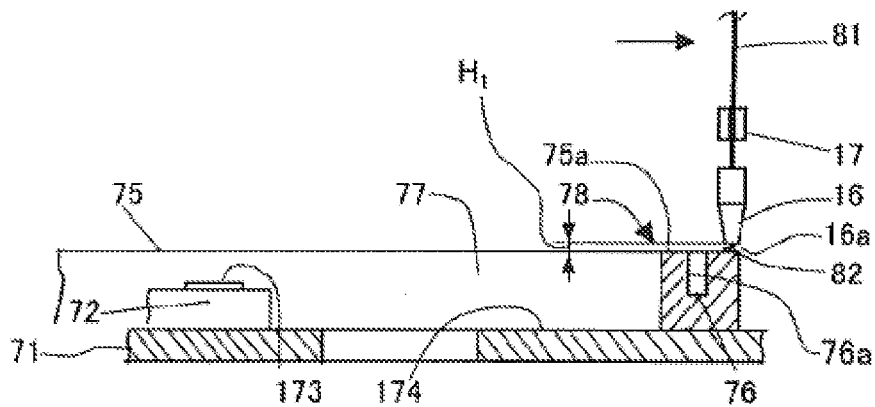
FIG. 5C is a diagram illustrating the wire folding operation of the wire bonding apparatus according to the one embodiment of the present invention.

As illustrated in FIG. 1 and FIG. 3, the lead clamper 75 for pressing and fixing the substrate 71 against and onto the surface of the bonding stage 14 is configured as a flat plate having a square opening 77 in the center. A periphery of the opening 77 in a bottom surface of the lead clamper 75 is pressed against the substrate 71 from above and fixes the substrate 71 to the bonding stage 14 illustrated in FIG. 1. As illustrated in FIG. 3, the substrate 71 in this embodiment is a lead frame. The bonding is performed by moving the tip of the bonding tool 16 from the opening 77 to a surface of a pad 73 of the chip 72 or a surface of a lead 74 of the substrate 71. Cylindrical holes 76 are provided in a surface of the lead clamper 75 near four corners of the opening 77, respectively. A diameter of the holes 76 is greater than that of the wire 81. As illustrated in FIGS. 5A-5C, an upper surface 75a of the lead clamper 75 is flat, an inner surface 76a of the hole 76 is cylindrical, and the upper surface 75a of the lead clamper 75 and the inner surface 76a of the hole 76 constitute a stepped portion, which corresponds to a folding station 78.

Now, a step of connecting the pad 73 of the chip 72 and the lead 74 of the substrate 71 with a wire by the wire bonding apparatus 10 thus configured will be described. As illustrated in FIG. 3, this embodiment describes a case in which pads 73 are arranged in a regular pitch along each of an upper and a lower side of the chip 72, and leads 74 respectively corresponding to the chips 72 are arranged in a regular pitch wider than the pitch of the pad 73 on an upper and a lower side of the chip 72, and each of connecting wires 84 respectively connecting the pads 73 and the corresponding leads 74 extends obliquely upward or downward from the center of the chip 72 to connect the pad 73 and the lead 74. In this embodiment, first, a first pad 173 and a first lead 174 at upper right positions of the chip 72 illustrated in FIG. 3 are connected with a first connecting wire 184 (first bonding), and then a second pad 273 on the left side of the first pad 173 is connected to a second lead 274 on the left side of the first lead 174 with a second connecting wire 284 (second bonding). Similarly, each of the pads 73 and corresponding one of the leads 74 are then sequentially connected in a counterclockwise direction as shown by an arrow in FIG. 3 (n-th bonding, where n is an integer). The bonding is completed upon going around all of the pads 73 and the leads 74 in a counterclockwise direction.

First, the control unit 30 reads the control program 37, the wire tail extension program 34, the tail-cut program 35, the wire tail folding program 36, the bonding direction calculation program 33, and the control data 38 that are stored in the storage unit 32, and stores them in an internal memory. Further, as illustrated in FIG. 5A, the bonding tool 16 is positioned outwardly both from the opening 77 in the lead clamper 75 and the hole 76. As will be described later with reference to FIG. 7A and FIG. 7B, in an initial state, a wire tail 82 linearly extends from the pressing surface 16a at the tip of the bonding tool 16 by an extension length $D_s$, and the clamper 17 is closed. The extension length $D_s$ of the wire tail 82 is longer than a width of the annular pressing surface 16a of the bonding tool 16 or an external radius $r_{11}$ of the pressing surface 16a by a length $D_{82}$ of a projecting portion 82a. Then, as in Step S101 of FIG. 4, the control unit 30 initializes an integer n to 1. When the integer n is 1, the first pad 173, the first lead 174, the second pad 273, and the second lead 274 respectively correspond to a previous first bonding point, a previous second bonding point, a succeeding first bonding point, and a succeeding second bonding point defined in the appended claims.

Figure 4:
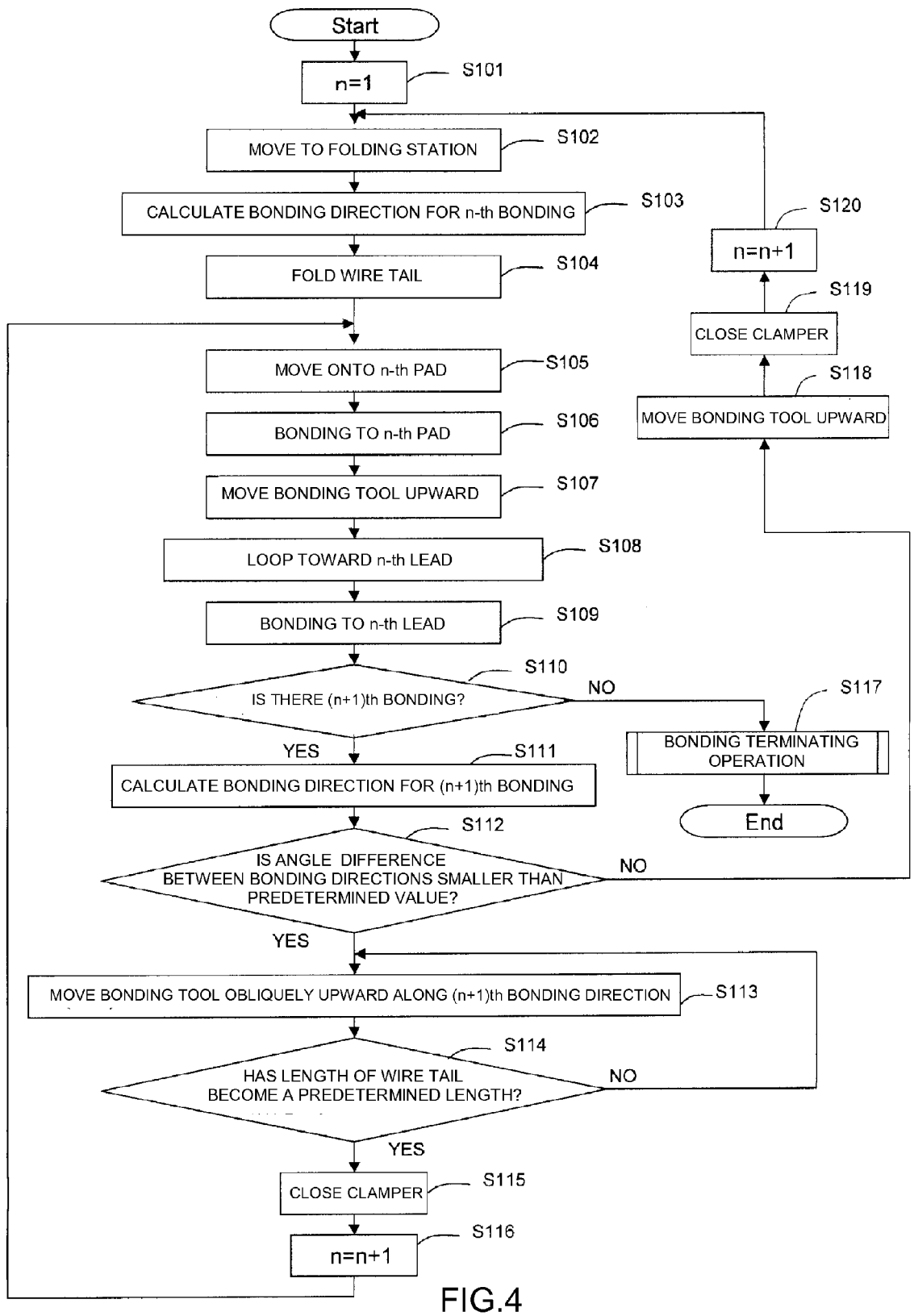
FIG. 4 is a flowchart showing an operation of the wire bonding apparatus according to the one embodiment of the present invention.

As in Step S102 of FIG. 4, the control unit 30 outputs a command for moving the bonding tool 16 to the folding station 78. Based on this command, a signal from the movement mechanism interface 44 is outputted to the XY table 20, and the XY table 20 moves the bonding head 19, as illustrated in FIG. 5A, so that the center of the bonding tool 16 comes immediately above the hole 76 of the lead clamper 75. Then, when the bonding tool 16 comes immediately above the hole 76 as illustrated in FIG. 5B, the control unit 30 outputs a command for moving the pressing surface 16a at the tip of the bonding tool 16 down to a position higher than the upper surface 75a of the lead clamper 75 by a height $H_1$. Based on this command, a signal from the movement mechanism interface 44 is outputted to the bonding head 19, the Z motor provided within the bonding head 19 is driven to rotate the bonding arm 13, and the pressing surface 16a at the tip of the bonding tool 16 is moved downward to the position higher than the upper surface 75a of the lead clamper 75 by the height $H_1$. The height $H_1$ is slightly greater than the diameter of the wire 81. When the pressing surface 16a of the bonding tool 16 is moved down to the height $H_1$, a tip of the wire tail 82 linearly extending from the tip of the bonding tool 16 is inside the hole 76 of the lead clamper 75.

Figures 6A, 6B:
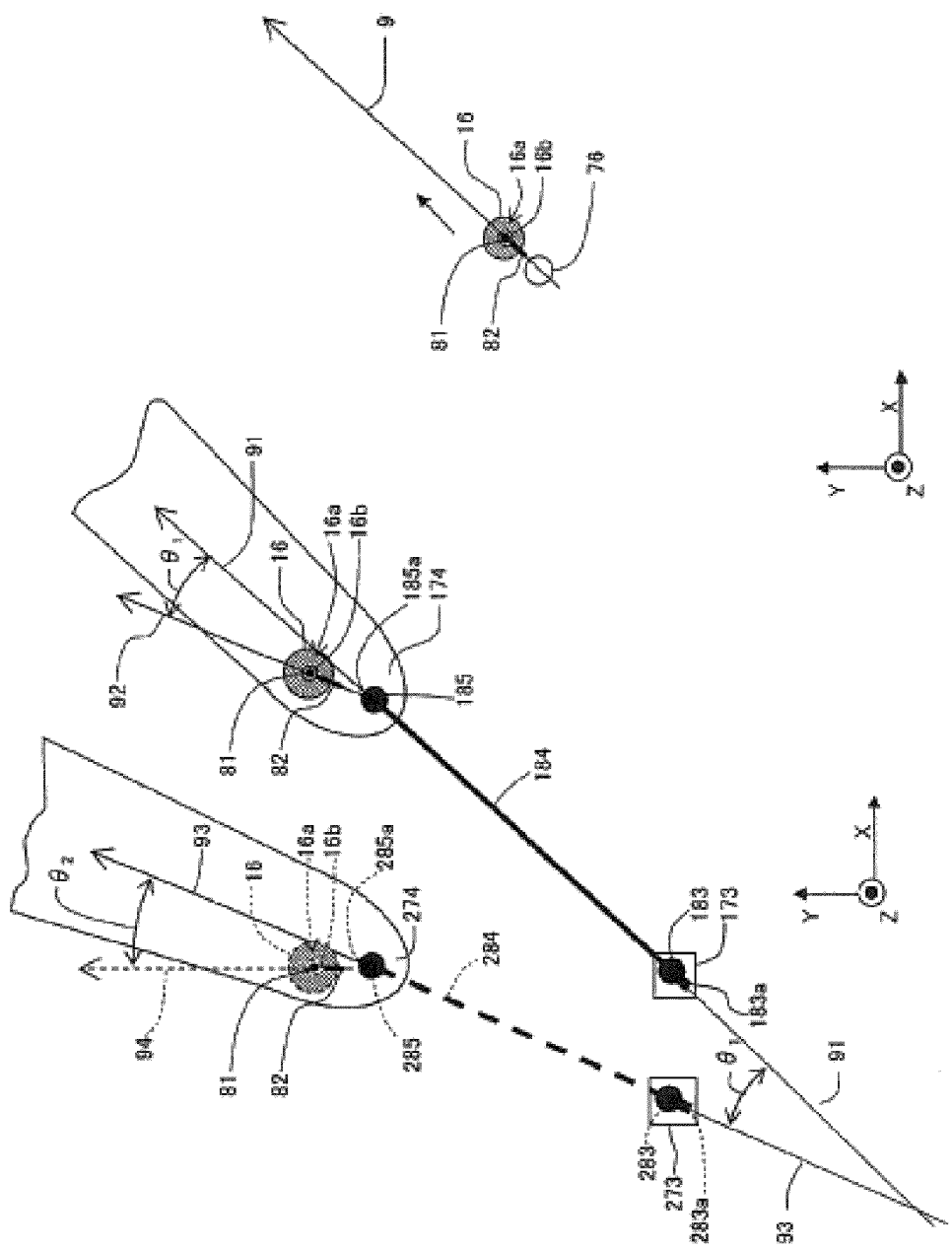
FIG. 6A is a diagram illustrating a wire folding operation by the wire bonding apparatus according to the one embodiment of the present invention.
FIG. 6B is a diagram illustrating a wire tail extending operation, and a tail-cut operation by the wire bonding apparatus according to the one embodiment of the present invention.

As in Step S103 of FIG. 4, as the integer n is set to 1, the control unit 30 calculates a bonding direction for the first bonding for connecting the first pad 173 and the first lead 174 that are to be first connected. The control data 38 of the storage unit 32 includes data of positions in the XY direction of the pads 73 of the chip 72 and the leads 74 that are to be bonded. The control unit 30 reads positions of the first pad 173 and the first lead 174 in the XY direction illustrated in FIG. 3 from the control data 38, and as illustrated in FIG. 6(b), calculates the direction for the first bonding for connecting the first pad 173 and the first lead 174 as a direction of a first straight line 91.

Figure 7B:
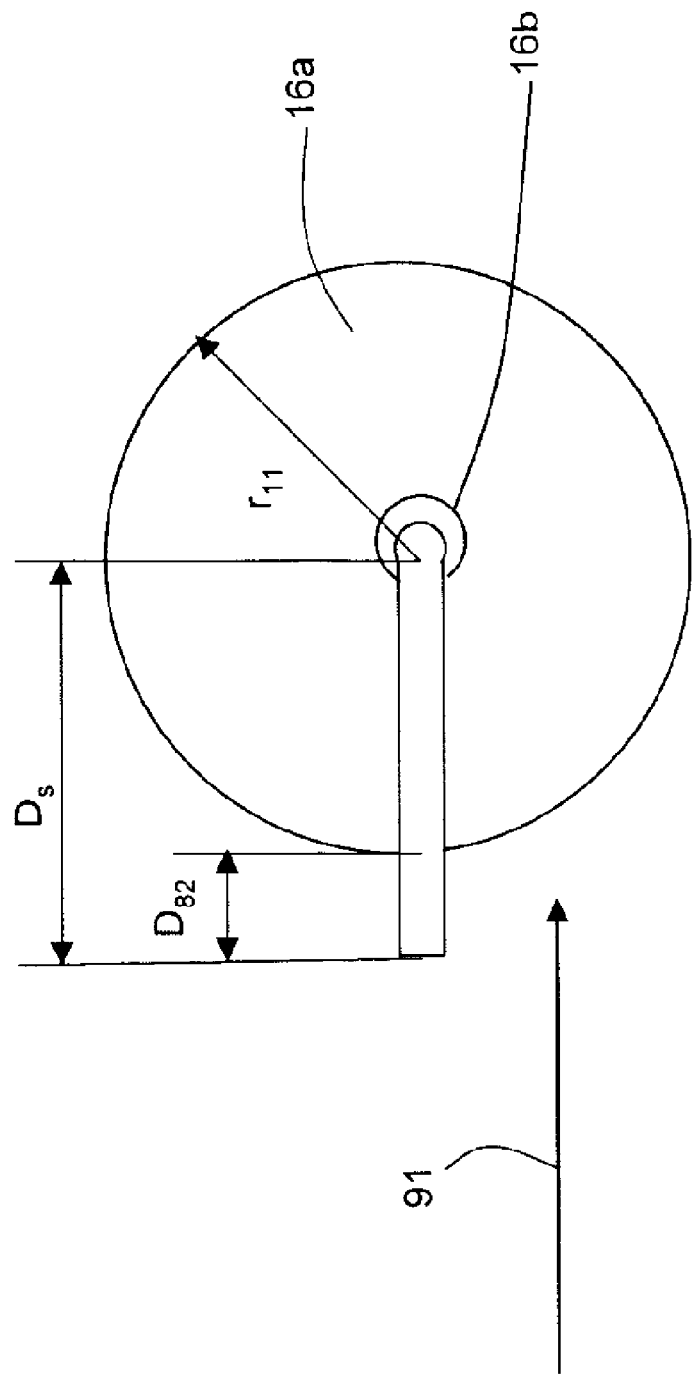
FIG. 7B is a diagram illustrating the wire folding operation by the wire bonding apparatus according to the one embodiment of the present invention.

As in Step S104 of FIG. 4, the control unit 30 outputs a command for performing a wire tail folding operation. Based on this command, a signal from the movement mechanism interface 44 is outputted to the XY table 20, and the XY table 20 moves the center of the bonding tool 16 horizontally, as illustrated in FIG. 5C and FIG. 6(a), to the side of the first lead 174 in the direction along the first straight line 91. As illustrated in FIG. 7A, this causes the wire tail 82 inside the hole 76 to be caught on a corner portion between the inner surface 76a of the hole 76 and the upper surface 75a of the lead clamper 75, and flexed laterally due to the horizontal movement of the bonding tool 16. Then, when the center of the bonding tool 16 has moved outside the hole 76, the wire tail 82 is caught between the pressing surface 16a and the upper surface 75a. As the through hole 16b of the bonding tool 16 is a straight hole vertically extending from the pressing surface 16a, the wire tail 82 is flexed substantially at a right angle to the wire 81 inserted through the through hole 16b. Further, as illustrated in FIG. 6 (a) and FIG. 7B, the tip of the flexed wire tail 82 is directed along the line 91 toward the first pad 173. In the initial state, the wire tail 82 extends linearly from the pressing surface 16a at the tip of the bonding tool 16 by the extension length $D_s$, and the extension length $D_s$ of the wire tail 82 is longer than the width of the annular pressing surface 16a of the bonding tool 16 or the external radius $r_{11}$ of the pressing surface 16a by the length $D_{82}$ of the projecting portion 82a. Accordingly, as illustrated in FIG. 7A and FIG. 7B, the tip of the wire tail 82 flexed in the direction along the pressing surface 16a projects outwardly from the pressing surface 16a of the bonding tool 16 by the length $D_{82}$ of the projecting portion 82a (wire tail folding step).

Figure 5D:
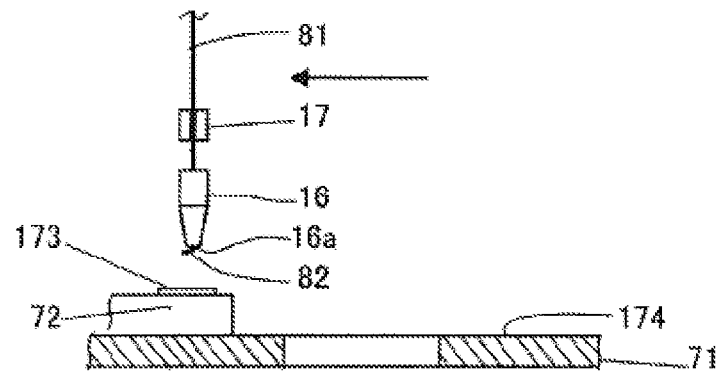
FIG. 5D is a diagram illustrating an operation of wedge bonding to a pad of a chip by the wire bonding apparatus according to the one embodiment of the present invention.

Upon completion of folding of the wire tail 82, as in Step S105 of FIG. 4, the control unit 30 outputs a command for moving the bonding tool 16 above the first pad 173, as the integer n is set to 1. Based on this command, a signal from the movement mechanism interface 44 is outputted to the XY table 20, and the XY table 20 moves the bonding head 19, as illustrated in FIG. 5D, so that the center of the bonding tool 16 comes immediately above the first pad 173.

Figure 5E:
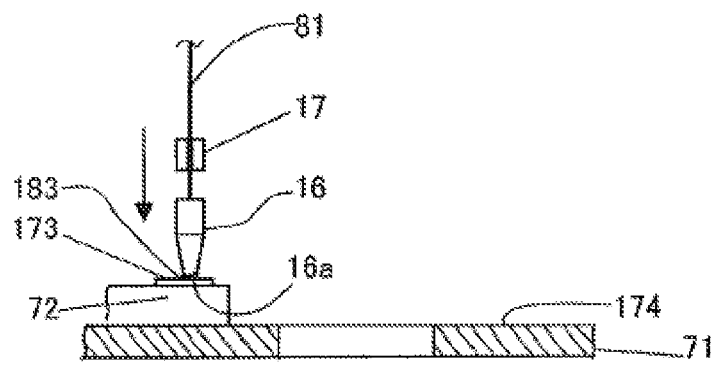
FIG. 5E is a diagram illustrating the operation of wedge bonding to the pad of the chip by the wire bonding apparatus according to the one embodiment of the present invention.
Figure 8A:
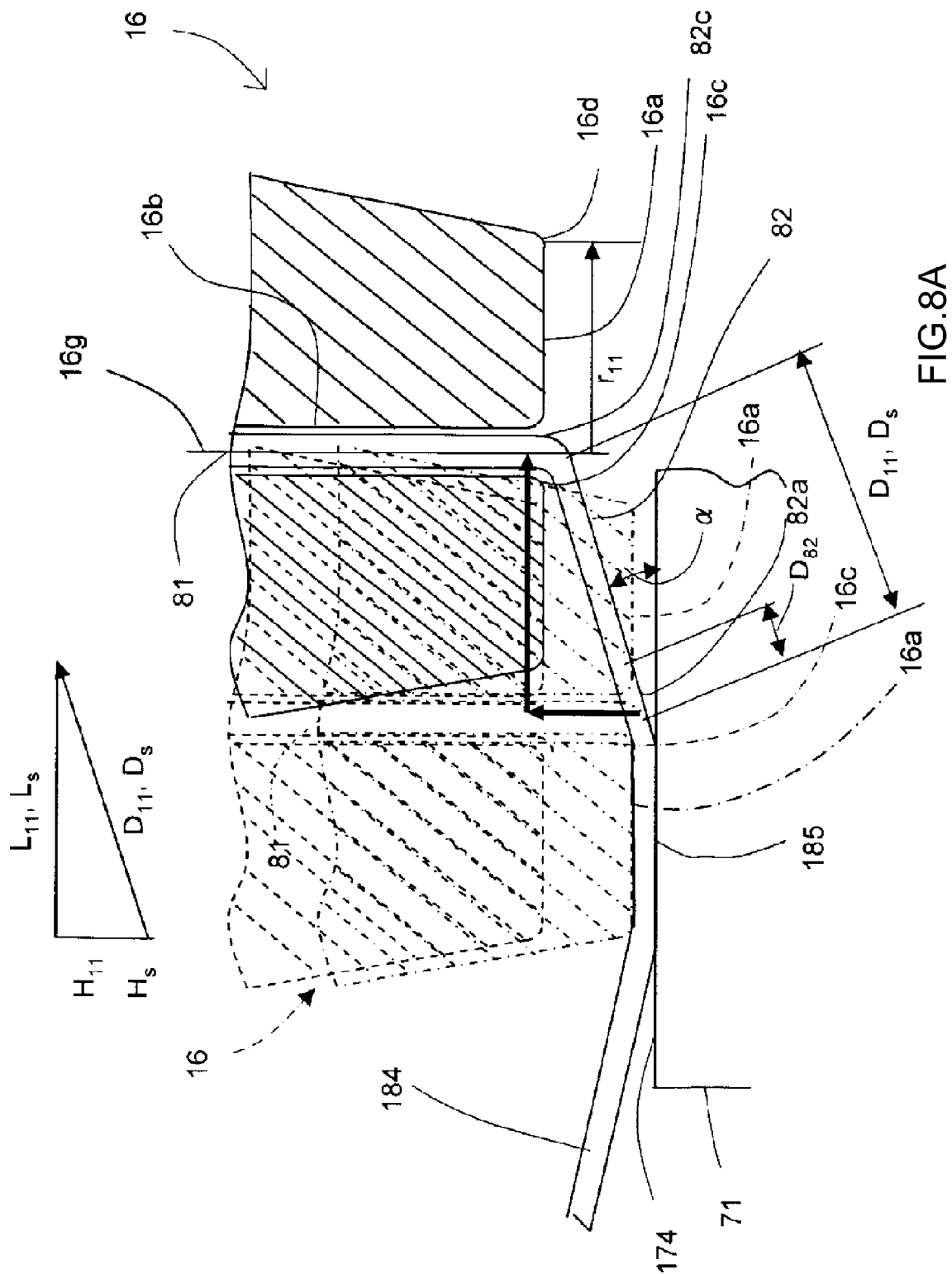
FIG. 8A is a diagram illustrating an operation of extending a wire tail by the wire bonding apparatus according to the one embodiment of the present invention.

When the center of the bonding tool 16 comes immediately above the first pad 173, the control unit 30 outputs a command for performing bonding to the first pad 173, as in Step S106 of FIG. 4. Based on this command, a signal from the movement mechanism interface 44 is outputted to the bonding head 19, the Z motor provided within the bonding head 19 is driven to rotate the bonding arm 13, and the tip of the bonding tool 16 is moved downward onto the first pad 173. Then, as illustrated in FIG. 5E, a side of the wire tail 82 extending from the tip of the bonding tool 16 and folded in the direction along the first straight line 91 illustrated in FIG. 6(b) is pressed against the first pad 173 by the pressing surface 16a at the tip of the bonding tool 16, the ultrasonic transducer 15 is driven based on a signal from the ultrasonic transducer interface 43 to cause the bonding tool 16 to vibrate, and the wire tail 82 is bonded to the first pad 173 by wedge bonding. This bonding forms a first bond portion 183 on an upper surface of the first pad 173. The first bond portion 183 is formed by squashing the side of the wire tail 82 by the flat pressing surface 16a of the bonding tool 16, and is an elliptic or circular thin plate as illustrated in FIG. 6(b) and FIG. 8A. As illustrated in FIG. 8A, as the length of the wire tail 82 is longer than the width of the annular pressing surface 16a of the bonding tool 16 or the external radius $r_{11}$ of the pressing surface 16a by the length $D_{82}$ of the projecting portion 82a, the length of the elliptic or circular first bond portion 183 is slightly greater than the width of the pressing surface 16a, which results in favorable wedge bonding. Then, as illustrated in FIG. 6(b), the projecting portion 82a that has not been formed into a thin plate remains as an end portion 183a on the side of the first bond portion 183 opposite from the first lead 174.

Figure 5F:
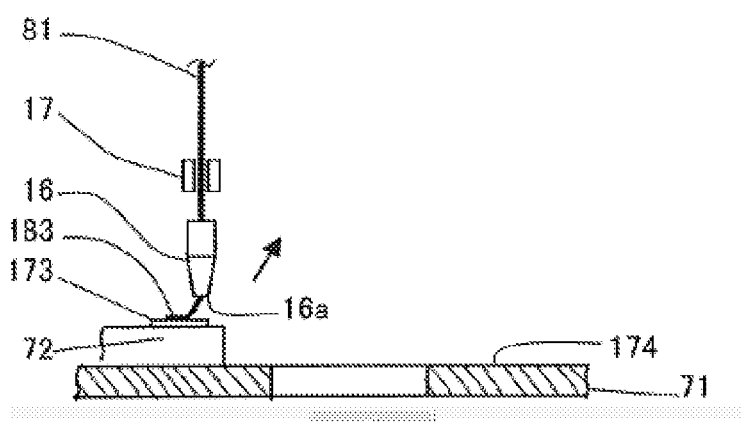
FIG. 5F is a diagram illustrating a rising operation of a bonding tool by the wire bonding apparatus according to the one embodiment of the present invention.

Upon completion of connection of the wire tail 82 to the first pad 173, as in Step S107 of FIG. 4, the control unit 30 outputs a command for moving the bonding tool 16 upward. Based on this command, a signal from the movement mechanism interface 44 is outputted to the bonding head 19, the Z motor provided within the bonding head 19 is driven to rotate the bonding arm 13, and the tip of the bonding tool 16 is moved upward. Along with this, a signal from the movement mechanism interface 44 is outputted to the XY table 20, and the XY table 20 moves the center of the bonding tool 16 in the direction along the first straight line 91 illustrated in FIG. 6(b). Further, based on this command, a signal from the clamper open-close mechanism interface 41 is outputted to the clamper open-close mechanism 27, and the clamper 17 is opened by the clamper open-close mechanism 27. As illustrated in FIG. 5F, this causes the bonding tool 16 to move obliquely upward toward the direction along the first straight line 91 illustrated in FIG. 6(b). By the obliquely upward movement in this manner allows extension of the wire, 81 continuing to the wire tail 82 whose side is bonded onto the first pad 173 by wedge bonding smoothly from the tip of the bonding tool 16 without making the wire flexed at a steep angle.

Figure 5G:
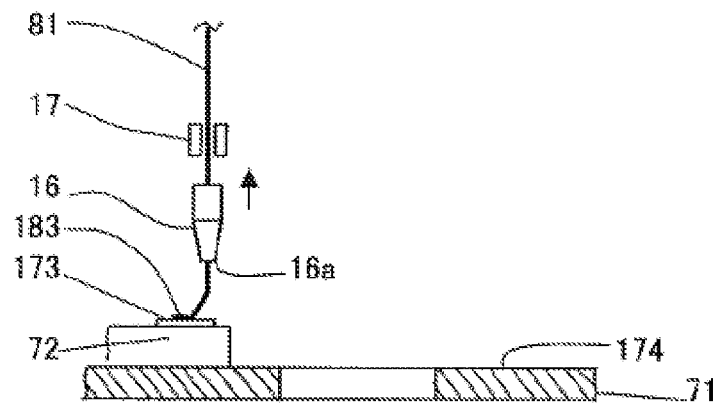
FIG. 5G is a diagram illustrating a looping operation from the pad of the chip to a lead of a substrate by the wire bonding apparatus according to the one embodiment of the present invention.
Figure 5H:
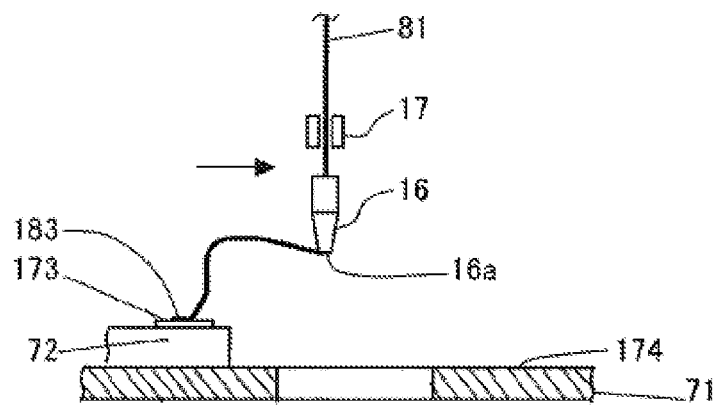
FIG. 5H is a diagram illustrating the looping operation from the pad of the chip to the lead of the substrate by the wire bonding apparatus according to the one embodiment of the present invention.

As the integer n is set to 1, after moving the bonding tool 16 up to a predetermined height, the control unit 30 outputs a command for looping the bonding tool 16 toward the first lead 174 as in Step S108 of FIG. 4. Based on this command, a signal from the movement mechanism interface 44 is outputted to the bonding head 19, the Z motor provided within the bonding head 19 is driven to rotate the bonding arm 13, and the bonding tool 16 is moved upward by a predetermined distance as illustrated in FIG. 5G. Subsequently, a signal from the movement mechanism interface 44 is outputted to the XY table 20 and the bonding head 19, and the Z motors provided within the XY table 20 and the bonding head 19 are driven so that the tip of the bonding tool 16 moves along a shape of the loop as illustrated in FIG. 5H. By this operation, the center of the bonding tool 16 moves along the first straight line 91 illustrated in FIG. 6(b), from the first pad 173 toward the first lead 174.

Figure 5J:
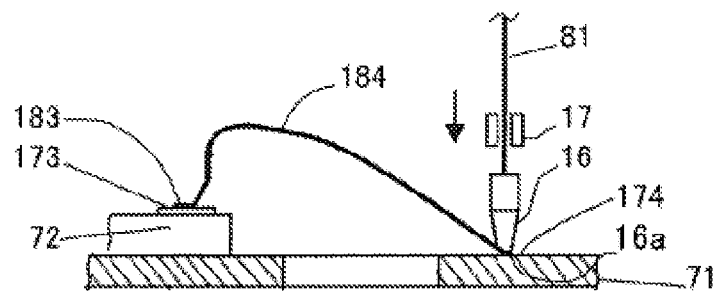
FIG. 5J is a diagram illustrating an operation of wedge bonding to the lead of the substrate by the wire bonding apparatus according to the one embodiment of the present invention.
Figure 5K:
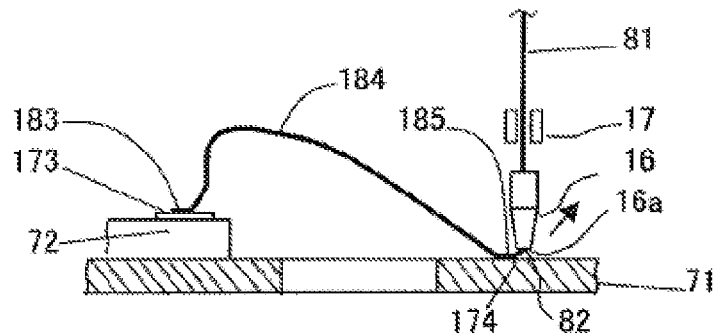
FIG. 5K is a diagram illustrating an operation of extending a wire tail by the wire bonding apparatus according to the one embodiment of the present invention.

Then, when the center of the bonding tool 16 comes immediately above the first lead 174, the control unit 30 outputs a command for performing bonding to the first lead 174, as in Step S109 of FIG. 4. Based on this command, a signal from the movement mechanism interface 44 is outputted to the bonding head 19, the Z motor provided within the bonding head 19 is driven to rotate the bonding arm 13, and the tip of the bonding tool 16 is moved downward onto the first lead 174. Then, as illustrated in FIG. 5J, a side of the wire 81 extending from the tip of the bonding tool 16 is pressed against the first lead 174 by the pressing surface 16a at the tip of the bonding tool 16, the ultrasonic transducer 15 is driven based on a signal from the ultrasonic transducer interface 43 to cause the bonding tool 16 to vibrate, and the side of the wire 81 is bonded onto the first lead 174 by wedge bonding. This bonding forms a second bond portion 185 on an upper surface of the first lead 174. The second bond portion 185 is formed by squashing the side of the wire 81 that has been looped by the flat pressing surface 16a, and is an elliptic or circular thin plate similarly to the first bond portion 183. When the wire 81 is bonded to the first lead 174 by wedge bonding in this manner, the first pad 173 and the first lead 174 are connected with the first connecting wire 184 that is in a loop having a mountain-like profile as illustrated in FIG. 5K and linearly extending along the first straight line 91 in the XY plane as illustrated in FIG. 6 (b).

Upon completion of bonding to the first lead 174, the control unit 30 determines, as in Step S110 of FIG. 4, whether or not there are the pad 73 or the lead 74 that are to be bonded next. As the integer n is set to 1, (n+1) is 2, and the second bonding is to be performed for connecting the second pad 273 and the second lead 274 in this embodiment, the control unit 30 determines that there is (n+1)th bonding as in Step S110 of FIG. 4, moves to Step S111 of FIG. 4, and calculates a bonding direction for the second bonding for connecting the second pad 273 and the second lead 274 that are to be next connected. The control unit 30 reads positions of the second pad 273 and the second lead 274 in the XY direction illustrated in FIG. 3 from the control data 38, and as illustrated in FIG. 6(b), calculates the direction for the second bonding for connecting the second pad 273 and the second lead 274 as a direction of a second straight line 93.

Then, as in Step S112 of FIG. 4, the control unit 30 calculates an angle difference $\theta_1$ between the second straight line 93 and the first straight line 91 illustrated in FIG. 6(b), and compares the angle difference $\theta_1$ with a predetermined angle. Here, the predetermined angle can be on the order of 90 degrees, for example, at which the bonding tool 16 or the extended wire tail 82 can not interfere with the connecting wire 184 that has been bonded immediately previously when extending the wire tail 82, or can be on the order of 30 degrees or 45 degrees, for example, at which a fracture can not occur between the extended wire tail 82 and the second bond portion 185 bonded to the first lead 174.

As in Step S112 of FIG. 4, when the angle difference $\theta_1$ is smaller than the predetermined angle difference, as the integer n is set to 1, the control unit 30 outputs a command for moving the bonding tool 16, as in Step S113 of FIG. 4, obliquely upward to a direction along a first wire tail pulling line 92 illustrated in FIG. 6(b), which is parallel to the direction along the second straight line 93 which is the direction for the second bonding for connecting the second pad 273 and the second lead 274. Based on this command, a signal from the movement mechanism interface 44 is outputted to the bonding head 19, and the Z motor provided within the bonding head 19 is driven to rotate the bonding arm 13, and the bonding tool 16 is moved upward. Along with this, a signal from the movement mechanism interface 44 is outputted to the XY table 20 and the bonding head 19, and the Z motors provided within the XY table 20 and the bonding head 19 are driven. By this operation, the tip of the bonding tool 16 moves obliquely upward as illustrated in FIG. 5K toward the direction along the first wire tail pulling line 92 illustrated in FIG. 6 (b) from the surface of the first lead 174.

Figure 8B:
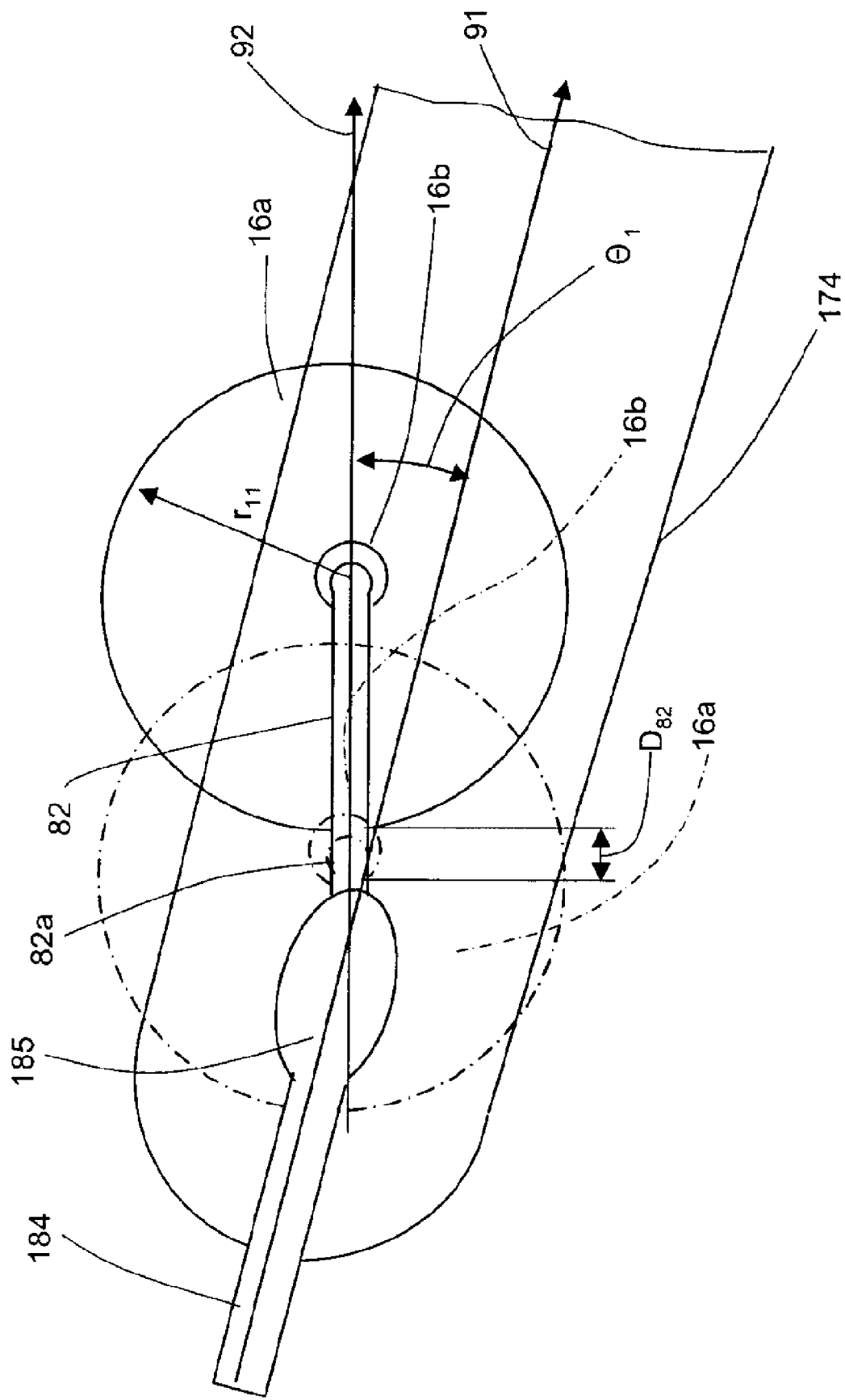
FIG. 8B is a diagram illustrating the operation of extending a wire tail by the wire bonding apparatus according to the one embodiment of the present invention.

Further details as to how the bonding tool 16 moves obliquely upward from the first lead 174 will be described with reference to FIG. 8A and FIG. 8B. In FIG. 8A and FIG. 8B, alternate long and short dash lines show a state in which the bonding tool 16 bonds the first lead 174 with the wire 81 by wedge bonding. In this state, the pressing surface 16a of the bonding tool 16 indicated by the alternate long and short dash lines in FIG. 8A causes the side of the wire 81 to be deformed into the second bond portion 185 of an elliptic thin plate by pressing the side of the wire 81 against the first lead 174, thereby bonding the second bond portion 185 onto the first lead 174 by wedge bonding. The wire 81 is flexed substantially at a right angle between an end portion of the second bond portion 185 and the through hole 16b in the bonding tool 16.

When the bonding tool 16 moves obliquely upward as illustrated in FIG. 8A, the bonding tool 16 moves toward the direction of the first wire tail pulling line 92 parallel to the second straight line 93 which is the direction for the second bonding as illustrated in FIG. 8B. This direction is displaced from the first straight line 91 indicating the direction for the first bonding for connecting the first pad 173 and the first lead 174 by the angle $\theta_1$. Accordingly, when the bonding tool 16 moves obliquely upward, the wire tail 82 extending from the tip of the bonding tool 16 is flexed at the angle $\theta_1$ at a border portion with the end portion of the second bond portion 185. Then, as further shown by solid lines in FIG. 8A and FIG. 8B, when the tip of the bonding tool 16 moves obliquely upward, the extended wire tail 82 is pressed laterally by the corner portion 16c between the through hole 16b and the pressing surface 16a of the bonding tool 16, stroked by the corner portion 16c, and formed into a flexed shape with respect to the pressing surface 16a of the bonding tool 16. The flexing direction in a vertical plane is such that the wire is flexed toward the pressing surface 16a at the same angle as a rising angle of the bonding tool 16 with respect to the pressing surface 16a, or at an angle deeper than this.

Then, as in Step S114 of FIG. 4, the control unit 30 calculates an obliquely upward moving distance of the tip of the bonding tool 16 illustrated in FIG. 8A, that is, an extension length $D_{11}$ of the wire tail 82, based on a Z direction moving distance $H_{11}$ illustrated in FIG. 8A obtained from the bonding tool height detector 29 illustrated in FIG. 1 and an XY direction moving distance $L_{11}$ illustrated in FIG. 8A obtained from the XY table 20 illustrated in FIG. 1, and determines whether or not the extension length $D_{11}$ of the wire tail 82 in the oblique upward direction is a predetermined oblique moving distance $D_s$. Here, it is sufficient if the predetermined oblique moving distance $D_s$ is longer than a width of the annular pressing surface 16a of the bonding tool 16 or the external radius $r_{11}$ of the pressing surface 16a by the length $D_{82}$ of the projecting portion 82a. This length is necessary in order to ensure a bonding strength and a bonding property by allowing, in the succeeding bonding, the wire tail 82 to project outside the annular pressing surface 16a of the bonding tool 16 by the length $D_{82}$ of the projecting portion 82a, and the wire tail 82 to be formed into a thin plate by being pressed against the pad 73 by an entire surface of the pressing surface 16a of the bonding tool 16 and bonded by wedge bonding (wire tail extension step).

Here, a proportion of the Z direction moving distance $H_{11}$ of the bonding tool 16 to the XY direction moving distance $L_{11}$ determines a flexing angle $\alpha$ of the wire tail 82 extending obliquely downward from the bonding tool 16 in an obliquely upward direction, that is, the flexing angle $\alpha$ between the wire tail 82 and the pressing surface 16a of the bonding tool 16. The flexing angle $\alpha$ between the wire tail 82 and the pressing surface 16a of the bonding tool 16 can be any angle as long as the wire tail 82 extending obliquely downward from the bonding tool 16 can be smoothly flexed toward the pressing surface 16a by the downward movement of the bonding tool 16 in the succeeding bonding, and can be on the order of 5 degrees to 50 degrees, 10 degrees to 45 degrees, or 30 degrees to 45 degrees, for example. For example, in order to set the angle $\alpha$ to 30 degrees, the bonding tool 16 can be moved obliquely upward such that the proportion of the Z direction moving distance $H_{11}$ of the bonding tool 16 to the XY direction moving distance $L_{11}$ is $1:\sqrt{3}$, and in order to set the angle $\alpha$ to 45 degrees, the bonding tool 16 can be moved obliquely upward such that the proportion of the Z direction moving distance $H_{11}$ of the bonding tool 16 to the XY direction moving distance $L_{11}$ is 1:1. The angle α and the proportion of the Z direction moving distance $H_{11}$ of the bonding tool 16 to the XY direction moving distance $L_{11}$ can be freely selected based on a condition such as a diameter or a material of the wire 81 to be bonded.

Figure 5L:
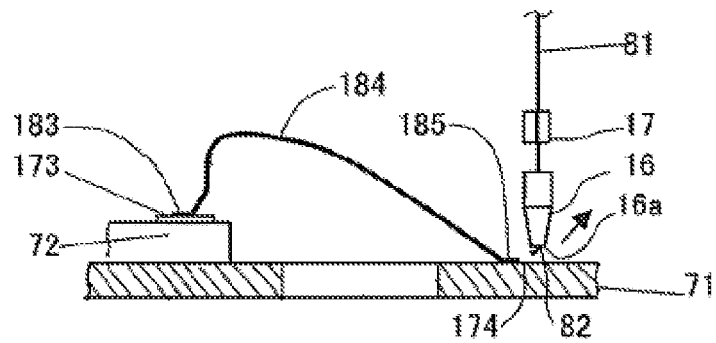
FIG. 5L is a diagram illustrating a tail-cut operation by the wire bonding apparatus according to the one embodiment of the present invention.
Figure 9A:
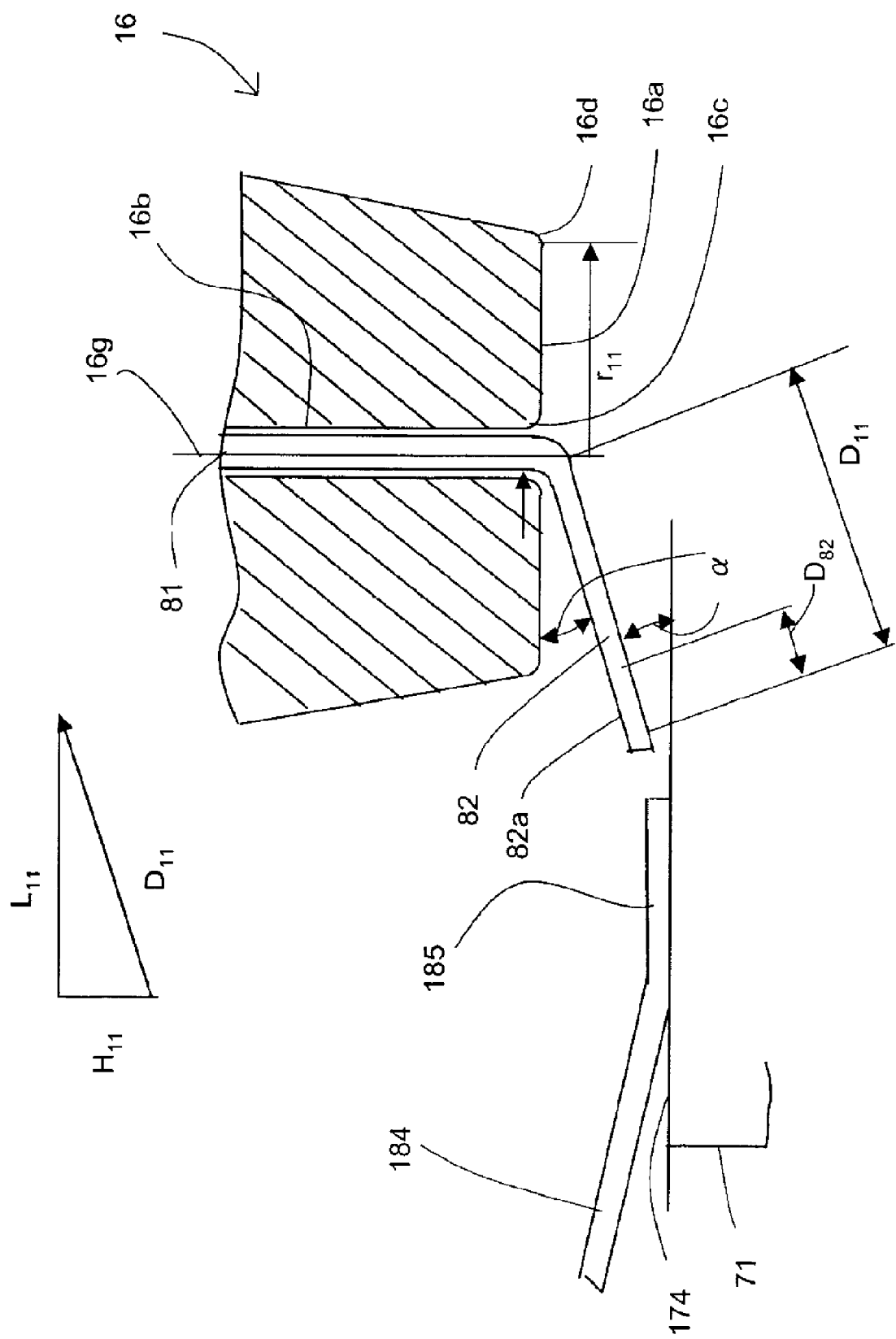
FIG. 9A is a diagram illustrating a tail-cut operation by the wire bonding apparatus according to the one embodiment of the present invention.
Figure 9B:
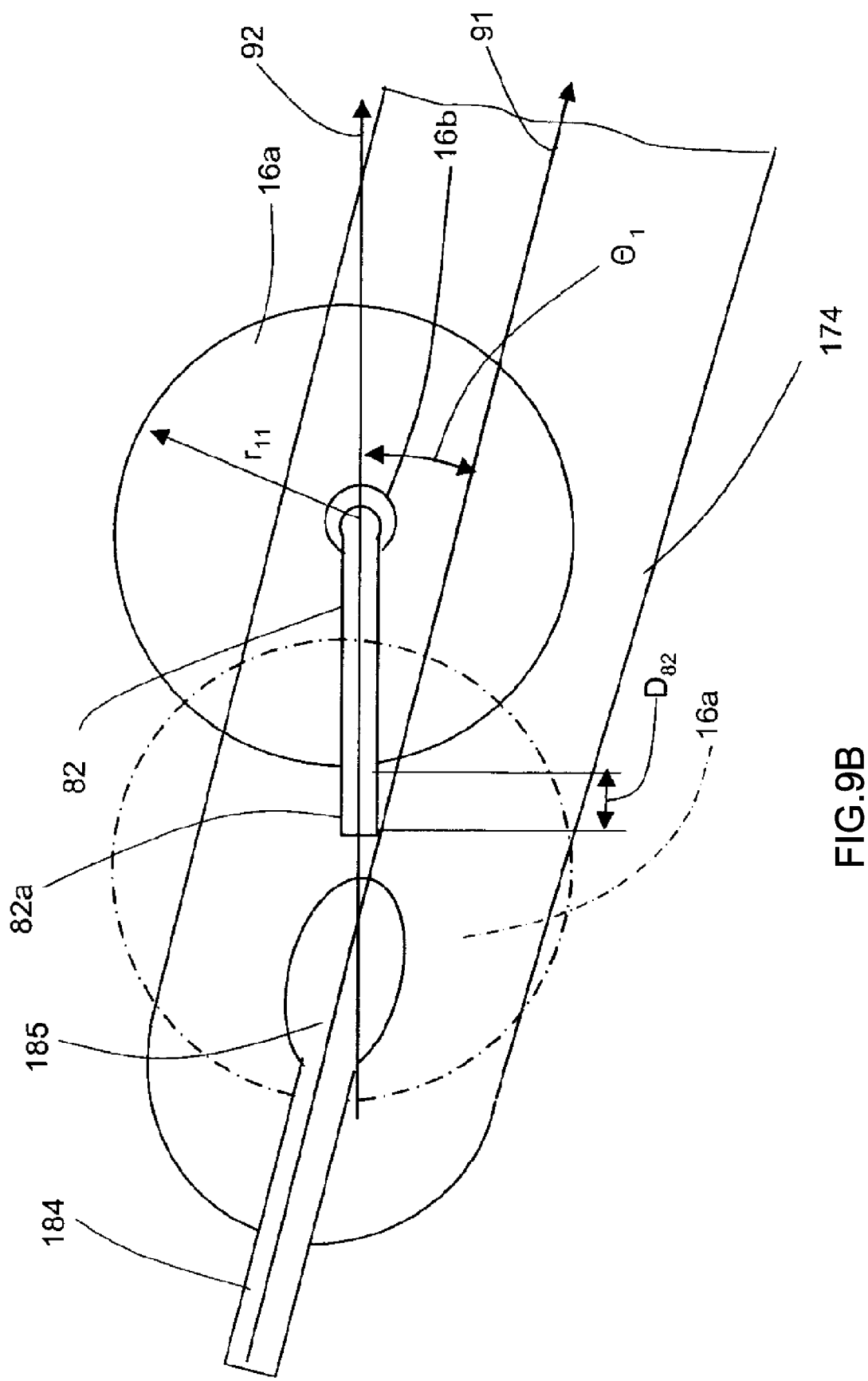
FIG. 9B is a diagram illustrating the tail-cut operation by the wire bonding apparatus according to the one embodiment of the present invention.

Then, when the extension length $D_{11}$ of the wire tail 82 obliquely upward becomes the predetermined oblique moving distance $D_s$, a command for closing the clamper 17 is outputted as in Step S115 of FIG. 4. Based on this command, a signal from the clamper open-close mechanism interface 41 is outputted to the clamper open-close mechanism 27, and the clamper 17 is closed by the clamper open-close mechanism 27. Then, as the bonding tool 16 continues to move obliquely upward as illustrated in FIG. 5L, the wire tail 82 is cut at a boundary surface between the first lead 174 and the second bond portion 185 where the strength is lowest as illustrated in FIG. 9A and FIG. 9B, and the wire tail 82 is separated from the first lead 174 (tail cut step). Even after the wire tail 82 is cut, as the wire tail 82 is stroked by the corner portion 16c between the pressing surface 16a and the through hole 16b of the bonding tool 16 when the bonding tool 16 moves obliquely upward, and plastic deformation of a flexing portion of the wire tail 82 shown in FIG. 8A occurs, the flexing angle α obliquely downward from the pressing surface 16a of the bonding tool 16 is maintained. Further, the wire tail 82 extending from the bonding tool 16 in the XY plane is directed along the first wire tail pulling line 92 parallel to the second straight line 93 as the second bonding direction.

Figure 5M:
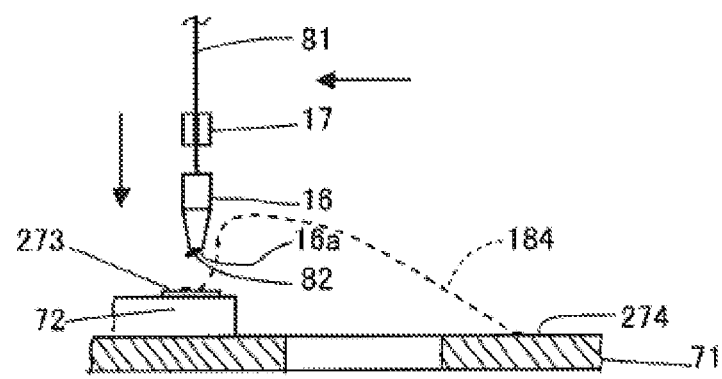
FIG. 5M is a diagram illustrating an operation of moving to the next pad by the wire bonding apparatus according to the one embodiment of the present invention.

Upon cutting of the wire tail 82, the control unit 30 increments the integer n by 1 as in Step S116 of FIG. 4, and the process returns to Step S105 of FIG. 4. At this time, as the integer n is 2 by being incremented by 1, the control unit 30 moves the center of the bonding tool 16 immediately above the second pad 273 as illustrated in FIG. 5M. When the bonding tool 16 comes immediately above the second pad 273, as illustrated in FIG. 6(b), the wire tail 82 extending from the tip of the bonding tool 16 is directed to the direction along the second straight line 93, which is a straight line connecting the second pad 273 and the second lead 274, as the second bonding, and facing a direction opposite of the second lead 274.

As in Step S106 of FIG. 4, the control unit 30 outputs a command for performing bonding to the second pad 273. Similarly to the previous description, based on this command, a signal from the movement mechanism interface 44 is outputted to the bonding head 19, the Z motor provided within the bonding head 19 is driven to rotate the bonding arm 13, and the tip of the bonding tool 16 is moved downward onto the second pad 273. Then, a side of the wire tail 82 extending from the tip of the bonding tool 16 is pressed against the second pad 273 by the pressing surface 16a at the tip of the bonding tool 16, the ultrasonic transducer 15 is driven based on a signal from the ultrasonic transducer interface 43 to cause the bonding tool 16 to vibrate, and the side of the wire tail 82 is bonded onto the second pad 273 by wedge bonding. As illustrated in FIG. 6(b), the bonded portion becomes a first bond portion 283 in an elliptic or circular thin plate. As the length of the wire tail 82 is slightly greater than the width of the annular pressing surface 16a of the bonding tool 16, the projecting portion 82a projecting from the pressing surface 16a is not squashed by the pressing surface 16a, and remains as an end portion 283a that has not been formed into a thin plate on the side of the second lead 274 opposite from the first bond portion 283. In this manner, by pressing the side of the wire tail 82 onto the second pad 273 by the pressing surface

16a as a whole to perform wedge bonding, it is possible to reduce defective bonding, and to provide favorable wedge bonding.

As in Steps S106-S109 of FIG. 4, upon bonding of the wire tail 82 to the second pad 273, the control unit 30 moves the bonding tool 16 upward to loop the wire toward the second lead 274, presses the side of the wire 81 onto the second lead 274 to form a second bond portion 285, and connects the second pad 273 and the second lead 274 with the second connecting wire 284. Then, as in Step S110 of FIG. 4, the control unit 30 determines whether or not third bonding is to be next performed, and as in Steps S112-S115 of FIG. 4, calculates a direction for third bonding if third bonding is to be performed. As illustrated in FIG. 6(b), a second wire tail pulling line 94 parallel to the direction for the third bonding forms an angle difference $\theta_2$ to the second straight line 93 as the direction for second bonding, and as the angle difference $\theta_2$ is smaller than a predetermined angle difference, the control unit 30 moves the bonding tool 16 obliquely upward along the direction of the second wire tail pulling line 94 parallel to the direction for third bonding illustrated in FIG. 6(b). Then, as in Steps S114-S115 of FIG. 4, after extending the wire tail 82 by a predetermined length, the control unit 30 closes the clamper 17 to cut the wire tail 82. Thereafter, the integer n is again incremented by 1 as in Step S116 of FIG. 4, and the process returns to Step S105 of FIG. 4 and the bonding is continued.

When the integer n is 5, a fifth pad 573, a fifth lead 574, a sixth pad 673, and a sixth lead 674 illustrated in FIG. 3 respectively correspond to the previous first bonding point, the previous second bonding point, the succeeding first bonding point, and the succeeding second bonding point defined in the appended claims. Further, when the integer n is 5, as in Step S105 of FIG. 4, the control unit 30 outputs a command for moving toward above the fifth pad 573 illustrated upper light in FIG. 3; based on this command, the wire bonding apparatus 10 drives the XY table 20 similarly to the previous description to move the center of the bonding tool 16 to be positioned immediately above the fifth pad 573, and as in Step S106 of FIG. 4, outputs a command for performing bonding onto the fifth pad 573. Similarly to the previous description, based on this command, the wire bonding apparatus 10 drives the Z motor provided within the bonding head 19 to move the tip of the bonding tool 16 downward onto the fifth pad 573, and bonds the side of the wire tail 82 onto the fifth pad 573 by wedge bonding. Upon completion of bonding of the wire tail 82 to the fifth pad 573, as in Step S108 of FIG. 4, the control unit 30 outputs a command for looping the bonding tool 16 toward the fifth lead 574. Based on this command, as described previously, the wire bonding apparatus 10 drives the XY table 20 and the Z motor provided within the bonding head 19 to loop the bonding tool 16 from the fifth pad toward the fifth lead 574. A direction of the looing connecting the fifth pad 573 and the fifth lead 574 corresponds to a direction of fifth bonding, which is a direction along a fifth straight line 95 illustrated in FIG. 10(b).

As the integer n is set to 5, and (n+1) is 6, the control unit 30 determines, as in Step S110 of FIG. 4, whether or not there is sixth bonding to be next performed. As illustrated in FIG. 3, in this embodiment, as the sixth bonding is bonding for connecting the sixth pad 673 at lower left of the chip 72 and the sixth lead 674 at lower left of the substrate 71, the control unit 30 determines that that there is (n+1)th bonding as in Step S111 of FIG. 4, moves to Step S111 of FIG. 4, and calculates a bonding direction for the sixth bonding for connecting the sixth pad 673 and the sixth lead 674 that are to be next connected. The control unit 30 reads positions of the sixth pad 673 and the sixth lead 674 in the XY direction illustrated in FIG. 3 from the control data 38, and as illustrated in FIG. 10(b), calculates the direction for the sixth bonding for connecting the sixth pad 673 and the sixth lead 674 as a direction of a sixth straight line 96.

Figures 10A, 10B:
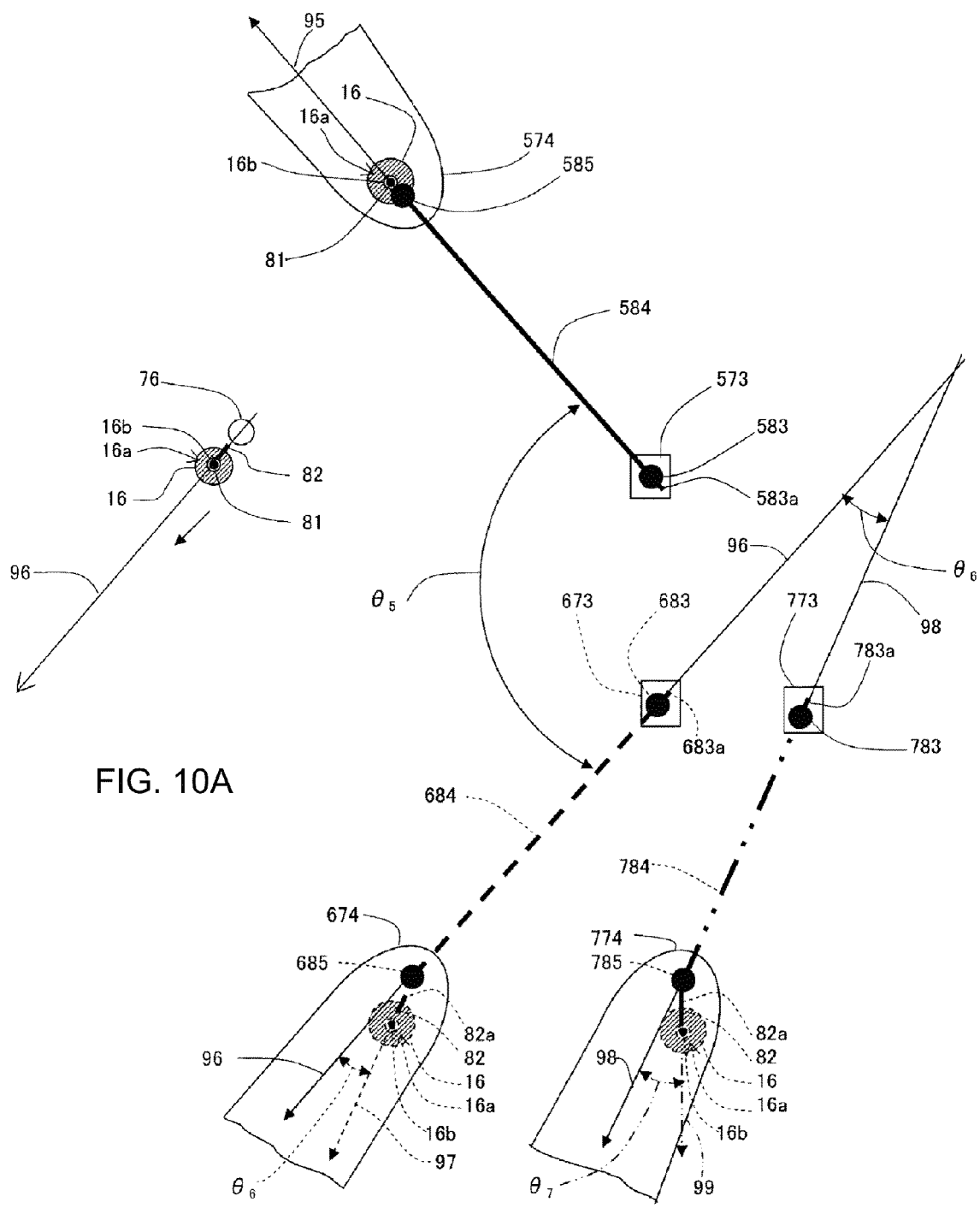
FIG. 10A is a diagram illustrating the wire folding operation by the wire bonding apparatus according to the one embodiment of the present invention.
FIG. 10B is a diagram illustrating the wire tail extending operation, and the tail-cut operation by the wire bonding apparatus according to the one embodiment of the present invention.

Then, as in Step S112 of FIG. 4, the control unit 30 calculates an angle difference $\theta_5$ between the sixth straight line 96 and the fifth straight line 95 illustrated in FIG. 10(b), and compares the angle difference $\theta_5$ with the predetermined angle. Unlike the angle difference $\theta_1$ between the bonding direction in the first bonding and the bonding direction in the second bonding that has been described previously, the angle difference $\theta_5$ is equal to or greater than 90 degrees, and greater than the predetermined angle, and thus the folding direction of the wire tail 82 in the XY plane becomes too large. Accordingly, the control unit 30 determines that the angle difference $\theta_5$ is greater than a predetermined value, and as in Step S118 of FIG. 4, outputs a command for moving the bonding tool 16 substantially vertically upward.

Figure 11A:
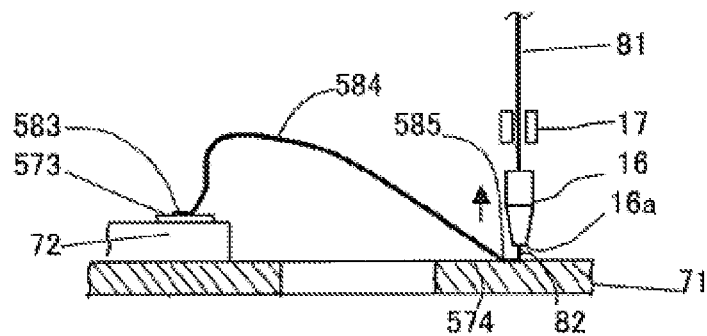
FIG. 11A is a diagram illustrating an operation of extending a wire tail by the wire bonding apparatus according to the one embodiment of the present invention.
Figure 11B:
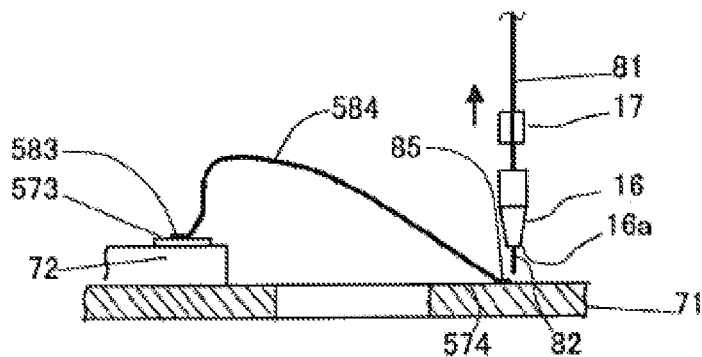
FIG. 11B is a diagram illustrating a tail-cut operation by the wire bonding apparatus according to the one embodiment of the present invention.

Based on this command, a signal from the movement mechanism interface 44 is outputted to the bonding head 19, the Z motor provided within the bonding head 19 is driven to rotate the bonding arm 13, and the tip of the bonding tool 16 is moved upward above the fifth lead 574. In the previous description, the bonding tool 16 is described to move obliquely upward after the bonding to the first lead 174; however, as illustrated in FIG. 11A, after the bonding to the fifth lead 574, the bonding tool 16 is moved substantially vertically upward. This is performed in order to extend the wire tail 82 linearly from the tip of the bonding tool 16. Then, after moving the bonding tool 16 up to a predetermined height, the control unit 30 outputs a command for closing the clamper 17 as in Step S119 of FIG. 4. Similarly to the previous description, the clamper 17 is closed based on this command, and as illustrated in FIG. 11B, the wire tail 82 is cut in a state extending linearly from the bonding tool 16. Then, as in Step S120 of FIG. 4, the integer n is incremented by 1 and the process returns to Step S102 of FIG. 4.

Figure 11C:
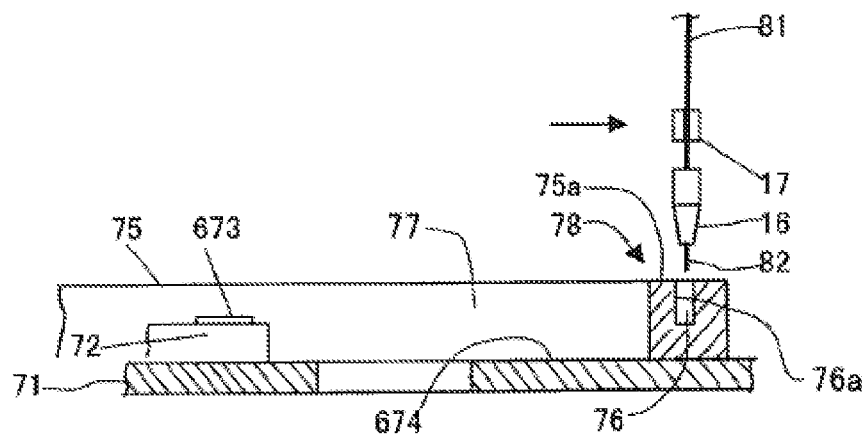
FIG. 11C is a diagram illustrating a wire folding operation by the wire bonding apparatus according to the one embodiment of the present invention.
Figure 11D:
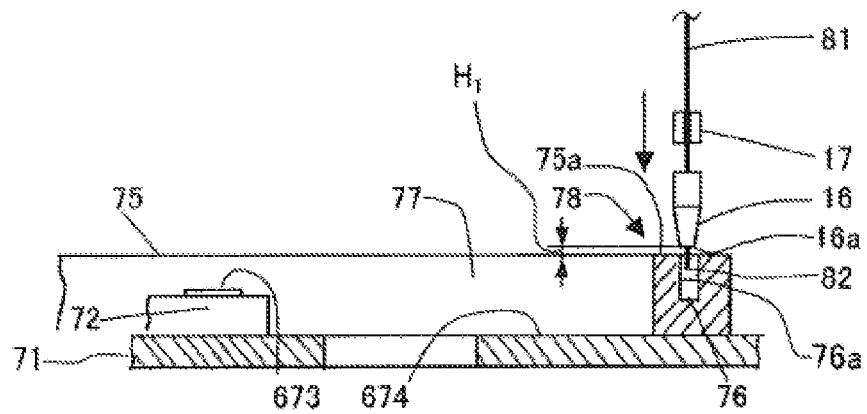
FIG. 11D is a diagram illustrating the wire folding operation by the wire bonding apparatus according to the one embodiment of the present invention.

Returning to Step S102 of FIG. 4, the control unit 30 outputs a command for moving the bonding tool 16 to the folding station 78. Similarly to the previous description, as illustrated in FIG. 11C, the XY table 20 is driven based on this command, and the center of the bonding tool 16 comes immediately above the hole 76 positioned lower left of the lead clamper 75 illustrated in FIG. 3. Then, when the bonding tool 16 comes immediately above the hole 76, the control unit 30 outputs a command for moving the pressing surface 16a at the tip of the bonding tool 16 down to a position higher than the upper surface 75a of the lead clamper 75 by the height $H_1$. As described above, based on this command, the pressing surface 16a at the tip of the bonding tool 16 is moved downward to the position higher than the upper surface 75a of the lead clamper 75 by the height $H_1$. The height $H_1$ is slightly greater than the diameter of the wire 81. When the pressing surface 16a of the bonding tool 16 is moved down to the height $H_1$, as illustrated in FIG. 11D, the tip of the wire tail 82 linearly extending from the tip of the bonding tool 16 is inside the hole 76 of the lead clamper 75.

As the integer n, which has been 5, is incremented by 1 and set to 6, the control unit 30 calculates a bonding direction for the sixth bonding as in Step S103 of FIG. 4. The control unit 30 reads positions of the sixth pad 673 and the sixth lead 674 in the XY direction illustrated in FIG. 3 from the control data 38, and as illustrated in FIG. 10(b), calculates the direction for the sixth bonding for connecting the sixth pad 673 and the sixth lead 674 as the direction of the sixth straight line 96.

Figure 11E:
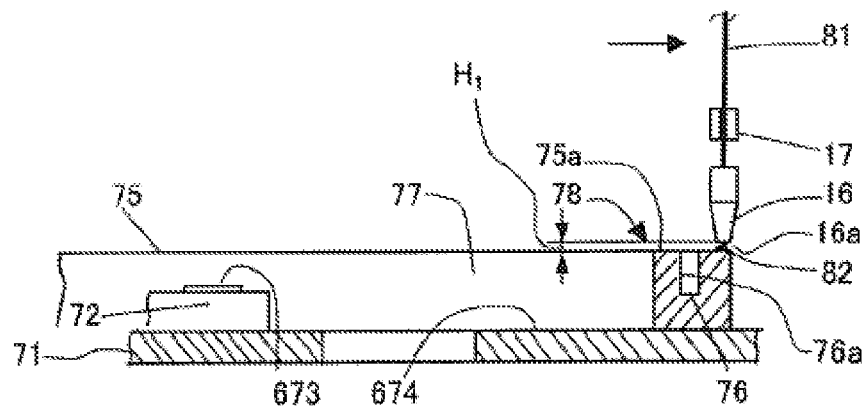
FIG. 11E is a diagram illustrating the wire folding operation of the wire bonding apparatus according to the one embodiment of the present invention.

As in Step S104 of FIG. 4, the control unit 30 outputs a command for performing a wire tail folding operation. Based on this command, a signal from the movement mechanism interface 44 is outputted to the XY table 20, and the XY table 20 moves the center of the bonding tool 16 horizontally, as illustrated in FIG. 11E and FIG. 10(a), to the side of the sixth lead 674 in the direction along the sixth straight line 96. As described previously with reference to FIG. 7A, this causes the wire tail 82 inside the hole 76 to be caught on the corner portion between the inner surface 76a of the hole 76 and the upper surface 75a of the lead clamper 75, and the wire tail 82 is flexed substantially at a right angle to the wire 81 inserted through the through hole 16b. Further, as illustrated in FIG. 10(a), the folded wire tail 82 faces in the direction along a line 96 toward the sixth pad 673.

Figure 11F:
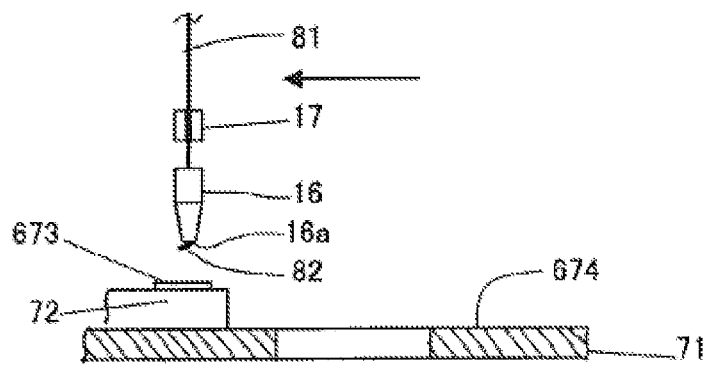
FIG. 11F is a diagram illustrating an operation of wedge bonding to a pad of a chip by the wire bonding apparatus according to the one embodiment of the present invention.

Upon completion of folding of the wire tail 82, as in Step S105 of FIG. 4, the control unit 30 outputs a command for moving the bonding tool 16 above the sixth pad 673, as the integer n is set to 6. Based on this command, a signal from the movement mechanism interface 44 is outputted to the XY table 20, and the XY table 20 moves the bonding head 19, as illustrated in FIG. 11F, so that the center of the bonding tool 16 comes immediately above the sixth pad 673.

Figure 11G:
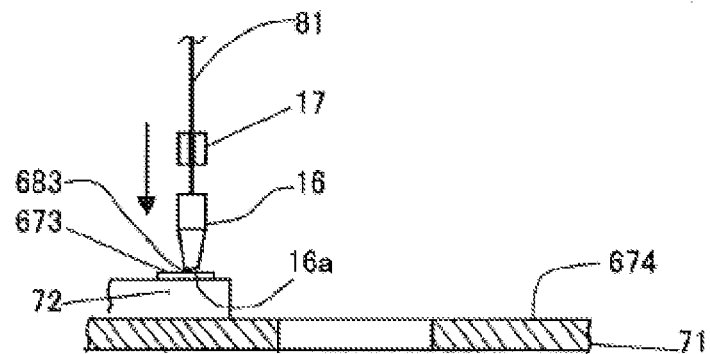
FIG. 11G is a diagram illustrating the operation of wedge bonding to the pad of the chip by the wire bonding apparatus according to the one embodiment of the present invention.

When the center of the bonding tool 16 comes immediately above the sixth pad 673, the control unit 30 outputs a command for performing bonding to the sixth pad 673, as in Step S106 of FIG. 4. Similarly to the previous description, based on this command, the tip of the bonding tool 16 is moved downward onto the sixth pad 673; then, as illustrated in FIG. 11G, a side of the wire tail 82 extending from the tip of the bonding tool 16 and folded in the direction along the sixth straight line 96 illustrated in FIG. 10(b) is pressed against the sixth pad 673 by the pressing surface 16a at the tip of the bonding tool 16, the ultrasonic transducer 15 is driven based on a signal from the ultrasonic transducer interface 43 to cause the bonding tool 16 to vibrate, and the wire tail 82 is bonded to the sixth pad 673 by wedge bonding. This bonding forms a first bond portion 683 on an upper surface of the sixth pad 673. The first bond portion 683 is formed by squashing the side of the wire tail 82 by the flat pressing surface 16a, and is an elliptic or circular thin plate. As the length of the wire tail 82 is slightly greater than the width of the annular pressing surface 16a, the length of the elliptic or circular first bond portion 683 is slightly greater than the width of the pressing surface 16a, which results in favorable wedge bonding. Then, as illustrated in FIG. 10(b), an end portion 683a that has not been formed into a thin plate remains on the side of the first bond portion 683 opposite from the sixth lead 674.

Figure 11H:
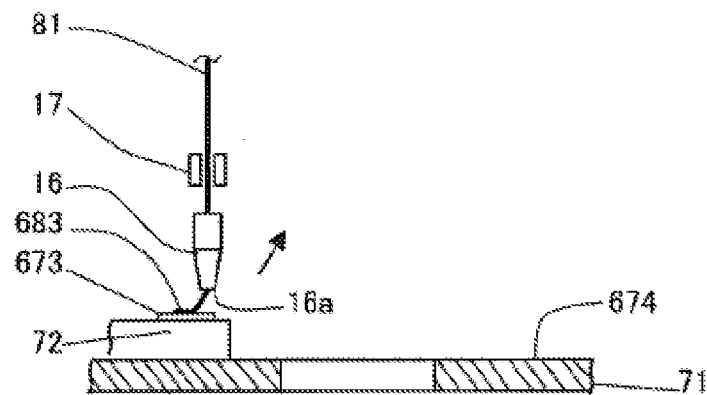
FIG. 11H is a diagram illustrating a rising operation of a bonding tool by the wire bonding apparatus according to the one embodiment of the present invention.

Upon completion of bonding of the wire tail 82 to the sixth pad 673, as in Step S107 of FIG. 4, the control unit 30 outputs a command for moving the bonding tool 16 upward. Similarly to the previous description, based on this command, the bonding head 19 and the XY table 20 are driven, and the center of the bonding tool 16 moves in the direction along the sixth straight line 96 illustrated in FIG. 10(b). Further, based on this command, the clamper 17 is opened. As illustrated in FIG. 11H, this causes the bonding tool 16 to move obliquely upward toward the direction along the sixth straight line 96 illustrated in FIG. 10(b).

Figure 11J:
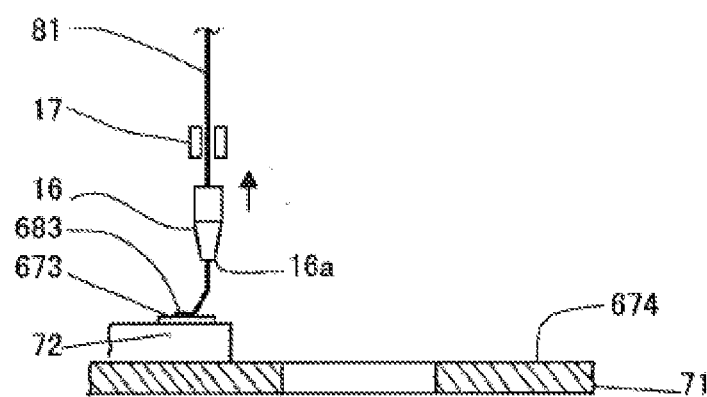
FIG. 11J is a diagram illustrating a looping operation from the pad of the chip to a lead of a substrate by the wire bonding apparatus according to the one embodiment of the present invention.
Figure 11K:
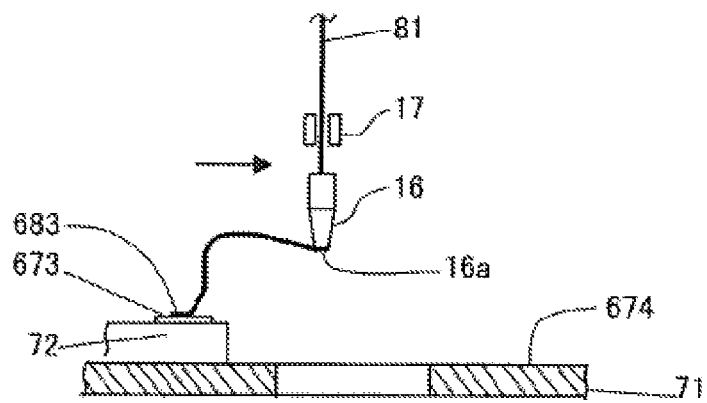
FIG. 11K is a diagram illustrating the looping operation from the pad of the chip to the lead of the substrate by the wire bonding apparatus according to the one embodiment of the present invention.

After moving the bonding tool 16 up to a predetermined height, the control unit 30 outputs a command for looping the bonding tool 16 toward the sixth lead 674 as in Step S108 of FIG. 4. Similarly to the previous description, based on this command, the clamper 17 is opened as illustrated in FIG. 11J, and the bonding head 19 is driven and the bonding tool 16 is moved upward by a predetermined distance. Subsequently, the tip of the bonding tool 16 moves along a shape of the loop as illustrated in FIG. 11K. By this operation, the center of the bonding tool 16 moves along the sixth straight line 96 illustrated in FIG. 10(b), from the sixth pad 673 toward the sixth lead 674.

Figure 11L:
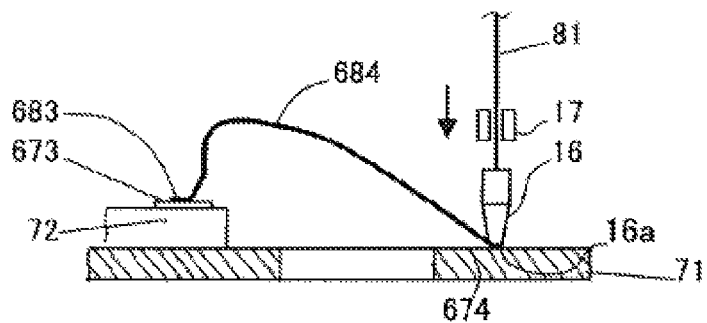
FIG. 11L is a diagram illustrating an operation of wedge bonding to the lead of the substrate by the wire bonding apparatus according to the one embodiment of the present invention.

Then, when the center of the bonding tool 16 comes immediately above the sixth lead 674, the control unit 30 outputs a command for performing bonding to the sixth lead 674, as in Step S109 of FIG. 4. Based on this command, as illustrated in FIG. 11L, the side of the wire 81 is bonded onto the sixth lead 674 by wedge bonding. This bonding forms a second bond portion 685 on an upper surface of the sixth lead 674. The second bond portion 685 is formed by squashing the side of the wire 81 that has been looped by the flat pressing surface 16a, and is an elliptic or circular thin plate similarly to the first bond portion 683. When the wire 81 is bonded to the sixth lead 674 by wedge bonding in this manner, the sixth pad 673 and the sixth lead 674 are connected with a sixth connecting wire 684 that is in a loop having a mountain-like profile as illustrated in FIG. 11L and is linear in the XY plane as illustrated in FIG. 10(b).

Upon completion of bonding to the sixth lead 674, the control unit 30 determines, as in Step S110 of FIG. 4, whether or not there is sixth bonding to be next performed. As illustrated in FIG. 3 and FIG. 10(b), as the seventh bonding is to be performed for connecting a seventh pad 773 and a seventh lead 774 in this embodiment, the control unit 30 calculates a bonding direction for the seventh bonding as in Steps S112-S115 of FIG. 4. As illustrated in FIG. 10(b), the sixth straight line 96 for the sixth bonding and a seventh straight line 98 which is the direction for the seventh bonding form an angle difference $\theta_6$, and as the angle difference $\theta_6$ is smaller than a predetermined angle difference, the control unit 30 moves the bonding tool 16 obliquely upward along the direction of a sixth wire tail pulling line 97 parallel to the direction of the seventh straight line illustrated in FIG. 10(b). Then, as in Steps S114-S115 of FIG. 4, after extending the wire tail 82 by a predetermined length, the control unit 30 closes the clamper 17 to cut the wire tail 82. Thereafter, the integer n is again incremented by 1 as in Step S116 of FIG. 4, and the process returns to Step S105 of FIG. 4 and the bonding is continued.

Then, as in Step S110 of FIG. 4, if the control unit 30 determines that bonding between all of the pads 73 and the leads 74 has been completed, and that no succeeding bonding is to be performed, the control unit 30 performs a bonding apparatus terminating operation, as in Step S117 of FIG. 4, by moving the bonding tool 16 upward while the clamper 17 is closed to cut the wire tail 82, by moving the center of the bonding tool 16 back to an initial position to terminate the wire bonding apparatus 10.

As described above, according to this embodiment, as each of the pads 73 and the corresponding lead 74 can be connected with the connecting wire 84 without rotating the bonding stage or the bonding tool by pressing the wire 81 or the side of the wire tail 82 to the pad 73 or the lead 74 to perform bonding by wedge bonding, it is possible to perform high-speed wedge bonding as compared to a bonding apparatus using a conventional wedge tool. In addition, the apparatus can be simplified, as it is not necessary to rotate the bonding stage or the bonding tool. Further, according to this embodiment, as the tip of the bonding tool is configured by the flat pressing surface 16a and the straight through hole 16b provided vertically with respect to the pressing surface 16a, and the corner portion between the through hole 16b and the pressing surface 16a is provided as a curved surface whose radius is significantly small, a flexed kink in the lateral direction is provided for the wire tail 82 with the corner portion when moving the bonding tool 16 obliquely upward after the bonding to the lead 74. Therefore, as it is not necessary to move the tip of the bonding tool 16 that has been temporarily moved upward in order to flex the wire tail 82 extending from the bonding tool 16 in the lateral direction downward so as to be brought into contact with the wire tail 82 as in the conventional technique, operational steps of the bonding tool 16 can be simplified. With this, it is possible to perform wedge bonding at higher speed. Moreover, according to this embodiment, if the angle difference between the previous bonding and the succeeding bonding is large, and it is not possible to cause to the wire tail 82 to be flexed in an appropriate direction by the movement of the bonding tool 16 after the bonding to the lead 74, the wire tail 82 can be folded on the folding station 78 that is additionally provided in a direction suited for the succeeding bonding; therefore, it is possible to perform wedge bonding successively even when the bonding direction changes largely, and to increase the speed of wedge bonding.

In the embodiment described above, the bonding tool 16 is described as a cylindrical shape having the through hole 16b, and the pressing surface 16a is annular; however, the shape of the cross-section of the bonding tool 16 is not limited to the cylindrical shape, and can be polygonal shape such as a square, or ellipsoidal. In addition, the through hole 16b is described as, but not limited to, a straight hole, and as long as a portion near the pressing surface 16a is straight, a portion above the hole can be configured as a tapered or stepped portion.

Figure 12:
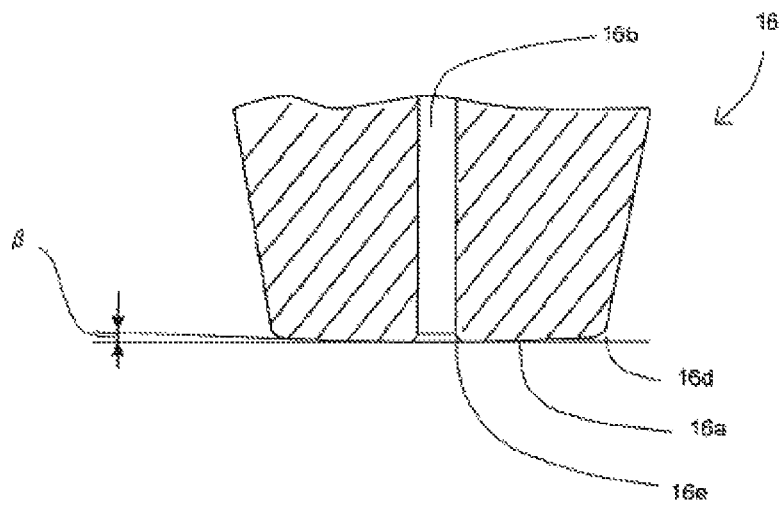
FIG. 12 is a diagram illustrating a tip portion of a bonding tool of the wire bonding apparatus according to a different embodiment of the present invention.

Furthermore, in this embodiment, the corner portion between the through hole 16b and the pressing surface 16a is described to have the curved surface whose radius is significantly small; however, as long as the flexed kink in the lateral direction is provided for the wire tail 82 when moving obliquely upward after the bonding to the lead 74, the corner portion can have, for example, a small chamfer 16e as illustrated in FIG. 12. Furthermore, as long as the pressing surface 16a is parallel to the surface of the pad 73 or the lead 74 when bonding and able to bond the wire 81 or the wire tail 82 in a thin plate, the pressing surface 16a can be configured as a mild curved surface, or can be a flat surface forming a slight angle β to a surface of the pad 73 or the lead 74 when bonding as illustrated in FIG. 12.

Further, according to this embodiment, it is described that in the wire tail folding operation, a difference in height between the pressing surface 16a of the bonding tool 16 and the upper surface 75a of the lead clamper 75 is the height $H_1$ that is slightly higher than the diameter of the wire 81; however, the height $H_1$ can be any height as long as the wire tail 82 linearly extending from the tip of the bonding tool 16 can be flexed in the lateral direction, and can be about a half of the length of the wire tail 82 whose tip is extending such that an angle to the pressing surface 16a is about 30 degrees, for example.

Figure 13A:
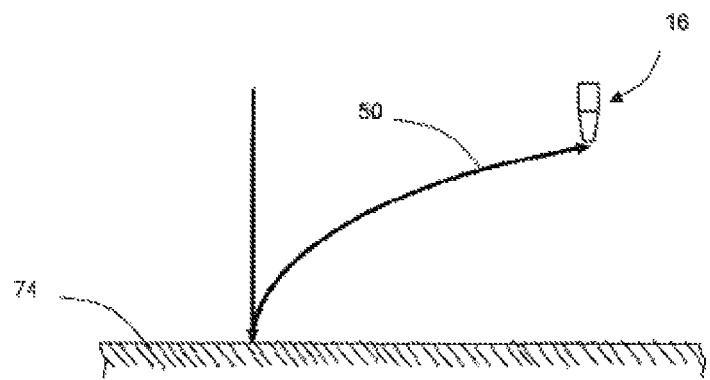
FIG. 13A is a diagram illustrating a rising trajectory of a bonding tool of the wire bonding apparatus according to a different embodiment of the present invention.
Figure 13B:
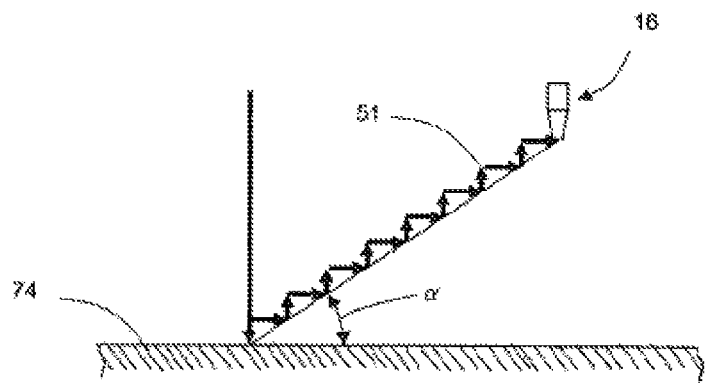
FIG. 13B is a diagram illustrating a rising trajectory of the bonding tool of the wire bonding apparatus according to the different embodiment of the present invention.

Moreover, according to this embodiment, it is described that in the wire tail extension step and the tail cut step, the bonding tool 16 is moved linearly and obliquely upward from the lead 74; however, the bonding tool 16 can be moved, as illustrated in FIG. 13A, along a bonding tool rising trajectory 50 directed obliquely upward in a curved manner, instead of linearly, or can be moved, as illustrated in FIG. 13B, along a bonding tool rising trajectory 51 directed obliquely upward in a stepped manner by repeating vertical upward movement and horizontal movement of the bonding tool. When moving the bonding tool 16 obliquely upward in a curved manner, the bonding tool 16 can be first moved vertically upward, and then in a circular arc such that the angle α gradually decreases. Further, when moving the bonding tool 16 in a stepped manner, the angle α between the pressing surface 16a of the bonding tool 16 and the wire tail 82 can be constant through the steps by maintaining amounts of the vertical upward movement and the horizontal movement of the bonding tool 16 unchanged through the steps, or the amounts of the vertical upward movement and the horizontal movement can change for each step. Alternatively, a proportion between the amounts of the vertical upward movement and the horizontal movement of the bonding tool 16 can be constant through the steps, or can change for each step.

Hereinafter, a different embodiment according to the present invention will be described with reference to FIG. 14A and FIG. 14B. Like components as in the embodiment described with reference to FIG. 1 to FIG. 11L are denoted by like reference numerals, and descriptions for these components shall be omitted.

In the embodiments described previously in the above, it is described that the bonding tool 16 is moved linearly and obliquely upward from the lead 74 to extend the wire tail 82 by a predetermined length obliquely downward from the bonding tool 16 in the wire tail extension step, the wire tail 82 is cut in the tail cut step, and then the succeeding bonding is performed; however, if the flexing angle α of the wire tail 82 to the pressing surface 16a of the bonding tool 16 is large, for example, if the angle α is 45 degrees or greater, there is a case in which favorable wedge bonding can not be performed because the cut surface, instead of the side, of the wire tail 82 is brought into contact with the surface of the next pad 73 when performing bonding to the next one of the pads 73, and the side of the wire tail 82 is not pressed against the next pad 73.

Figure 14A:
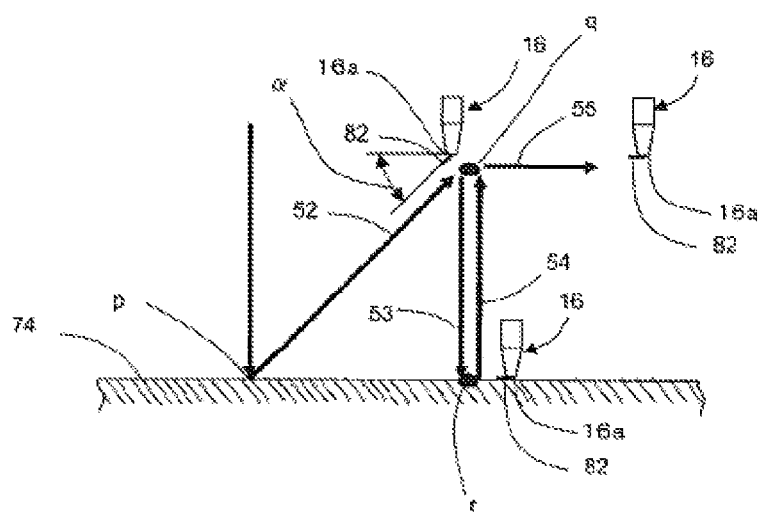
FIG. 14A is a diagram illustrating a trajectory of a bonding tool of the wire bonding apparatus according to a different embodiment of the present invention.

Thus, in this embodiment, as illustrated in FIG. 14A, after completing the wire tail extension step and the tail cut step, the wire tail 82 extending obliquely downward at the angle α from the tip of the bonding tool 16 is directed along the pressing surface 16a of the bonding tool 16 by pressing the tip of the bonding tool 16 lightly against the surface of the lead 74. It should be noted that, in this embodiment, the direction in which the tip of the bonding tool 16 moves in the XY plane (in the horizontal plane) is the same as in the embodiments previously described with reference to FIG. 1 to FIG. 11L.

As illustrated in FIG. 14A, after performing the bonding by pressing the bonding tool 16 to a point p on the lead 74, the tip of the bonding tool 16 is moved obliquely upward to a point q along a movement trajectory 52 illustrated in FIG. 14A, and the wire tail 82 is cut by a predetermined length in a state in which the wire tail 82 is extended from the bonding tool 16 at the angle α obliquely downward. Thereafter, the tip of the bonding tool 16 is moved downward from the point q to a point r as shown by a movement trajectory 53 in FIG. 14. Then, the tip of the bonding tool 16 is lightly pressed against the lead 74 to make the flexing angle α of the wire tail 82 substantially zero so that the wire tail 82 is directed along the pressing surface 16a of the bonding tool 16. Thereafter, the tip of the bonding tool 16 is moved upward from the point r to the point q as shown by a movement trajectory 54, and then to the next pad 73 as shown by a movement trajectory 55.

According to this embodiment, it is possible to perform the bonding to the next pad 73 by performing the movement to the next pad 73 in the state in which the wire tail 82 is flexed in the direction along the pressing surface 16a of the bonding tool 16; therefore, it is possible to ensure pressing of the side of the wire tail 82 against the pad 73 when performing the bonding to the next pad 73, and to provide favorable wedge bonding.

Figure 14B:
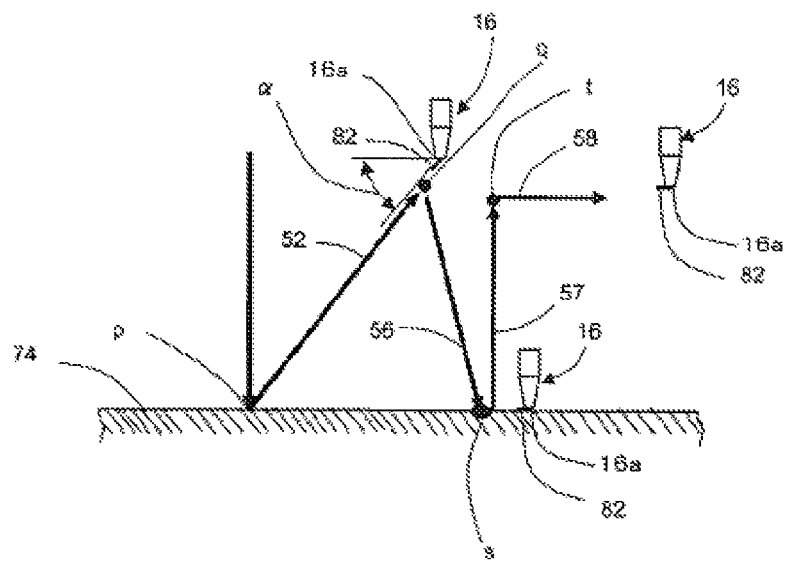
FIG. 14B is a diagram illustrating a trajectory of the bonding tool of the wire bonding apparatus according to the different embodiment of the present invention.

Further, if the flexing angle α of the wire tail 82 to the pressing surface 16a of the bonding tool 16 upon completion of the tail cut step is even greater, for example, if the angle α is 80 degrees or greater, as illustrated in FIG. 14B, it is possible to move the tip of the bonding tool 16 obliquely down toward the lead 74 from the point q to a point s as shown by a movement trajectory 56, to press the tip of the bonding tool 16 lightly on the lead 74, and to move the tip of the bonding tool 16 upward from the point s to a point t as shown by a movement trajectory 57, thereby performing the movement to the next pad 73 as shown by a movement trajectory 58. By moving the tip of the bonding tool 16 obliquely downward in this manner, it is possible to perform the movement to the next pad 73 after the wire tail 82 is flexed along the direction along the pressing surface 16a of the bonding tool 16 more definitely; therefore, it is possible to further ensure pressing of the side of the wire tail 82 against the pad 73 when performing the bonding to the next pad 73, and to provide more favorable wedge bonding. It should be noted that, also in this embodiment, the direction in which the tip of the bonding tool 16 moves in the XY plane (in the horizontal plane) is the same as in the embodiments previously described with reference to FIG. 1 to FIG. 11L.

Hereinafter, a different embodiment according to the present invention will be described with reference to FIG. 15A and FIG. 15B. Like components as in the embodiment described with reference to FIG. 1 to FIG. 11L are denoted by like reference numerals, and descriptions for these components shall be omitted.

Figure 15A:
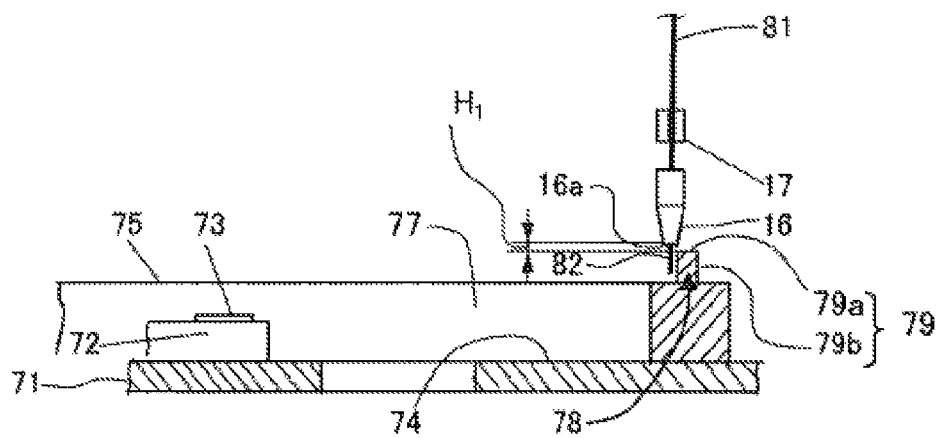
FIG. 15A is a diagram illustrating a wire folding operation by the wire bonding apparatus according to a different embodiment of the present invention.
Figure 15B:
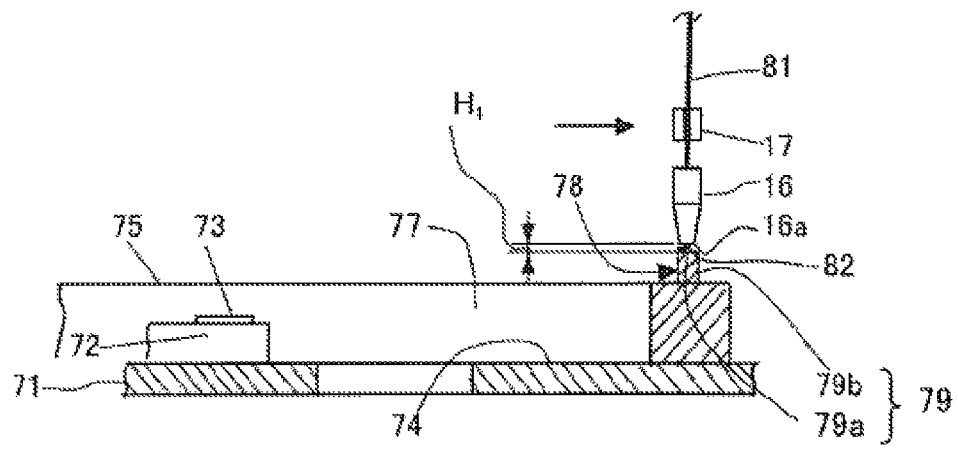
FIG. 15B is a diagram illustrating the wire folding operation by the wire bonding apparatus according to the different embodiment of the present invention.

According to the embodiment illustrated in FIG. 15A and FIG. 15B, the folding station 78 is configured as a projection 79 projecting from the surface of the lead clamper 75. As illustrated in FIG. 15A, the projection 79 is disposed at a position corresponding to the hole 76. Similarly to the hole 76, the projection 79 can be provided at each of four corners of the opening 77 in the lead clamper 75, total four in this case, or can be just one or more than one. The shape of the projection 79 can be cylindrical or polygonal. The projection 79 includes a substantially vertical side surface 79b and a substantially horizontal upper surface 79a, and the upper surface 79a and the side surface 79b constitute a stepped portion.

As illustrated in FIG. 15A, the control unit 30 drives the XY table to move the bonding tool 16, so that the wire tail 82 extending linearly from the tip of the bonding tool 16 comes to a position near the side surface 79b of the projection 79. Then, the control unit 30 drives the Z motor provided within the bonding head 19 to adjust the height of the bonding tool 16 so that a gap between the pressing surface 16a at the tip of the bonding tool 16 and the upper surface 79a of the projection 79 corresponds to the height $H_1$. The height $H_1$ is slightly higher than the diameter of the wire 81.

Then, as illustrated in FIG. 15B, the control unit 30 moves the bonding tool 16 horizontally, and causes the wire tail 82 extending from the tip of the bonding tool 16 to be flexed. The flexing direction and such of the wire tail 82 are the same as those in the embodiments described with reference to FIG. 1 to FIG. 11L.

This embodiment provides, in addition to the same effects as those of the previously described embodiments, an effect that it is possible to perform bonding at higher speed, as it is not necessary to move the bonding tool 16 downward so that the wire tail 82 temporarily comes into the hole 76 in order to flex the wire tail 82.

Hereinafter, a different embodiment according to the present invention will be described with reference to FIG. 16A to FIG. 16C. Like components as in the embodiment described with reference to FIG. 1 to FIG. 11L are denoted by like reference numerals, and descriptions for these components shall be omitted.

Figure 16A:
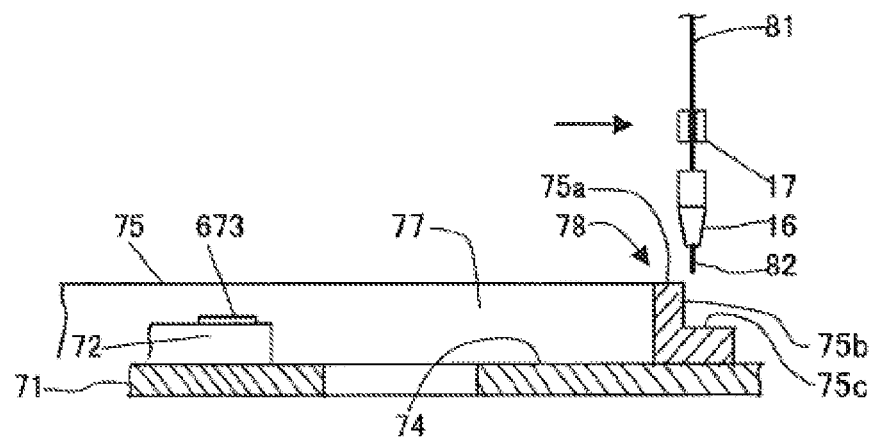
FIG. 16A is a diagram illustrating a wire folding operation by the wire bonding apparatus according to a different embodiment of the present invention.
Figure 16B:
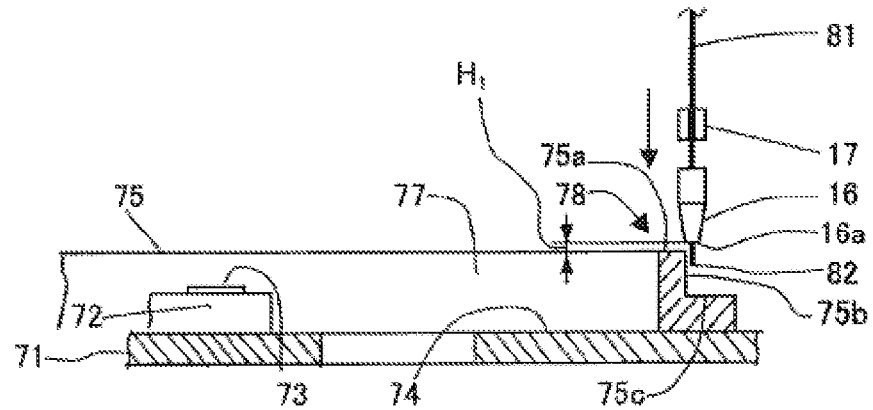
FIG. 16B is a diagram illustrating the wire folding operation by the wire bonding apparatus according to the different embodiment of the present invention.

As illustrated in FIG. 16A, according to this embodiment, the folding station 78 is configured as a stepped portion provided around the lead clamper 75. As illustrated in FIG. 16A, around the lead clamper 75, there is provided a periphery portion 75c that is lower than the upper surface 75a. The periphery portion 75c and the upper surface 75a are connected by a substantially vertical peripheral surface 75b. Thus, a stepped portion including the upper surface 75a and the peripheral surface 75b is formed. The periphery portion 75c can be provided all around or only a part of the lead clamper 75. In addition, the peripheral surface 75b can be a cylindrical surface having a central angle of 90 degrees disposed at each of the four corners, or can be a chamfer having a central angle of 45 degrees disposed at each of the four corners, for example.

As illustrated in FIG. 16A, the control unit 30 drives the XY table to move the position of the bonding tool 16 such that the wire tail 82 extending linearly from the tip of the bonding tool 16 comes to a position near the peripheral surface 75b. Then, as illustrated in FIG. 16B, the control unit 30 drives the Z motor provided within the bonding head 19 to adjust the height of the bonding tool 16 so that a gap between the pressing surface 16a at the tip of the bonding tool 16 and the upper surface 75a of the lead clamper 75 corresponds to the height $H_1$. The height $H_1$ is slightly higher than the diameter of the wire 81.

Figure 16C:
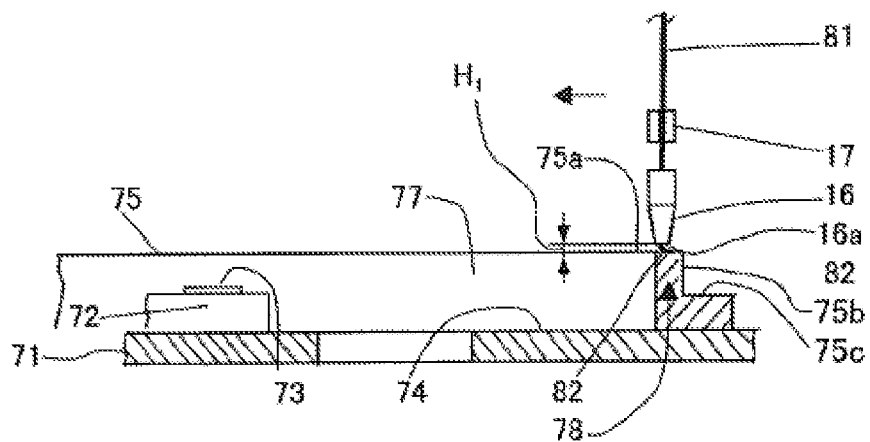
FIG. 16C is a diagram illustrating the wire folding operation by the wire bonding apparatus according to the different embodiment of the present invention.

Then, as illustrated in FIG. 16C, the control unit 30 moves the bonding tool 16 horizontally, and causes the wire tail 82 extending from the tip of the bonding tool 16 to be flexed. The flexing direction and such of the wire tail 82 are the same as those in the embodiments described with reference to FIG. 1 to FIG. 11L.

This embodiment provides the same effect as that of the previously described embodiment with reference to FIG. 15A and FIG. 15B.

Figure 17:
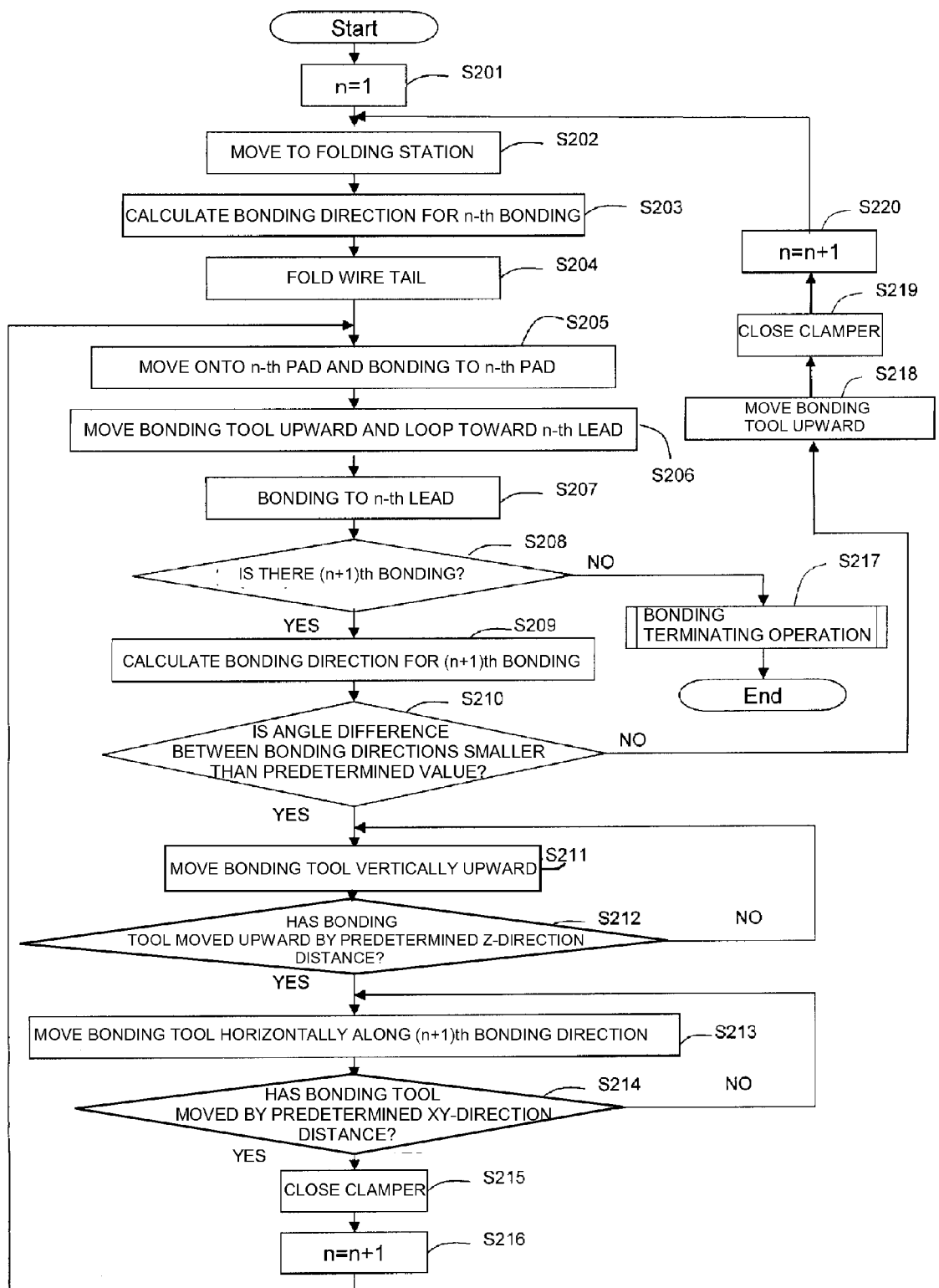
FIG. 17 is a flowchart showing an operation of the wire bonding apparatus according to a different embodiment of the present invention.

Next, a different embodiment according to the present invention will be described with reference to FIG. 17, FIG. 18A to FIG. 18C, and FIG. 19. Like components as in the embodiment described with reference to FIG. 1 to FIG. 11L are denoted by like reference numerals, and descriptions for these components shall be omitted. In the embodiment described with reference to FIG. 1 to FIG. 11L, it is described that in the wire tail extension step and the tail cut step, the bonding tool 16 is moved obliquely upward; however, in this embodiment, the bonding tool 16 is moved in the horizontal direction in the XY plane after moving vertically upward to extend the wire tail 82, and then the bonding tool 16 is further moved in the horizontal direction in the XY plane to cut the tail. In this embodiment, the steps from the starting up to the bonding to the first pad 173 in Steps S201-S205 of FIG. 17 are the same as those in the embodiment previously described with reference to Steps S101-S105 of FIG. 4 and FIG. 5A to FIG. 5E, and the steps from the looing to the first lead 174 to the bonding to the first lead 174 in Steps S206-S207 of FIG. 17 are the same as those in the embodiment previously described with reference to Steps S106-S109 of FIG. 4 and FIG. 5F to FIG. 5J. Further, the steps of calculating the direction for the second bonding in Steps S208-S210 of FIG. 17 are the same as those in the embodiment described previously with reference to Steps S110-S112 of FIG. 4, and FIG. 6(a) and FIG. 6(b).

Figure 18A:
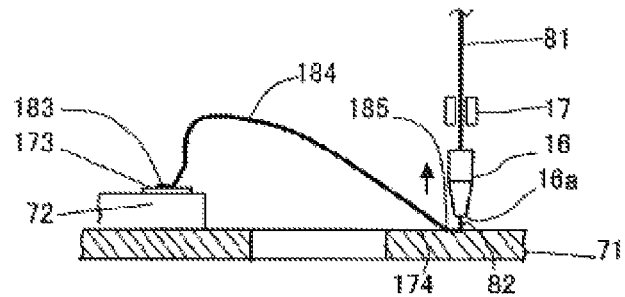
FIG. 18A is a diagram illustrating an operation of extending a wire tail by the wire bonding apparatus according to the different embodiment of the present invention.

As in Step S211 of FIG. 17, the control unit 30 outputs a command for moving the bonding tool 16 vertically upward if the angle difference $\theta_1$ is smaller than a predetermined angle difference. Based on this command, a signal from the movement mechanism interface 44 is outputted to the bonding head 19, the Z motor provided within the bonding head 19 is driven to rotate the bonding arm 13, and the bonding tool 16 is moved upward as illustrated in FIG. 18A. As in Step S212 of FIG. 17, the control unit 30 compares the Z direction moving distance $H_{11}$ illustrated in FIG. 19 obtained from the bonding tool height detector 29 illustrated in FIG. 1 with a predetermined Z-direction distance $H_s$, and moves the bonding tool 16 vertically up to the predetermined Z-direction distance $H_s$. Then, when the height of the bonding tool 16 is moved vertically upward by the predetermined Z-direction distance $H_s$ as shown by an upward thick arrow from a state indicated by alternate long and short dash lines in FIG. 19 to a state indicated by dashed lines in FIG. 19, the control unit 30 stops moving the bonding tool 16 upward, and the process moves to Step S213 of FIG. 17.

Figure 18B:
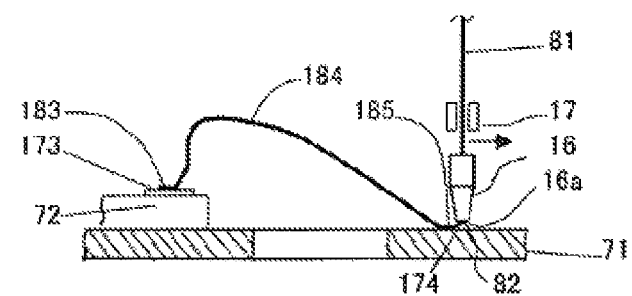
FIG. 18B is a diagram illustrating the operation of extending the wire tail by the wire bonding apparatus according to the different embodiment of the present invention.

As in Step S213 of FIG. 17, as the integer n is set to 1, the control unit 30 outputs a command for moving the bonding tool 16 horizontally in the XY plane along the direction of the first wire tail pulling line 92 illustrated in FIG. 6(b) parallel to the direction along the second straight line 93, which is the direction for the second bonding for connecting the second pad 273 and the second lead 274. Based on this command, a signal from the movement mechanism interface 44 illustrated in FIG. 1 is outputted to the XY table 20, and the XY table 20 is driven. By this operation, the tip of the bonding tool 16 moves horizontally in the XY plane as illustrated in FIG. 18B toward the direction along the first wire tail pulling line 92 illustrated in FIG. 6 (b) from the surface of the first lead 174. When the tip of the bonding tool 16 moves horizontally in the XY plane, the extended wire tail 82 is pressed laterally by the corner portion 16c between the through hole 16b and the pressing surface 16a of the bonding tool 16 and formed into a flexed shape.

The control unit 30 compares the XY direction moving distance $L_{11}$ obtained from the XY table 20 illustrated in FIG. 1 with a the predetermined XY-direction distance $L_s$, and moves the bonding tool 16 horizontally toward the direction along the first wire tail pulling line 92 illustrated in FIG. 6(b) by the predetermined XY-direction distance $L_s$. Then, when the bonding tool 16 is moved horizontally as shown by a lateral thick arrow from a state indicated by dashed lines in FIG. 19 to a state indicated by solid lines in FIG. 19, and the XY direction moving distance $L_{11}$ of the bonding tool 16 becomes the predetermined XY-direction distance $L_s$, the control unit 30 stops the horizontal movement of the bonding tool 16.

Figure 19:
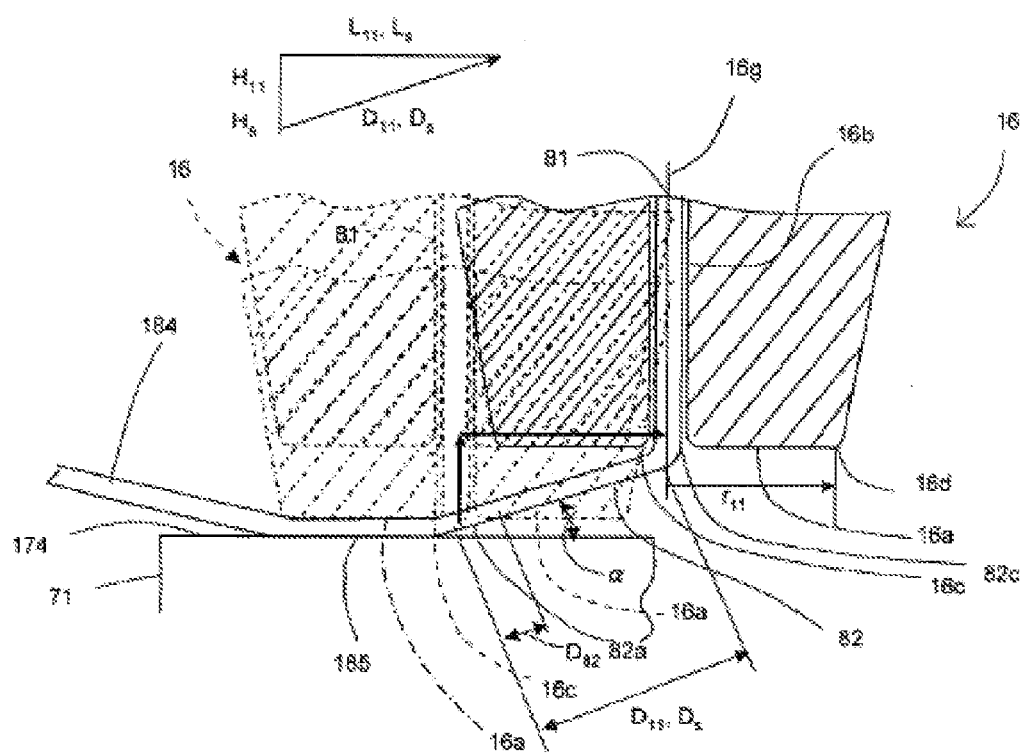
FIG. 19 is a diagram illustrating the operation of extending the wire tail by the wire bonding apparatus according to the different embodiment of the present invention.

As illustrated in FIG. 19, upon completion of the vertical upward movement and the horizontal movement in the XY plane of the bonding tool 16, the tip of the bonding tool 16 is positioned, as illustrated in FIG. 19, distant from the end portion of the second bond portion 185 by the distance $H_s$ in the Z direction and the distance $L_s$ in the XY direction. The wire tail 82 is extended obliquely downward from the tip of the bonding tool 16 by the length $D_s$. The angle of the wire tail 82 with respect to the pressing surface 16a of the bonding tool 16 is the angle α (wire tail extension step).

Here, the angle α between the extension length $D_s$ of the wire tail 82 and the pressing surface 16a of the bonding tool 16 is determined based on the Z-direction distance $H_s$ and the XY-direction distance $L_s$ by which the tip of the bonding tool 16 has moved. Specifically, the extension length $D_s$ of the wire tail $82 = \sqrt{(H_s^2 + L_s^2)}$, and the angle $\alpha = \tan^{-1}(H_s/L_s)$. Similarly to the previously described embodiments, the extension length $D_s$ of the wire tail 82 is required to be longer than the width of the annular pressing surface 16a of the bonding tool 16 or the external radius $r_{11}$ of the pressing surface 16a by the length $D_{82}$ of the projecting portion 82a, so that in the succeeding bonding, the wire tail 82 can be formed into a thin plate by being pressed against the pad 73 by an entire surface of the annular pressing surface 16*a* of the bonding tool 16 and bonded by wedge bonding.

Further, the flexing angle α of the wire tail 82 to the pressing surface 16*a* of the bonding tool 16 is required to be an angle at which in the succeeding bonding, the wire tail 82 extending obliquely downward from the bonding tool 16 can be smoothly flexed toward the pressing surface 16*a* by the downward movement of the bonding tool 16, and can be, for example, on the order of 5 degrees to 50 degrees or on the order of 10 degrees to 45 degrees, and preferably on the order of 30 degrees to 45 degrees. The angle α can be freely selected based on a condition such as a diameter or a material of the wire 81 to be bonded.

Therefore, according to the flexing angle α of the wire tail 82 freely selected based on a condition such as the diameter or the material of the wire 81 to be bonded to the pressing surface 16*a* of the bonding tool 16, the control unit 30 sets the Z-direction distance $H_s$ and the XY-direction distance $L_s$ by which the tip of the bonding tool 16 moves respectively from $H_s = D_s \times \sin(\alpha)$ and $L_s = D_s \times \cos(\alpha)$, and performs the operation of Steps S211-S214 of FIG. 17.

Figure 18C:
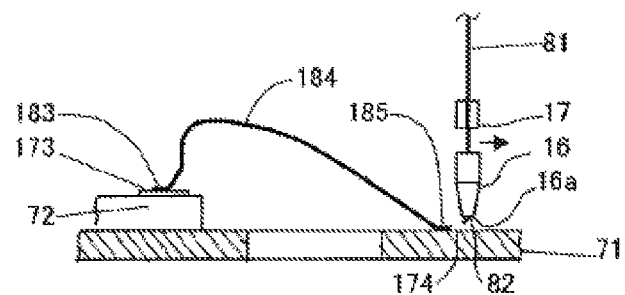
FIG. 18C is a diagram illustrating a tail-cut operation by the wire bonding apparatus according to the different embodiment of the present invention.

The control unit 30 moves the tip of the bonding tool 16 from the end portion of the second bond portion 185 by the distance $H_s$ in the Z direction and the distance $L_s$ in the XY direction, and outputs a command for closing the clamper 17 as in Step S215 of FIG. 17, when the extension length of the wire tail 82 becomes the length $D_s$. Based on this command, a signal from the clamper open-close mechanism interface 41 is outputted to the clamper open-close mechanism 27, and the clamper 17 is closed by the clamper open-close mechanism 27. Then, as the bonding tool 16 continues to move horizontally in the XY plane as illustrated in FIG. 18C, the wire tail 82 is cut at the boundary surface between the first lead 174 and the second bond portion 185 where the strength is lowest, and the wire tail 82 is separated from the first lead 174 (tail cut step). Even after the wire tail 82 is cut, as plastic deformation of a flexing portion 82*c* of the wire tail 82 shown in FIG. 19 occurs, the flexing angle α obliquely downward from the pressing surface 16*a* of the bonding tool 16 is maintained. Further, as illustrated in FIG. 6(*b*), the wire tail 82 extending from the bonding tool 16 in the XY plane is directed along the first wire tail pulling line 92 parallel to the second straight line 93 as the second bonding direction.

Upon cutting of the wire tail 82, the control unit 30 increments the integer n by 1 as in Step S216 of FIG. 17 and the process returns to Step S205 of FIG. 17, and similarly to the previously described embodiments, the control unit 30 continues the bonding operation after the second bonding.

The embodiment described above provides the same effect as that of the previously described embodiment with reference to FIG. 1 through FIG. 11L. Further, according to this embodiment, the bonding tool 16 is moved horizontally in the XY plane after moving upward in the Z direction; therefore, it is possible to simplify the operation of the bonding tool 16 as well as the configuration of the movement mechanism 18 for the Z direction and the XY direction of the wire bonding apparatus 10.

A different embodiment according to the present invention will be described with reference to FIG. 20 through FIG. 22. According to the embodiment that has been described with reference to FIG. 1 through FIG. 11L, it is described that the bonding is performed from the pad 73 of the chip 72 to the lead 74 of the substrate 71 as a lead frame; however, by contraries in this embodiment, so-called reverse bonding is performed from the lead 74 of the substrate 71 to the pad 73 of the chip 72. In this embodiment, first, the first lead 174 and the first pad 173 at upper right positions of the chip 72 illustrated in FIG. 3 are connected with the first connecting wire 184 (first bonding), and then the second lead 274 on the left side of the first lead 174 is connected to the second pad 273 on the left side of the first pad 173 with the second connecting wire 284 (second bonding). Similarly, each of the leads 74 and corresponding one of the pads 73 are then sequentially connected in a counterclockwise direction as shown by the arrow in FIG. 3 (n-th bonding, where n is an integer). The bonding is completed upon going around all of the leads 74 and the pads 73 in a counterclockwise direction.

Similarly to the embodiment that has been previously described with reference to FIG. 1 through FIG. 11L, the control unit 30 reads the control program 37, the wire tail extension program 34, the tail-cut program 35, the wire tail folding program 36, the bonding direction calculation program 33, and the control data 38 that are stored in the storage unit 32, and stores them in an internal memory. Similarly to the embodiment that has been previously described, as illustrated in FIG. 21A, in the initial state, the wire tail 82 linearly extends from the pressing surface 16*a* at the tip of the bonding tool 16 by the extension length $D_s$, and the clamper 17 is closed. The extension length $D_s$ of the wire tail 82 is longer than the width of the annular pressing surface 16*a* of the bonding tool 16 or the external radius $r_{11}$ of the pressing surface 16*a* by the length $D_{82}$ of the projecting portion 82*a*. Then, as in Step S301 of FIG. 20, the control unit 30 initializes the integer n to 1. When the integer n is 1, the first lead 174, the first pad 173, the second lead 274, and the second pad 273 respectively correspond to the previous first bonding point, the previous second bonding point, the succeeding first bonding point, and the succeeding second bonding point defined in the appended claims.

Figure 20:
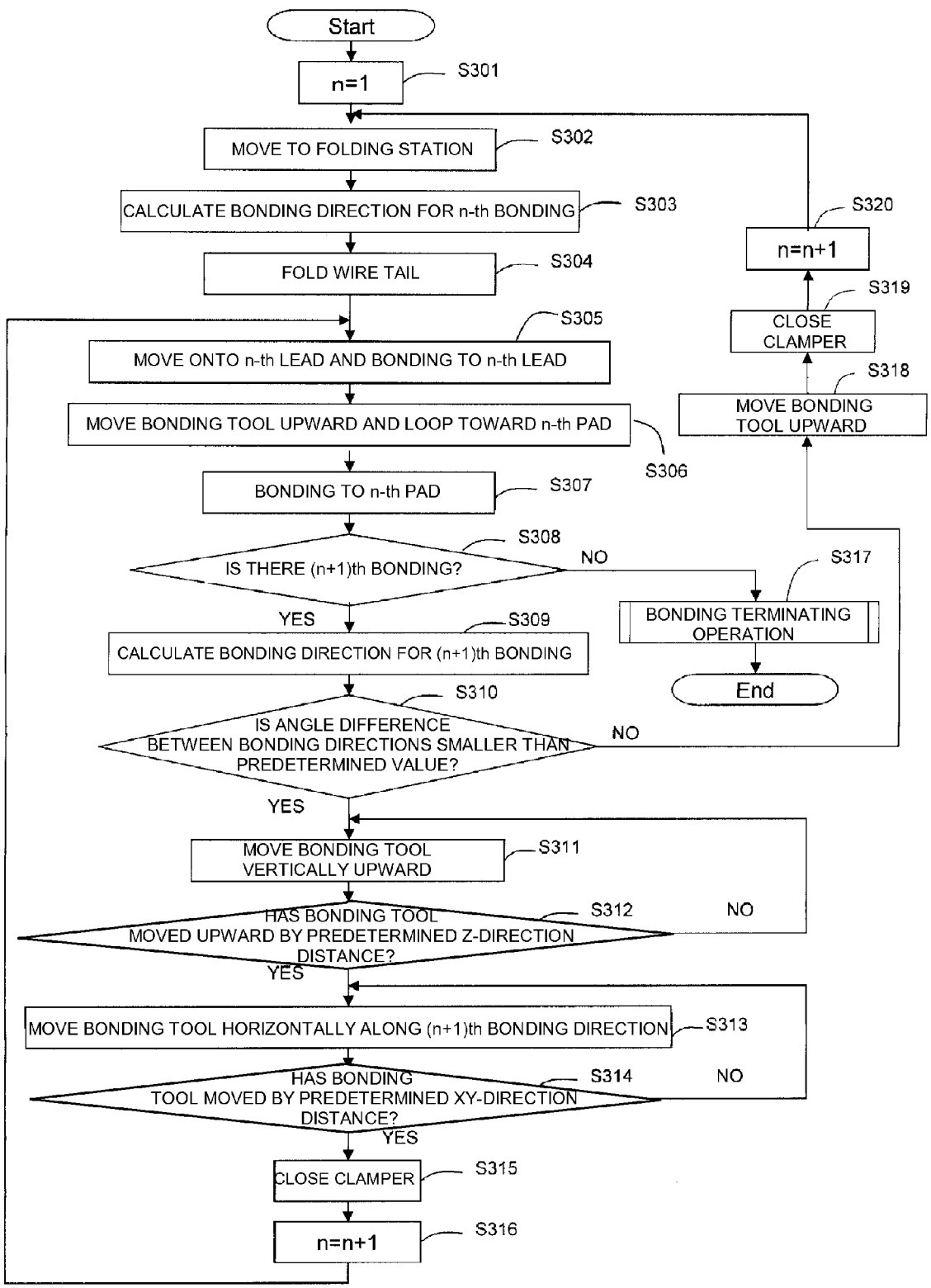
FIG. 20 is a flowchart showing an operation of the wire bonding apparatus according to a different embodiment of the present invention.
Figure 21A:
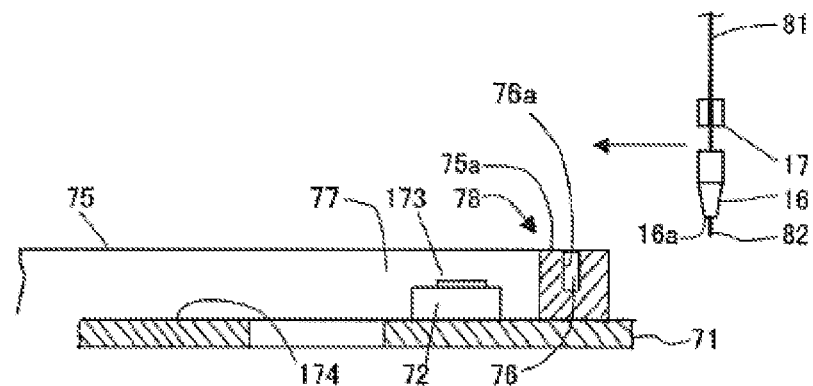
FIG. 21A is a diagram illustrating a wire folding operation by the wire bonding apparatus according to the different embodiment of the present invention.
Figure 21B:
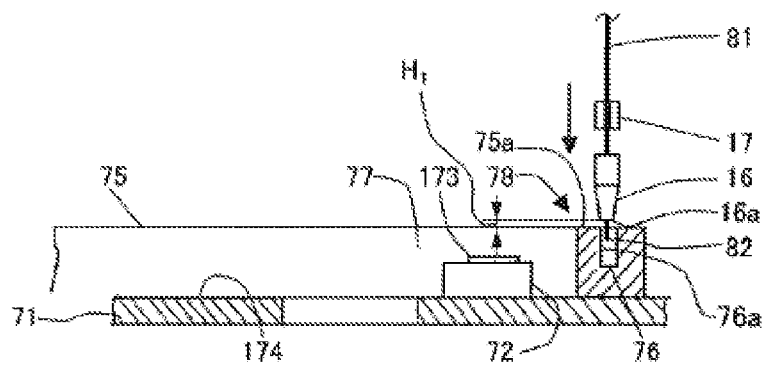
FIG. 21B is a diagram illustrating the wire folding operation by the wire bonding apparatus according to the different embodiment of the present invention.

As in Step S302 of FIG. 20, the control unit 30 moves the bonding tool 16 to the folding station 78. Then, when the bonding tool 16 comes immediately above the hole 76 as illustrated in FIG. 21B, the control unit 30 moves the pressing surface 16*a* at the tip of the bonding tool 16 down to a position higher than the upper surface 75*a* of the lead clamper 75 by the height $H_1$. The height $H_1$ is slightly greater than the diameter of the wire 81. When the pressing surface 16*a* of the bonding tool 16 is moved down to the height $H_1$, the tip of the wire tail 82 linearly extending from the tip of the bonding tool 16 is inside the hole 76 of the lead clamper 75.

As in Step S303 of FIG. 20, as the integer n is set to 1, the control unit 30 calculates a bonding direction for the first bonding for connecting the first lead 174 and the first pad 173 that are to be first connected. The control unit 30 reads positions of the first lead 174 and the first pad 173 in the XY direction illustrated in FIG. 3 from the control data 38, and as illustrated in FIG. 22(*b*), calculates the direction for the first bonding for connecting the first lead 174 and the first pad 173 as the direction of the first straight line 91.

Figure 21C:
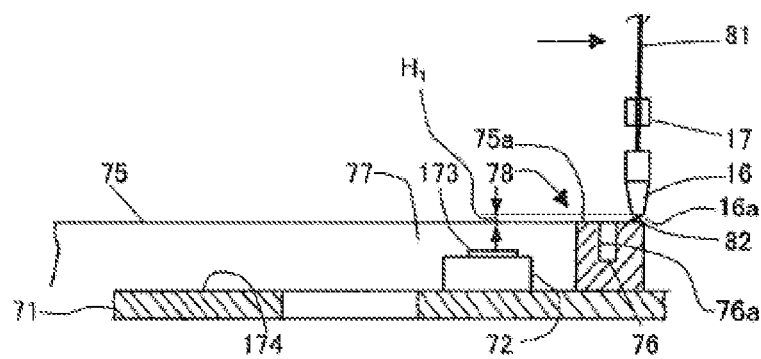
FIG. 21C is a diagram illustrating the wire folding operation by the wire bonding apparatus according to the different embodiment of the present invention.

As in Step S304 of FIG. 20, the control unit 30 moves the center of the bonding tool 16 horizontally, as illustrated in FIG. 21C and FIG. 22(*a*), from the first lead 174 to the side of the first pad 173 in the direction along the first straight line 91, and then causes the wire tail 82 inside the hole 76 to be caught on a corner portion between the inner surface 76*a* of the hole 76 and the upper surface 75*a* of the lead clamper 75 and flexed laterally. Further, as illustrated in FIG. 22(*a*), the tip of the flexed wire tail 82 is directed along the line 91 toward the first lead 174. In the initial state, the wire tail 82 extends linearly from the pressing surface 16*a* at the tip of the bonding tool 16 by the extension length $D_s$, and the extension length $D_s$ of the wire tail 82 is longer than the width of the annular pressing surface 16*a* of the bonding tool 16 or the external radius $r_{11}$ of the pressing surface 16a by the length $D_{82}$ of the projecting portion 82a. Accordingly, as illustrated in FIG. 22(a), the tip of the wire tail 82 flexed in the direction along the pressing surface 16a projects outwardly from the pressing surface 16a of the bonding tool 16 by the length $D_{82}$ of the projecting portion 82a.

Figure 21D:
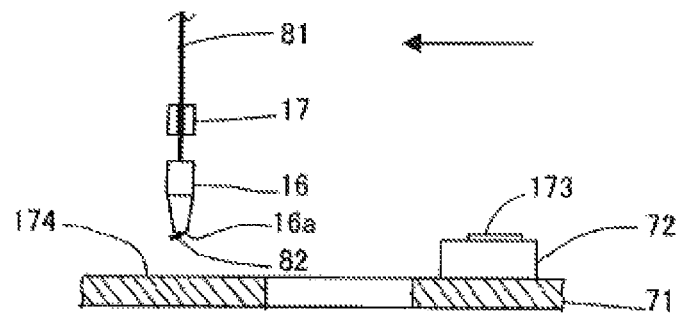
FIG. 21D is a diagram illustrating an operation of wedge bonding to a lead of a substrate by the wire bonding apparatus according to the different embodiment of the present invention.
Figure 21E:
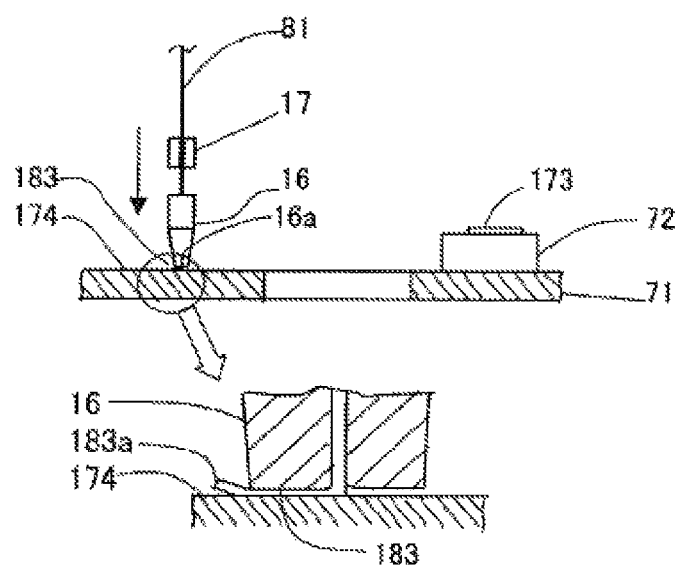
FIG. 21E is a diagram illustrating an operation of wedge bonding to the lead of the substrate by the wire bonding apparatus according to the different embodiment of the present invention.

Upon completion of folding of the wire tail 82, as the integer n is set to 1, the control unit 30 moves the center of the bonding tool 16 immediately above the first lead 174 as in Step S305 of FIG. 20 and as illustrated in FIG. 21D, and moves the tip of the bonding tool 16 down onto the first lead 174; then, as illustrated in FIG. 21E, the control unit 30 presses the side of the wire tail 82 extending from the tip of the bonding tool 16 and folded in the direction along the first straight line 91 illustrated in FIG. 22(b) against the first lead 174 by the pressing surface 16a at the tip of the bonding tool 16, drives the ultrasonic transducer 15 to cause the bonding tool 16 to vibrate, and bonds the wire tail 82 to the first lead 174 by wedge bonding. This bonding forms the first bond portion 183 on the upper surface of the first lead 174. The first bond portion 183 is formed by squashing the side of the wire tail 82 by the flat pressing surface 16a, and is an elliptic or circular thin plate as illustrated in FIG. 22(b) and FIG. 21E. Similarly to the embodiment previously described with reference to FIG. 8A, as the length of the wire tail 82 is longer than the width of the annular pressing surface 16a of the bonding tool 16 or the external radius $r_{11}$ of the pressing surface 16a by the length $D_{82}$ of the projecting portion 82a, the length of the elliptic or circular first bond portion 183 is slightly greater than the width of the pressing surface 16a, which results in favorable wedge bonding. Then, as illustrated in FIG. 21E and FIG. 22(b), the projecting portion 82a that has not been formed into a thin plate remains as an end portion 183a on the side of the first bond portion 183 opposite from the first pad 173.

Figure 21F:
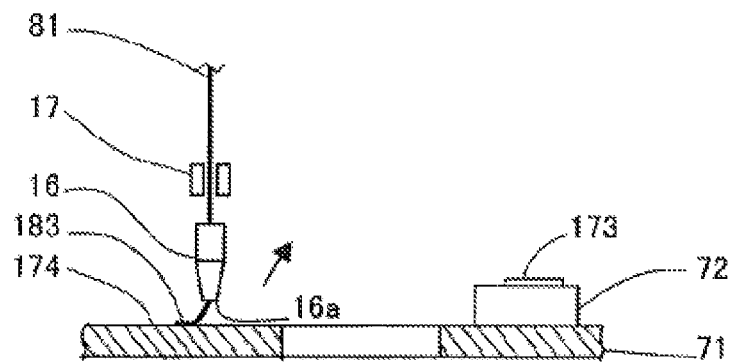
FIG. 21F is a diagram illustrating a rising operation of a bonding tool by the wire bonding apparatus according to the different embodiment of the present invention.
Figure 21G:
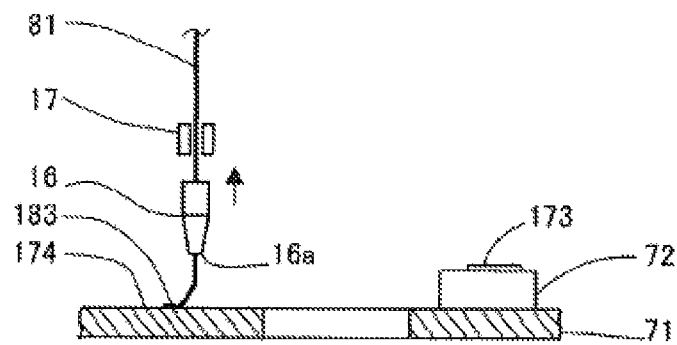
FIG. 21G is a diagram illustrating a looping operation from the lead of the substrate to a pad of a chip by the wire bonding apparatus according to the different embodiment of the present invention.
Figure 21H:
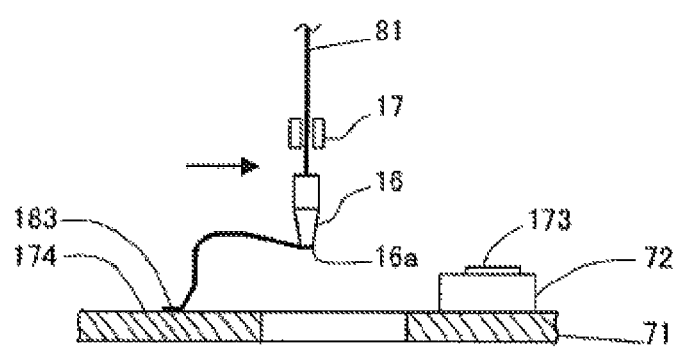
FIG. 21H is a diagram illustrating the looping operation from the lead of the substrate to the pad of the chip by the wire bonding apparatus according to the different embodiment of the present invention.

Upon completion of connection of the wire tail 82 to the first lead 174, as in Step S306 of FIG. 20, the control unit 30 moves the center of the bonding tool 16 in the direction along the first straight line 91 illustrated in FIG. 22(b), and opens the clamper 17. As illustrated in FIG. 21F, this causes the bonding tool 16 to move obliquely upward toward the direction along the first straight line 91 illustrated in FIG. 22(b). Then, the control unit 30 moves the bonding tool 16 vertically upward as illustrated in FIG. 21G, and then causes the bonding tool 16 to loop toward the first pad 173 as illustrated in FIG. 21H.

Figure 21J:
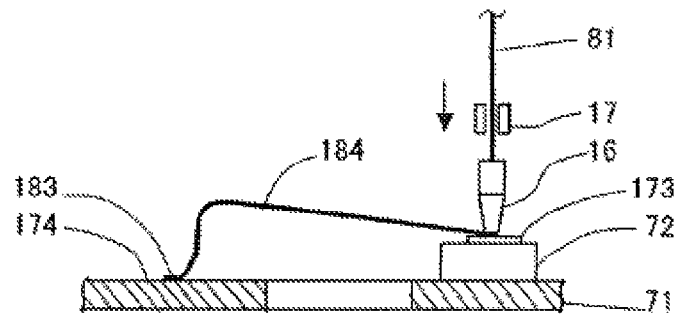
FIG. 21J is a diagram illustrating an operation of wedge bonding to the pad of the chip by the wire bonding apparatus according to the different embodiment of the present invention.
Figure 21K:
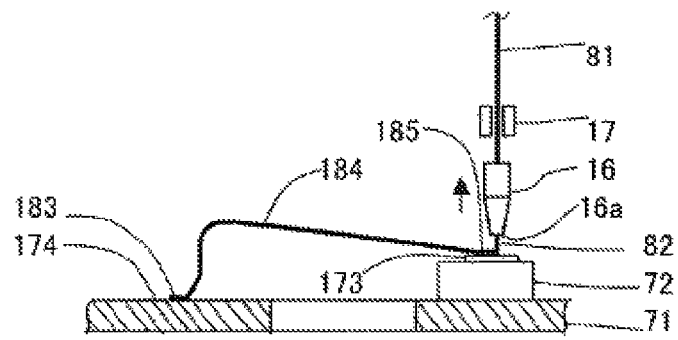
FIG. 21K is a diagram illustrating an operation of extending a wire tail by the wire bonding apparatus according to the different embodiment of the present invention.

Thereafter, when the center of the bonding tool 16 comes immediately above the first pad 173, as in Step S307 of FIG. 20 and as illustrated in FIG. 21J, the control unit 30 presses the side of the wire 81 extending from the tip of the bonding tool 16 against the first pad 173 by the pressing surface 16a at the tip of the bonding tool 16, drives the ultrasonic transducer 15 to cause the bonding tool 16 to vibrate, and bonds the side of the wire 81 to the first pad 173 by wedge bonding. This bonding forms the second bond portion 185 on the upper surface of the first pad 173. The second bond portion 185 is formed by squashing the side of the wire 81 that has been looped by the flat pressing surface 16a, and is an elliptic or circular thin plate similarly to the first bond portion 183. When the wire 81 is bonded to the first pad 173 by wedge bonding in this manner, the first lead 174 and the first pad 173 are connected with the first connecting wire 184 that is in a loop having a mountain-like profile as illustrated in FIG. 21K and linearly extending along the first straight line 91 in the XY plane as illustrated in FIG. 22 (b).

Upon completion of bonding to the first pad 173, the control unit 30 determines, as in Step S308 of FIG. 20, whether or not there are the pad 73 or the lead 74 that are to be bonded next. As the integer n is set to 1, (n+1) is 2, and the second bonding is to be performed for connecting the second lead 274 and the second pad 273 in this embodiment, the control unit 30 determines that there is (n+1)th bonding as in Step S308 of FIG. 20, and moves to Step S309 of FIG. 20 to calculate a bonding direction for the second bonding for connecting the second lead 274 and the second pad 273 that are to be next connected. The control unit 30 reads positions of the second lead 274 and the second pad 273 in the XY direction illustrated in FIG. 3 from the control data 38, and as illustrated in FIG. 22(b), calculates the direction for the second bonding for connecting the second lead 274 and the second pad 273 as a direction of the second straight line 93.

Then, as in Step S310 of FIG. 20, the control unit 30 calculates the angle difference $\theta_1$ between the second straight line 93 and the first straight line 91 illustrated in FIG. 22(b), and compares the angle difference $\theta_1$ with a predetermined angle. Here, the predetermined angle can be on the order of 90 degrees, for example, at which the bonding tool 16 or the extended wire tail 82 can not interfere with the connecting wire 184 that has been bonded immediately previously when extending the wire tail 82, or can be on the order of 30 degrees or 45 degrees, for example, at which a fracture can not occur between the extended wire tail 82 and the second bond portion 185 bonded to the first pad 173.

As in Step S311 of FIG. 20, the control unit 30 outputs a command for moving the bonding tool 16 vertically upward if the angle difference $\theta_1$ is smaller than the predetermined angle difference. Based on this command, a signal from the movement mechanism interface 44 is outputted to the bonding head 19, the Z motor provided within the bonding head 19 is driven to rotate the bonding arm 13, and the bonding tool 16 is moved upward as illustrated in FIG. 21K. Similarly to the embodiment previously described with reference to FIG. 19, as in Step S312 of FIG. 20, the control unit 30 compares the Z direction moving distance $H_{11}$ obtained from the bonding tool height detector 29 illustrated in FIG. 1 with the predetermined Z-direction distance $H_s$, and moves the bonding tool 16 vertically up to the predetermined Z-direction distance $H_s$. Then, when the height of the bonding tool 16 is moved vertically upward by the predetermined Z-direction distance $H_s$, the control unit 30 stops moving the bonding tool 16 upward, and the process moves to Step S313 of FIG. 20.

Figure 21L:
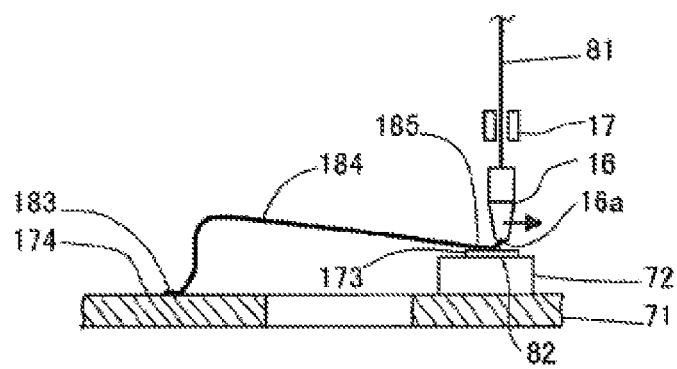
FIG. 21L is a diagram illustrating the operation of extending the wire tail by the wire bonding apparatus according to the different embodiment of the present invention.

As in Step S313 of FIG. 20, as the integer n is set to 1, the control unit 30 outputs a command for moving the bonding tool 16 horizontally in the XY plane along the direction of the first wire tail pulling line 92 illustrated in FIG. 22(b) parallel to the direction along the second straight line 93, which is the direction for the second bonding for connecting the second lead 274 and the second pad 273. Based on this command, a signal from the movement mechanism interface 44 illustrated in FIG. 1 is outputted to the XY table 20, and the XY table 20 is driven. By this operation, the tip of the bonding tool 16 moves horizontally in the XY plane as illustrated in FIG. 21L toward the direction along the first wire tail pulling line 92 illustrated in FIG. 22 (b) from the surface of the first pad 173. When the tip of the bonding tool 16 moves horizontally in the XY plane, the extended wire tail 82 is pressed laterally by the corner portion 16c between the through hole 16b and the pressing surface 16a of the bonding tool 16 and formed into a flexed shape.

Similarly to the embodiment described with reference to FIG. 19, the control unit 30 compares the XY direction moving distance $L_{11}$ obtained from the XY table 20 illustrated in FIG. 1 with a the predetermined XY-direction distance $L_s$, and moves the bonding tool 16 horizontally toward the direction along the first wire tail pulling line 92 illustrated in FIG.

22(b) by the predetermined XY-direction distance $L_s$. Then, when the bonding tool 16 is moved horizontally, and the XY direction moving distance $L_{11}$ of the bonding tool 16 becomes the predetermined XY-direction distance $L_s$, the control unit 30 stops the horizontal movement of the bonding tool 16.

Similarly to the embodiment described with reference to FIG. 19, upon completion of the vertical upward movement and the horizontal movement in the XY plane of the bonding tool 16, the tip of the bonding tool 16 is positioned distant from the end portion of the second bond portion 185 on the first pad 173 by the distance $H_s$ in the Z direction and the distance $L_s$ in the XY direction. The wire tail 82 is extended obliquely downward from the tip of the bonding tool 16 by the length D. The angle of the wire tail 82 with respect to the pressing surface 16a of the bonding tool 16 is the angle α (wire tail extension step).

Similarly to the embodiment previously described with reference to FIG. 19, according to the flexing angle α of the wire tail 82 freely selected based on a condition such as the diameter or the material of the wire 81 to be bonded to the pressing surface 16a of the bonding tool 16, the control unit 30 sets the Z-direction distance $H_s$ and the XY-direction distance $L_s$ by which the tip of the bonding tool 16 moves respectively from $H_s=D_s\times\sin(α)$ and $L_s=D_s\times\cos(α)$, and performs the operation of Steps S311-S314 of FIG. 20.

Figure 21M:
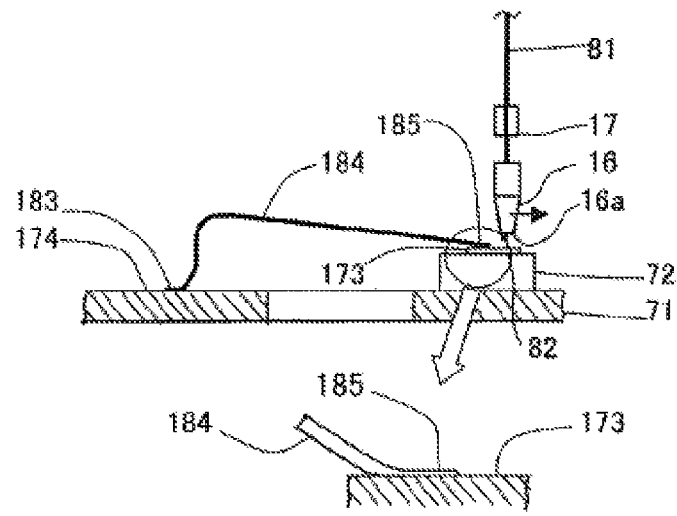
FIG. 21M is a diagram illustrating a tail-cut operation by the wire bonding apparatus according to the different embodiment of the present invention.

The control unit 30 moves the tip of the bonding tool 16 from the end portion of the second bond portion 185 by the distance $H_s$ in the Z direction and the distance $L_s$ in the XY direction, and closes the clamper 17 as in Step S315 of FIG. 20, when the extension length of the wire tail 82 becomes the length $D_s$. Then, as the bonding tool 16 continues to move horizontally in the XY plane as illustrated in FIG. 21M, the wire tail 82 is cut at the boundary surface between the first pad 173 and the second bond portion 185 where the strength is lowest, and the wire tail 82 is separated from the first pad 173 (tail cut step). When the wire tail 82, the second bond portion 185 remains on the first pad 173; however, unlike the bonding to the first lead 174, a thin plate is not formed and does not remain as the end portion 183a.

Similarly to the embodiment described with reference to FIG. 19, even after the wire tail 82 is cut, as plastic deformation of a flexing portion 82c of the wire tail 82 occurs, the flexing angle α obliquely downward from the pressing surface 16a of the bonding tool 16 is maintained. Further, the wire tail 82 extending from the bonding tool 16 in the XY plane is directed along the first wire tail pulling line 92 parallel to the second straight line 93 as the second bonding direction.

Figure 21N:
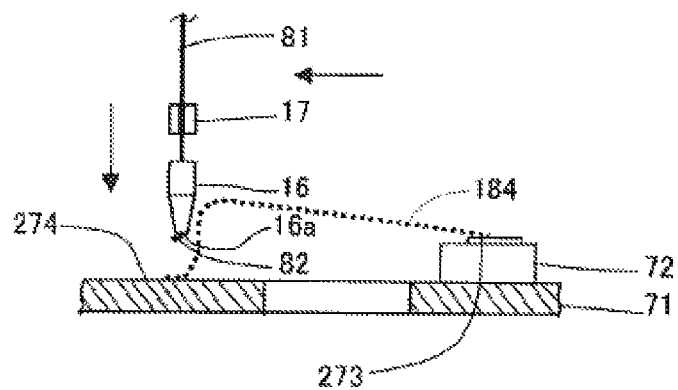
FIG. 21N is a diagram illustrating an operation of movement to the next lead by the wire bonding apparatus according to the different embodiment of the present invention.

Upon cutting of the wire tail 82, the control unit 30 increments the integer n by 1 as in Step S316 of FIG. 20 and the process returns to Step S305 of FIG. 20, and similarly to the previously described embodiments, the control unit 30 moves the tip of the bonding tool 16 above the second lead 274 as illustrated in FIG. 21N to continue the bonding operation after the second bonding. Further, if the angle difference between the direction for the n-th bonding and the direction for the (n+1)th bonding is equal to a predetermined angle or greater in Step S310 of FIG. 20, after moving the bonding tool 16 upward as in Step S318 of FIG. 20 and cutting the wire tail 82 by closing the clamper 17 as in Step S319 of FIG. 20, the integer n is incremented by 1 as in Step S320 of FIG. 20, the process returns to Step S302 of FIG. 20, and then the wire tail 82 is folded after moving to the folding station 78. Then, if in Step S308 of FIG. 20, the control unit 30 determines that bonding between all of the pads 73 and the leads 74 has been completed, and that no succeeding bonding is to be performed, the control unit 30 performs a bonding apparatus terminating operation, as in Step S317 of FIG. 20, by moving the bonding tool 16 upward while the clamper 17 is closed to cut the wire tail 82, by moving the center of the bonding tool 16 back to an initial position to terminate the wire bonding apparatus 10.

The above described embodiment provides, in addition to the same effects as those of the previously described embodiments with reference to FIG. 17 through FIG. 19, an effect that an end portion projecting from the second bond portion 185 does not remain on the pad 73 as the bonding is performed from the lead 74 of the substrate 71 to the pad 73 of the chip 72, and it is possible to effectively prevent the connecting wires from being brought into contact with each other in the bonding when a fine pitch is employed where the pads 73 are arranged in a narrow pitch, and therefore, it is possible to improve bonding quality.

Figure 23:
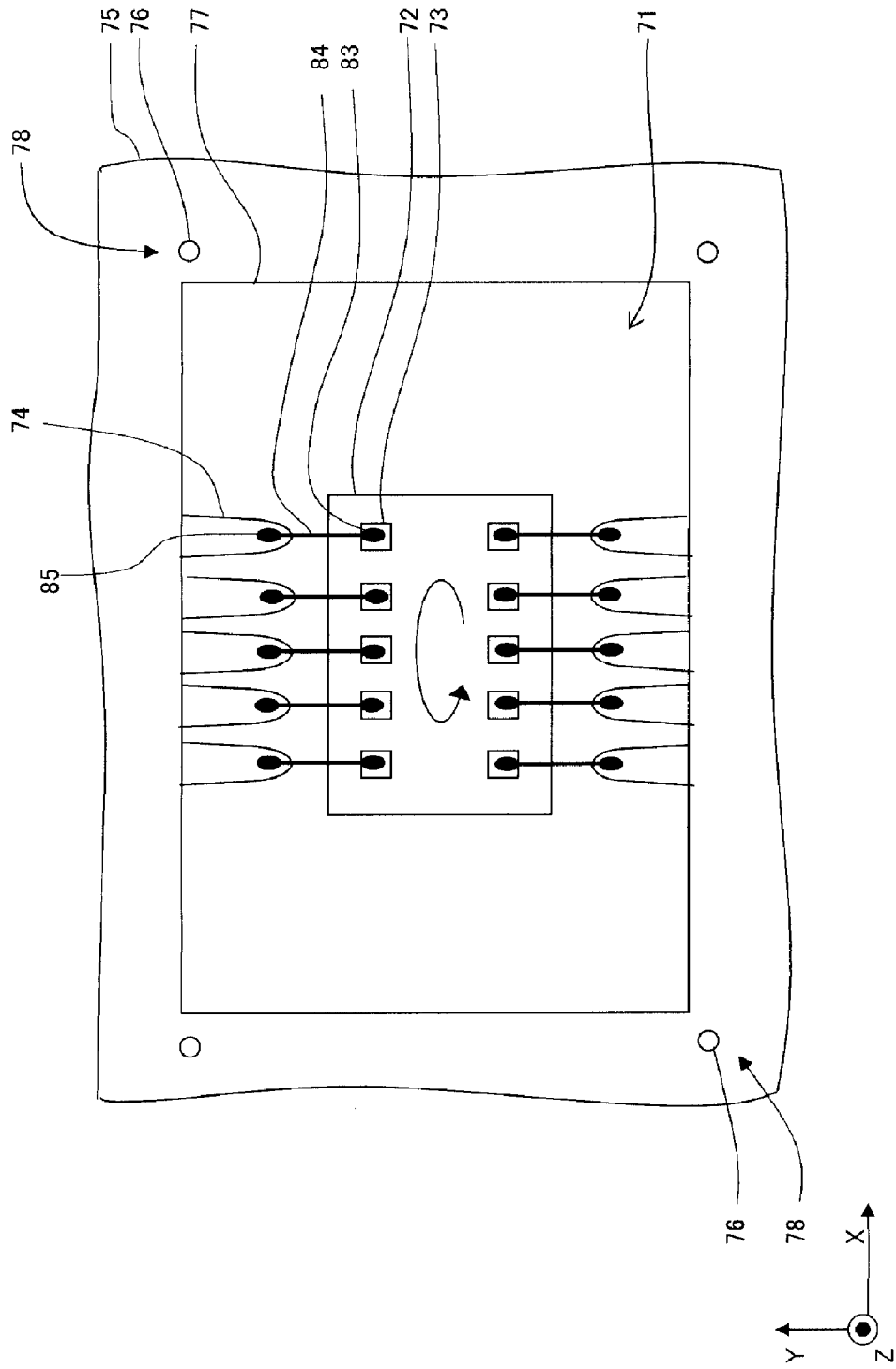
FIG. 23 is a diagram illustrating a lead clamper of the wire bonding apparatus according to a different embodiment of the present invention, as well as a chip, a substrate, and a connecting wire after wedge bonding.

A different embodiment according to the present invention will be described with reference to FIG. 23. As illustrated in FIG. 3, the above described embodiments have described the case in which the pads 73 are arranged in a regular pitch along each of the upper and the lower side of the chip 72, and the leads 74 respectively corresponding to the chips 72 are arranged in a regular pitch wider than the pitch of the pad 73 on the upper and the lower side of the chip 72, and each of the connecting wires 84 respectively connecting the pads 73 and the corresponding leads 74 extends obliquely upward or downward from the center of the chip 72 to connect the pad 73 and the lead 74; however, the present invention can be applied to a case in which, as illustrated in FIG. 23, the pitch between the pads 73 of the chip 72 and the pitch between the lead 74 of the substrate 71 are identical, and all the connecting wires 84 extend in parallel to each other and connect the pads 73 and the leads 74, respectively. When the pads 73 and the leads 74 are arranged as illustrated in FIG. 23, the direction for the first bonding and the direction for the second bonding are the same, and this case corresponds to a case in which the angle difference $θ_1$ and the angle difference $θ_2$ illustrated in FIG. 6 (b) and FIG. 22(b), and the angle difference $θ_6$ and the angle difference $θ_7$ illustrated in FIG. 10(b) are zero, and the angle difference $θ_5$ illustrated in FIG. 10(b) is 180 degrees.

Further, as the angle differences $θ_1$, $θ_2$, $θ_6$, and $θ_7$ are all zero, the control unit 30 determines that the angle differences $θ_1$ and $θ_2$ are smaller than the predetermined value in Step S112 of FIG. 4, in Step S210 of FIG. 17, and in Step S310 of FIG. 20, and the process proceeds to the succeeding bonding between the pad 73 and the lead 74 on the upper side in FIG. 23; after connecting the pads 73 and the corresponding leads 74 with the connecting wires 84 on the upper side in FIG. 23, as the angle difference $θ_5$ is 180 degrees, the control unit 30 determines that the angle difference $θ_5$ is equal to the predetermined value or greater in Step S112 of FIG. 4, in Step S210 of FIG. 17, and in Step S310 of FIG. 20, and performs the bonding between the pads 73 and the corresponding leads 74 on the lower side in FIG. 23 after moving to the folding station and performing the folding of the wire tail 82.

As described above, the present invention can be applied to the case in which the pads 73 and the leads 74 are arranged in various patterns.

Figure 24:
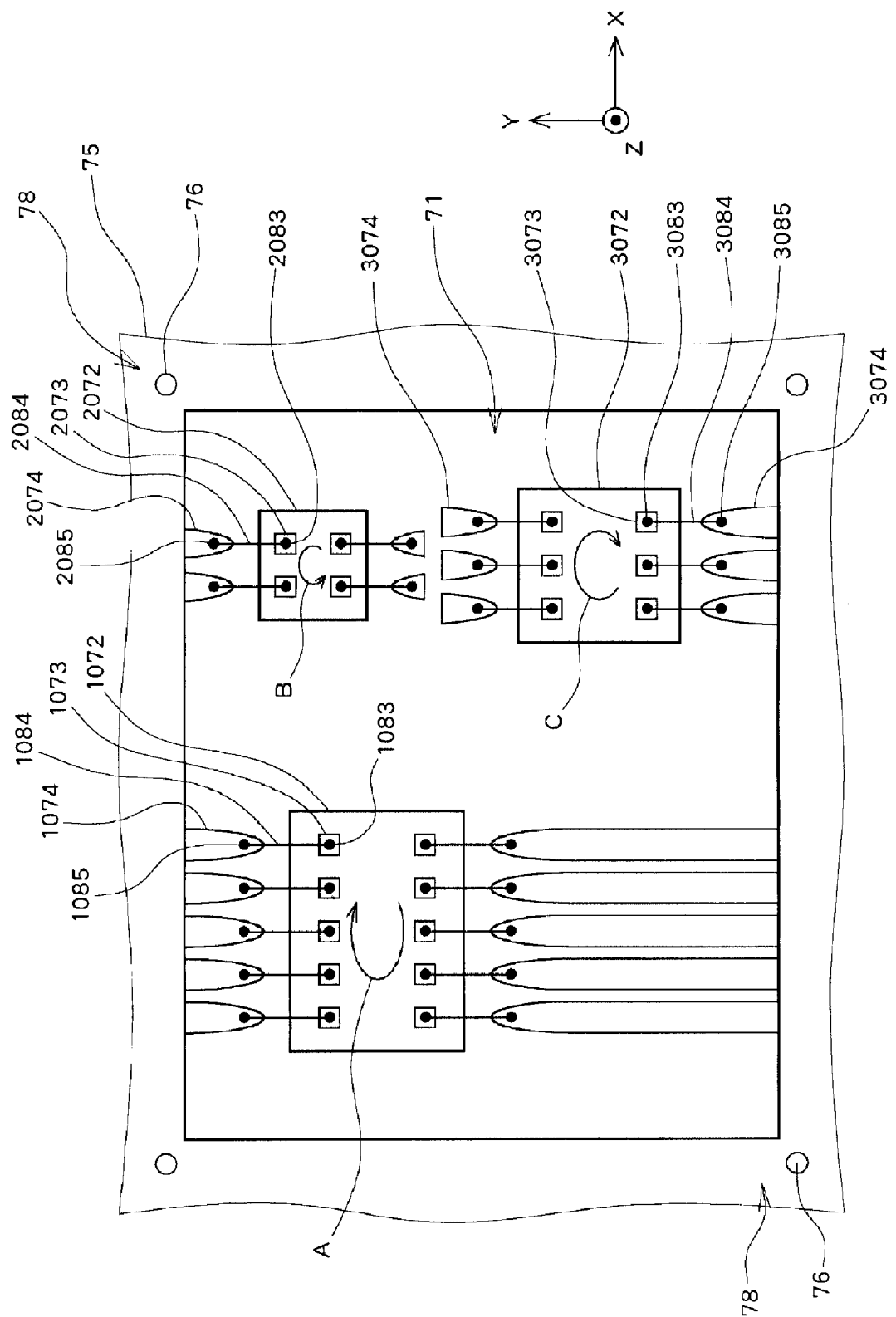
FIG. 24 is a diagram illustrating an order of bonding by the wire bonding apparatus according to a different embodiment of the present invention.
Figure 25:
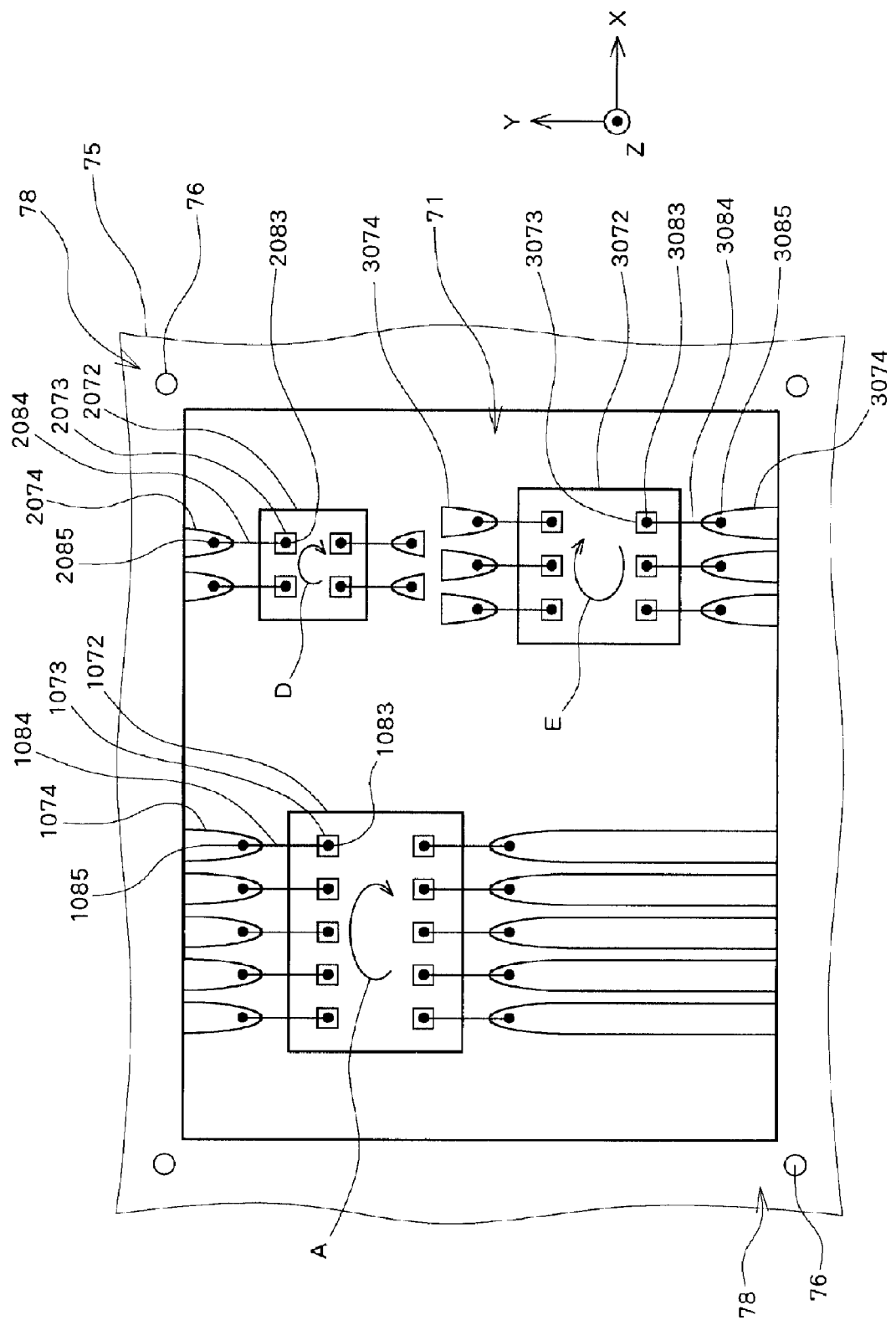
FIG. 25 is a diagram illustrating an order of bonding by the wire bonding apparatus according to the different embodiment of the present invention.

Hereinafter, a different embodiment according to the present invention will be described with reference to FIG. 24 and FIG. 25. FIG. 24 shows a case in which a plurality of chips 1072, 2072, and 3072 are mounted on a single substrate 71, by providing a plurality of, in this embodiment the three chips 1072, 2072, and 3072, are disposed on a surface of the substrate 71 in an opening of a single lead clamper 75, a plurality of pads 1073 of the first chip 1072 and leads 1074 of the substrate 71 respectively corresponding to the pads 1073 are connected by wires 1084, a plurality of pads 2073 of the second chip 2072 and leads 2074 of the substrate 71 respectively corresponding to the pads 2073 with wires 2084, and a plurality of the pads 3073 of the third chip 3072 and leads 3074 of the substrate 71 respectively corresponding to the pads 3073 with wires 3084.

According to this embodiment, the pads 1073 of the first chip 1072 and the leads 1074 are first connected with the wires 1084, respectively. The wire bonding is performed such that, for example, one of the pads at a lower right corner of the first chip 1072 and the lead corresponding to this pad are bonded, and then, a pad and a lead in a similar direction as the first bonded pad and lead, that is, another of the pads on a left side of the pad at the lower right corner and the lead corresponding to this pad are bonded. Then, as indicated by an arrow A in FIG. 24, the bonding between the pads and the lead on the lower side is performed in a right-hand rotation. After bonding of the leftmost pad and the leftmost lead on the lower side (at a lower left corner), the pad and the lead at an upper left corner are bonded next. At this time, the direction from the pad to the lead turns 180 degrees around, and therefore, as described with reference to FIG. 21A through FIG. 21C, the tip of the wire is inserted in the hole 76 in the lead clamper after the bonding at the lower left corner is done, and the capillary 16 is moved horizontally to invert the flexing direction of the wire tail 82 extending from the capillary 16. After the direction of the wire tail 82 is inverted, bonding between the pad at the upper left corner of the first chip 1072 and the lead is performed. Then, the pads and the leads are sequentially bonded in a rightward direction. Then, finally, the pad 1073 at an upper right corner of the first chip and the lead 1074 are bonded. Upon completion of the bonding, the wire tail 82 extends from the tip of the capillary 16 in a direction from the pad 1073 at the upper right corner toward the lead 1074.

Next, bonding between the pads 2073 of the second chip 2072 and the leads 2074 is performed. In this case, bonding between one of the pads 2073 at an upper right corner of a chip for which the pads 2073 and the leads 2074 are arranged in the direction toward which the wire tail 82 is flexed, for example, the second chip 2072, and a corresponding one of the leads 2074 is performed, for example. Then, a pad on a left side of the pad 2073 (at a upper left corner) and a lead that are in a similar direction as the pad 2073 and the lead 2074 at the upper right corner are connected. Then, similarly to the previous description, the flexing direction of the wire tail 82 extending from the capillary 16 is inverted, and the bonding is performed sequentially in a left-hand rotation in an order of a lower left corner and a lower right corner as indicated by an arrow B in FIG. 24.

Thereafter, bonding between the pads 3073 of the third chip 3072 and the leads 3074 is performed. Similarly to the previous description, also in this case, bonding between the pad 3073 at lower right of a chip for which pads and leads are arranged in the same direction as the pad of the second chip 2072 and the lead that have been last bonded, for example, the third chip 3072, and the lead 3074 is performed. Then, as indicated by an arrow C in FIG. 24, bonding between the pads and the leads is performed sequentially in the right-hand rotation.

According to the embodiment described above, it is possible to start bonding between the pads of the next chip and the leads after the bonding between the last of the pads of the previous chip and the lead without inverting the flexing direction of the wire tail 82, and therefore it is possible to reduce the number of the inverting operation of the flexing direction of the wire tail 82 the extending from the capillary 16, and to allow efficient bonding. Further, in this embodiment, it is described that the directions of the pads and the leads on the lower side are the same as those on the upper side in each of the chips 1072, 2072, and 3072; however, it is possible to provide the same effect by, similarly to the embodiment described with reference to FIG. 3, an arrangement of the pads and the leads with an angle difference smaller than a predetermined angle difference which does not require inversion of the flexing direction of the wire tail 82.

The order of bonding between the pads 1073, 2073, and 3073 in the chips 1072, 2072, and 3072 and the corresponding leads 1074, 2074, and 3074 is not limited to that in the above embodiment. After the last one of the pads of the previous chip and the lead of the substrate corresponding to this pad are connected with the wire, the connection of the wire can be started from a pad and a corresponding lead of the next chip for which this pad and this lead are arranged along the direction from the pad to the lead of the previous chip. For example, as illustrated in FIG. 25, the bonding can be sequentially performed in the right-hand rotation for the first chip 1072, in the right-hand rotation for the second chip, and in the right-hand rotation for the third chip 3072.

The embodiment described above has described the bonding method of starting the bonding between the pads of the next chip and the leads without inverting the flexing direction of the wire tail 82 after the bonding between the last of the pads of the previous chip and the lead. Hereinafter, a different bonding method for reducing the number of the inverting operation of the flexing direction the wire tail 82 will be described with reference to FIG. 26 and FIG. 27.

Figure 26:
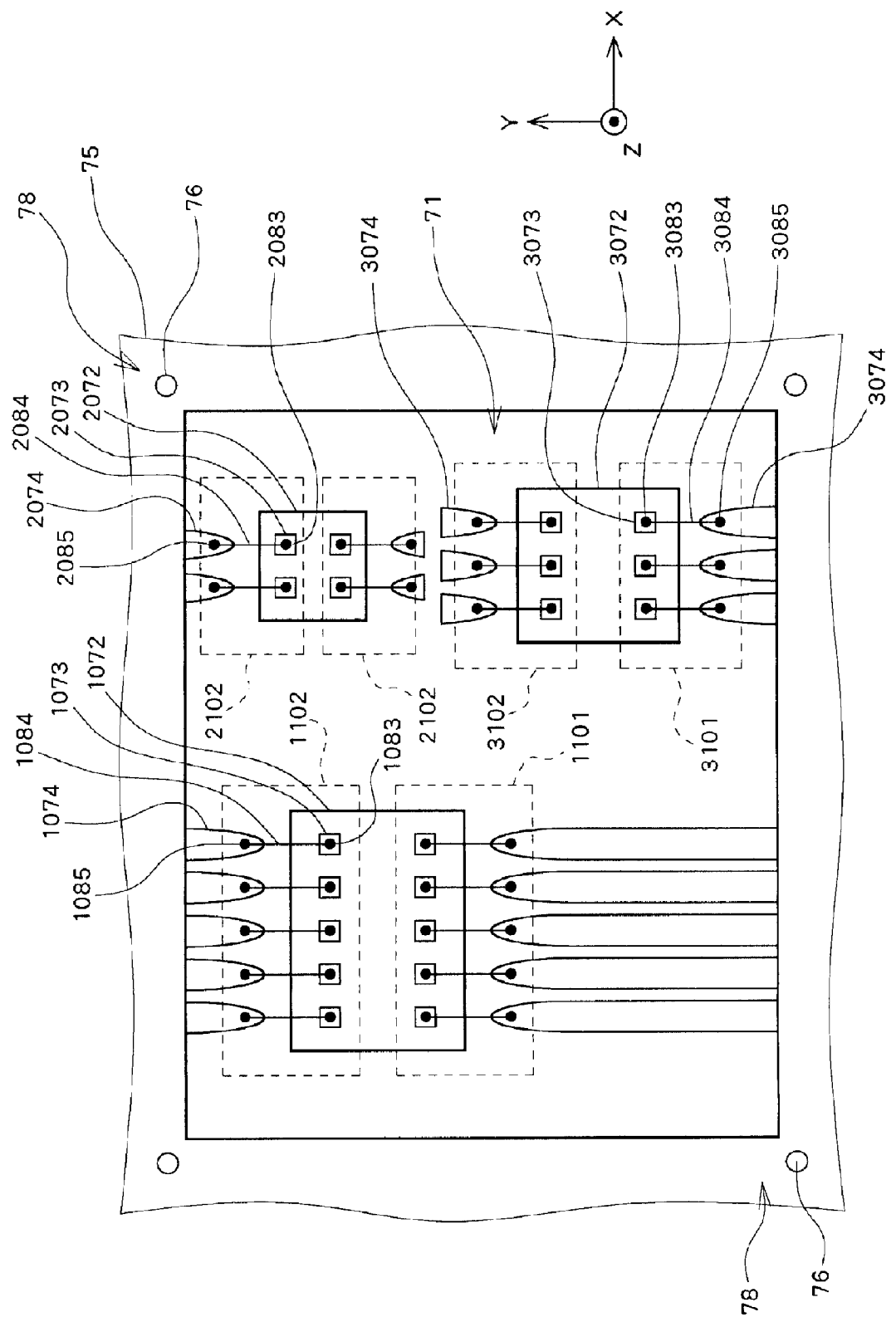
FIG. 26 is a diagram illustrating an order of bonding by the wire bonding apparatus according to a different embodiment of the present invention.

In FIG. 26, the leads and the pads in each of sets of the pads 1073 of the chip 1072 and the leads 1074, the pads 2073 of the chip 2072 and the leads 2074, and the pads 3073 of the chip 3072 and the leads 3074, respectively enclosed by dotted lines and on the upper side of the corresponding chips, are arranged substantially in an identical direction. Further, the leads and the pads in each of sets of the pads 1073 and the leads 1074, the pads 2073 and the leads 2074, and the pads 3073 and the leads 3074, respectively enclosed by dotted lines and on the lower side of the corresponding chips, are arranged in a direction opposite from that for the sets on the upper side. Therefore, by successively bonding the pads and the leads in regions in which the pads and the leads are in the identical direction, it is possible to reduce the number of the inverting operation of the flexing direction of the wire tail 82.

For example, it is possible to reduce the number of the inverting operation of the flexing direction of the wire tail 82 down to 1 by a configuration in which bonding between the pads and the leads in regions 1101, 2101, and 3101 is performed in this order, the tip of the wire is inserted in the hole 76 in the lead clamper, the capillary 16 is moved horizontally to invert the flexing direction of the wire tail 82 extending from the capillary 16, and then bonding between the pads and the leads in regions 1102, 2102, 3102 is performed in this order.

Further, in this embodiment, it is described that the directions of the pads and the lead in the regions 1101, 2101, and 3101 are similar, and the directions of the pads and the lead in the regions region 1102, 2102, and 3102 are similar; however, it is possible to provide the same effect by, similarly to the embodiment described with reference to FIG. 3, an arrangement of the pads and the leads with an angle difference smaller than a predetermined angle difference which does not require inversion of the flexing direction of the wire tail 82.

Figure 27:
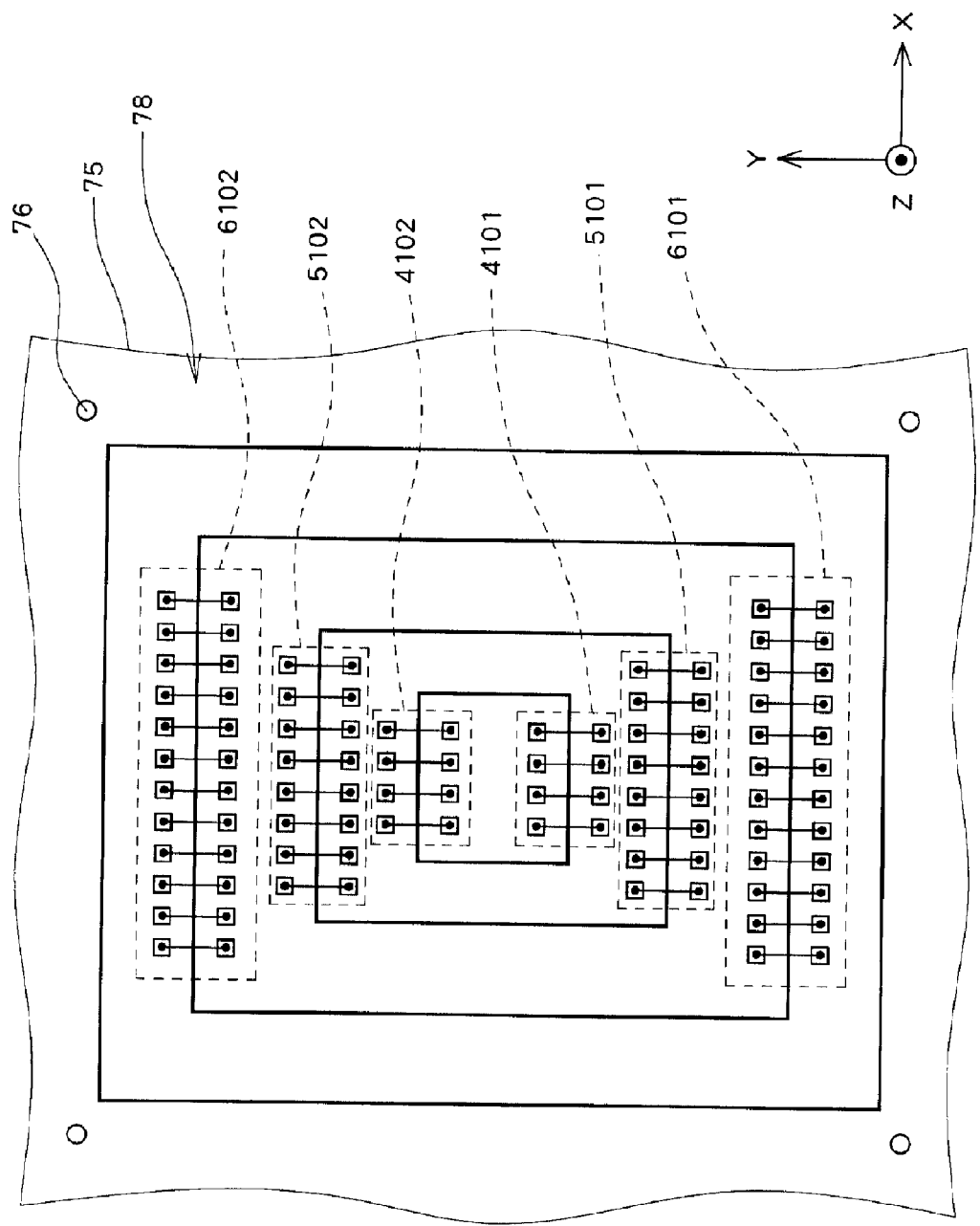
FIG. 27 is a diagram illustrating an order of bonding by the wire bonding apparatus according to a different embodiment of the present invention.

Alternatively, in a case in which chips are stacked as illustrated in FIG. 27 and pads on the chips of different stacks are connected with a wire, it is possible to successively perform bonding to pads arranged in the same direction in regions 4101, 5101, and 6101 illustrated in FIG. 27 first, insert the tip of the wire in the hole 76 in the lead clamper, move the capillary 16 horizontally to invert the flexing direction of the wire tail 82 extending from the capillary 16, and then successively perform bonding in regions 4102, 5102, and 6102. It is also possible to provide the same effect as that of the previously described embodiment in this case.

Next, a different operation for cutting the wire tail 82 will be described with reference to FIG. 28. The cutting of the wire tail 82 is described with reference to FIG. 5L in the above as the operation in which the capillary is moved obliquely upward to cut the wire tail 82 so as to extend obliquely downward from the tip of the capillary 16. However, in a case of bonding using aluminum wires, which has been widely used in recent years, the power required to cut the wire tail 82 is greater than that in the case of using gold wires, and it is sometimes difficult to cut the wire tail 82. Therefore, the cutting of the wire tail 82 without fail in bonding using aluminum wires is demanded.

Figure 28:
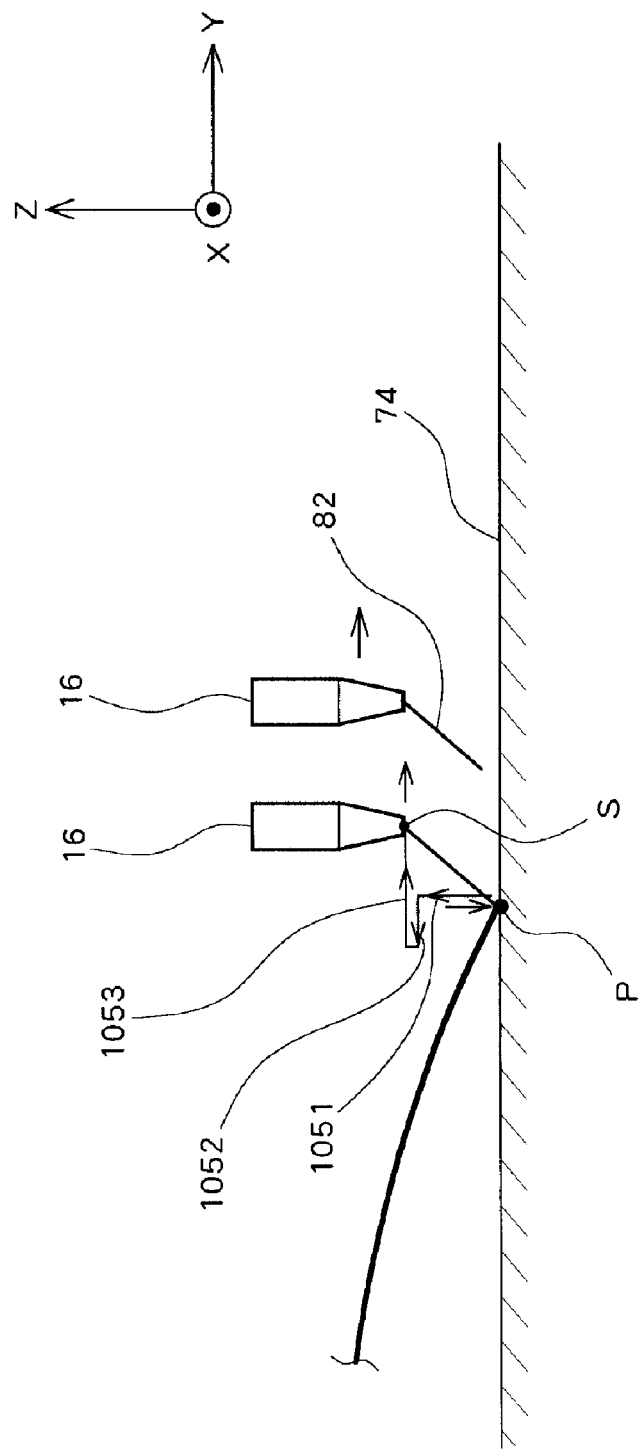
FIG. 28 is a diagram illustrating a trajectory of a bonding tool of the wire bonding apparatus according to a different embodiment of the present invention.

As illustrated in FIG. 28, in this embodiment, after bonding to a second bonding point P, the clamper is opened and the capillary 16 is temporarily moved vertically upward to a predetermined height from the second bonding point as indicated by a movement line 1051 in FIG. 28, and horizontally moved to a first bonding point as indicated by a movement line 1052 in FIG. 28, then the capillary 16 is horizontally moved along the direction between the first bonding point for bonding and the second bonding point, the clamper is closed at the point s, and the capillary 16 is horizontally moved further to cut the wire tail 82 so as to extend obliquely downward. This cutting method provides an effect of facilitating the cutting of the wire tail 82, as work hardening of the wire tail 82 near the second bonding point is produced by the horizontal reciprocating movement of the capillary 16.

The present invention is not limited to the above described embodiments, and can include any alteration or modification without departing from the technical scope and the spirit of the present invention as defined in the scope of the present invention.

DESCRIPTION OF REFERENCE CHARACTERS

10 Wire Bonding Apparatus
11 Spool
13 Bonding Arm
13b Ultrasonic Horn
14 Bonding Stage
15 Ultrasonic Transducer
16 Bonding Tool
16a Pressing Surface
16b Through Hole
16c, 16d Corner Portion
16e Chamfer
16g Center Line
17 Clamper
18 Movement Mechanism
19 Bonding Head
20 XY Table
27 Clamper Open-Close Mechanism
28 Camera
29 Bonding Tool Height Detector
30 Control Unit
31 Data Bus
32 Storage Unit
33 Bonding Direction Calculation Program
34 Wire Tail Extension Program
35 Tail-Cut Program
36 Wire Tail Folding Program
37 Control Program
38 Control Data
41 Clamper Open-Close Mechanism Interface
42 Bonding Tool Height Detection Interface
43 Ultrasonic Transducer Interface
44 Movement Mechanism Interface
50, 51 Bonding Tool Rising Trajectory
52-58 Movement Trajectory
60 Computer
71 Substrate
72, 1072, 2072, 3072 Chip
73, 1073, 2073, 3073 Pad
74, 1074, 2074, 3074 Lead
75 Lead Clamper
75a, 79a Upper Surface
75b Peripheral Surface
75c Periphery Portion
76 Hole
76a Inner Surface
77 Opening
78 Folding Station
79 Projection
79b Side Surface
81 Wire
82 Wire Tail
82a Projecting Portion
82c Flexing Portion
84 Connecting Wire
91 First Straight Line
92, 94, 97 Wire Tail Pulling Line
93 Second Straight Line
95 Fifth Straight Line
96 Sixth Straight Line
98 Seventh Straight Line
173 First Pad
174 First Lead
183, 185, 283, 285, 683, 685 Bond Portion
183a, 283a, 683a End Portion
184, 284, 684 Connecting Wire
273 Second Pad
274 Second Lead
573 Fifth Pad
574 Fifth Lead
673 Sixth Pad
674 Sixth Lead
773 Seventh Pad
774 Seventh Lead
1051-1053 Movement Line
1101-6102 Region
n Integer

The invention claimed is:

1. A wire bonding apparatus for connecting a plurality of first bonding points and a plurality of second bonding points with a wire, the apparatus comprising:
a bar-shaped bonding tool having a through hole in which the wire is inserted, and a pressing surface provided at a periphery of the through hole at a tip of the bonding tool and configured to press the wire against a bonding target, the through hole extending along a longitudinal direction of the bonding tool;
a clamper configured to hold the wire;
a lead clamper for fixing the bonding target against a surface of a bonding stage;
a folding station having a stepped portion for catching the wire tail extending from the tip of the bonding tool, the folding station being provided on the lead clamper, wherein the stepped portion of the folding station comprises a wall surface for catching the wire tail, and a flat upper surface that continues to the wall surface; and a control unit configured to specify movement of the bonding tool, and to open and close the clamper, wherein the control unit comprises:

a wire tail extension unit configured to move the bonding tool, after bonding the wire to a previous one of the second bonding points, upward while the clamper is opened, and then along a straight line directed from a succeeding one of the first bonding points to a succeeding one of the second bonding points by a predetermined distance, and cause the wire to extend from the through hole of the bonding tool in a direction along the straight line directed from the succeeding first bonding point to the succeeding second bonding point;

a tail cut unit configured to, after causing the wire tail to extend, cut the wire tail by moving the bonding tool in the direction along the straight line directed from the succeeding first bonding point to the succeeding second bonding point while the clamper is closed; and a wire tail folding unit configured to, after moving the bonding tool to the folding station and positioning the wire tail along the stepped portion, move the bonding tool toward the succeeding second bonding point along the straight line directed from the succeeding first bonding point to the succeeding second bonding point, thereby causing the wire tail to be flexed toward the succeeding first bonding point, wherein the control unit forms the wire tail using:

the wire tail extension unit and the tail cut unit, when an angle between a first straight line and a second straight line is smaller than a predetermined angle, the first straight line connecting a previous one of the first bonding points and the previous second bonding point, the second straight line connecting the succeeding first bonding point and the succeeding second bonding point; and the wire tail folding unit, when the angle between the first straight line and the second straight line is equal to or greater than the predetermined angle.

2. The wire bonding apparatus according to claim 1, wherein an end portion of the through hole on a side of the pressing surface is a straight hole, and an angle between an inner surface of the straight hole and the pressing surface is substantially at a right angle.

3. The wire bonding apparatus according to claim 1, wherein the pressing surface is an annular flat surface, and the wire tail extension unit moves the bonding tool such that the wire tail is slightly longer than an outside radius of the pressing surface.

4. The wire bonding apparatus according to claim 3, wherein the wire tail extension unit moves the bonding tool horizontally by a predetermined XY-direction distance along the straight line directed from the succeeding first bonding point to the succeeding second bonding point, after moving the bonding tool upward by a predetermined Z-direction distance.

5. The wire bonding apparatus according to claim 3, wherein the wire tail extension unit moves the bonding tool obliquely upward by a predetermined oblique distance along the straight line directed from the succeeding first bonding point to the succeeding second bonding point.

6. The wire bonding apparatus according to claim 3, wherein the plurality of first bonding points are leads on a substrate, and the plurality of second bonding points are pads on a chip.

7. The wire bonding apparatus according to claim 3, wherein the stepped portion of the folding station comprises a wall surface for catching the wire tail, and a flat upper surface that continues to the wall surface, and the wire tail folding unit moves the bonding tool at a height at which the pressing surface of the bonding tool is higher than the flat upper surface of the stepped portion of the folding station by a height slightly higher than a diameter of the wire.

8. The wire bonding apparatus according to claim 3, wherein when a plurality of chips are disposed on a common substrate, and a plurality of pads of each chip and leads on the substrate corresponding to the pads are connected with a wire, the control unit starts bonding, after a last one of the pads on a previous one of the chips and a lead on the substrate corresponding to this pad are connected with a wire, from a set of pads and leads of a subsequent one of the chips on which a pad and a lead corresponding to this pad are disposed along a direction directed from the last pad on the previous chip to the lead corresponding to this last pad.

9. The wire bonding apparatus according to claim 3, wherein when a plurality of chips are disposed on a common substrate, and a plurality of pads of each chip and leads on the substrate corresponding to the pads are connected with a wire, the control unit sequentially performs bonding to each of sets of pads and leads respectively corresponding to the pads, the pads and the leads in each set being connected by lines in a similar direction.

10. The wire bonding apparatus according to claim 3, wherein the wire tail extension step moves the bonding tool horizontally by a predetermined XY-direction distance along the straight line directed from the succeeding first bonding point to the succeeding second bonding point, after moving the bonding tool upward by a predetermined Z-direction distance, and horizontally from the second bonding point to the first bonding by a predetermined XY-direction distance.

* * * * *